US005926036A

United States Patent [19]
Cliff et al.

[11] Patent Number: 5,926,036
[45] Date of Patent: Jul. 20, 1999

[54] PROGRAMMABLE LOGIC ARRAY CIRCUITS COMPRISING LOOK UP TABLE IMPLEMENTATION OF FAST CARRY ADDERS AND COUNTERS

[75] Inventors: Richard G. Cliff, Milpitas; L. Todd Cope, San Jose; Kerry Veenstra, San Jose; Bruce B. Pedersen, San Jose, all of Calif.

[73] Assignee: Altera Corporation, San Jose, Calif.

[21] Appl. No.: 09/136,317

[22] Filed: Aug. 19, 1998

Related U.S. Application Data

[63] Continuation of application No. 08/847,004, May 1, 1997, Pat. No. 5,828,229, which is a continuation of application No. 08/555,106, Nov. 8, 1995, Pat. No. 5,633,830, and application No. 08/655,870, May 24, 1996, Pat. No. 5,668,771, which is a continuation of application No. 08/245,509, May 18, 1994, Pat. No. 5,550,782, which is a continuation-in-part of application No. 08/111,693, Aug. 25, 1993, Pat. No. 5,436,575, which is a continuation-in-part of application No. 07/754,017, Sep. 3, 1991, Pat. No. 5,260,610, and a continuation-in-part of application No. 07/880,942, May 8, 1992, Pat. No. 5,260,611.

[51] Int. Cl.$^6$ ................................................. H03K 19/177
[52] U.S. Cl. .................................. 326/40; 326/39; 326/41
[58] Field of Search ................................ 326/37, 39, 40, 326/41

[56] References Cited

U.S. PATENT DOCUMENTS

| 4,124,899 | 11/1978 | Birkner et al. | 364/716 |
| 4,623,982 | 11/1986 | Ware | 364/788 |
| 4,642,487 | 2/1987 | Carter . | |

(List continued on next page.)

FOREIGN PATENT DOCUMENTS

| 456475 | 11/1991 | European Pat. Off. | G06F 7/50 |
| 2202356 | 9/1988 | United Kingdom | H03K 19/173 |

OTHER PUBLICATIONS

E.J. McCluskey, "Iterative Combinational Switching Networks—General Design Considerations", IRE Transactions on Electronic Computers, Dec. 1958, pp. 285–291.

R.C. Minnick, "A Survey of Microcellular Research", Journal of the Association for Computing Machinery, vol. 14, No. 2, pp. 203–241, Apr. 1967.

(List continued on next page.)

*Primary Examiner*—Michael Tokar
*Assistant Examiner*—Daniel D. Chang
*Attorney, Agent, or Firm*—Fish & Neave; Robert R. Jackson; Walter M. Egbert, III

[57] ABSTRACT

A programmable logic array integrated circuit has a number of programmable logic modules which are grouped together in a plurality of logic array blocks ("LABs"). The LABs are arranged on the circuit in a two dimensional array. A conductor network is provided for interconnecting any logic module with any other logic module. In addition, adjacent or nearby logic modules are connectable to one another for such special purposes as providing a carry chain between logic modules and/or for connecting two or more modules together to provide more complex logic functions without having to make use of the general interconnection network. Another network of so-called fast or universal conductors is provided for distributing widely used logic signals such as clock and clear signals throughout the circuit. Multiplexers can be used in various ways to reduce the number of programmable interconnections required between signal conductors. Look up tables for use in programmable logic devices are modified to facilitate use of those tables to provide adders (including subtracters) and various types of counters. Each look up table is effectively partitioned into smaller look up tables when an adder or counter is required. One portion of the partitioned table is used to provide a sum out signal, while the other portion of the partitioned table is used to provide a fast carry out signal for application to the next stage of the adder or counter.

15 Claims, 31 Drawing Sheets

U.S. PATENT DOCUMENTS

| | | |
|---|---|---|
| 4,706,216 | 11/1987 | Carter ......................................... 365/94 |
| 4,742,520 | 5/1988 | Hoac et al. ................................. 371/49 |
| 4,758,985 | 7/1988 | Carter ......................................... 365/94 |
| 4,815,022 | 3/1989 | Glaeser et al. ........................... 364/716 |
| 4,870,302 | 9/1989 | Freeman . |
| 5,053,647 | 10/1991 | Shizukuishi et al. . |
| 5,059,828 | 10/1991 | Tanagawa . |
| 5,274,581 | 12/1993 | Cliff et al. ............................... 364/784 |
| 5,349,250 | 9/1994 | New . |
| 5,386,156 | 1/1995 | Britton et al. ............................. 326/37 |
| 5,481,206 | 1/1996 | New et al. ................................. 326/38 |
| 5,481,486 | 1/1996 | Cliff et al. ............................... 364/716 |
| 5,631,576 | 5/1997 | Lee et al. ................................... 326/39 |

OTHER PUBLICATIONS

*Recent Developments in Switching Theory*, A. Mukhopadhyay, ed., Academic Press, New York, 1971, Chapters VI and IX, pp. 229–254 and 369–422.

H. Fleisher, "An Introduction to Array Logic", IBM Journal of Research and Development, Mar. 1975, pp. 98–109.

B. Kitson et al., "Programmable Logic Chip Rivals Gate Array in Flexibility", Electronic Design, Dec. 8, 1983, pp. 95–102.

"The World's Most Versatile Logic Tool; AmPAL22V10", Advanced Micro Devices, Inc., May 1984.

R.H. Freeman, "XC3000 Family of User–Programmable Gate Arrays", Microprocessors and Microsystems, vol. 13, No. 5, Jun. 1989, pp. 313–320.

D.D. Hill et al., "Preliminary Description of Tabula Rasa, an Electrically Reconfigurable Hardware Engine", Proceedings 1990 IEEE International Conference on Computer Design: VSLI in Computers and Processors, Sep. 17–19, 1990, pp. 391–395.

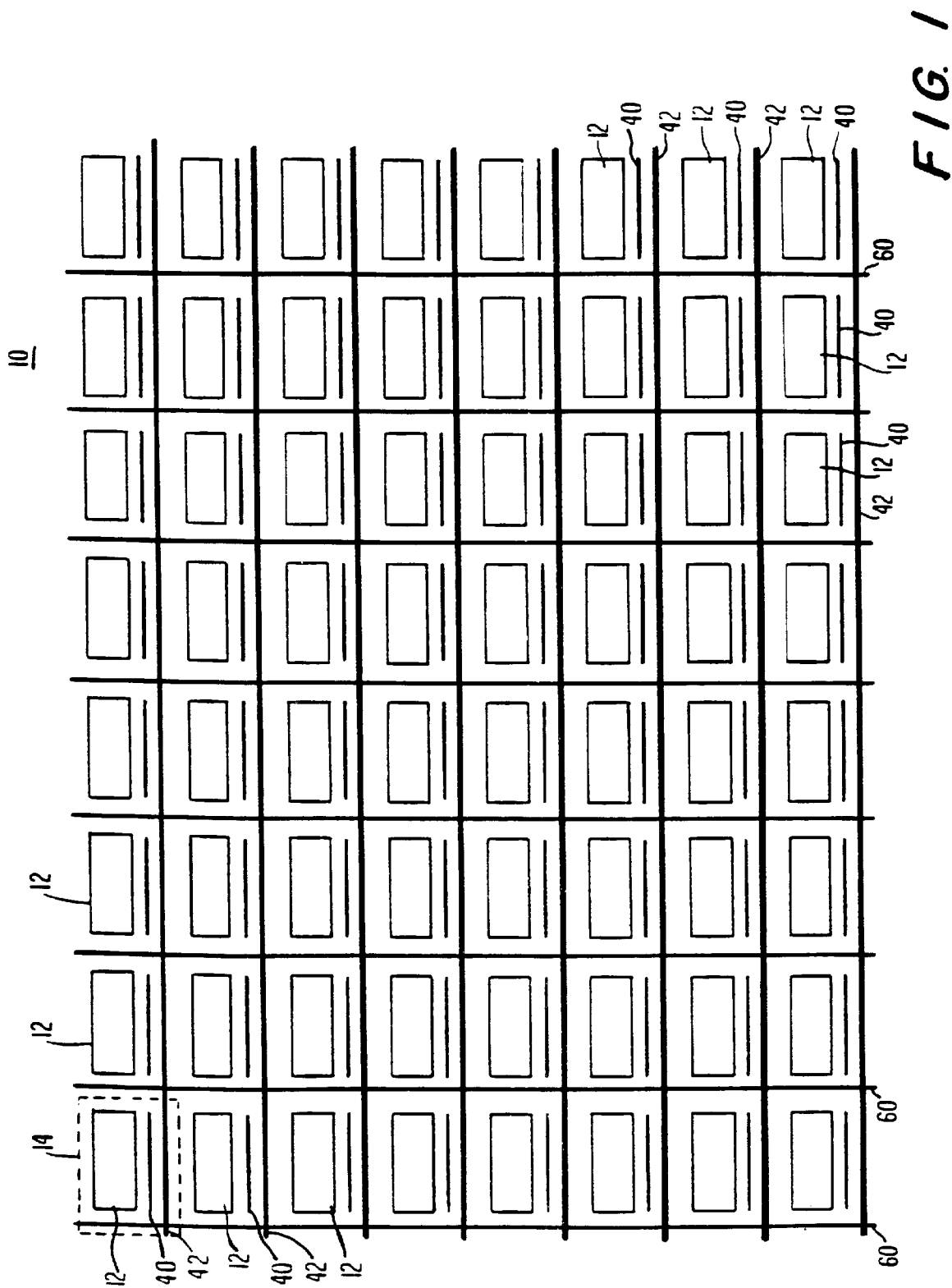

5,926,036

PROGRAMMABLE LOGIC ARRAY CIRCUITS COMPRISING LOOK UP TABLE IMPLEMENTATION OF FAST CARRY ADDERS AND COUNTERS

This is a continuation of application Ser. No. 08/847,004, filed May 1, 1997, now U.S. Pat. No. 5,828,229, which is a continuation of application Ser. No. 08/555,106, filed Nov. 8, 1995, now U.S. Pat. No. 5,633,830, and application Ser. No. 08/655,870, filed May 24, 1996, now U.S. Pat. No. 5,668,771, which is a continuation of application Ser. No. 08/245,509, filed May 18, 1994, now U.S. Pat. No. 5,550,782, which is a continuation-in-part of application Ser. No. 08/111,693, filed Aug. 25, 1993, now U.S. Pat. No. 5,436,575, which is a continuation-in-part of application Ser. No. 07/754,017, filed Sep. 3, 1991, now U.S. Pat. No. 5,260,610, and a continuation-in-part of application Ser. No. 07/880,942, filed May 8, 1992, now U.S. Pat. No. 5,260,611.

BACKGROUND OF THE INVENTION

This invention relates to programmable logic array integrated circuits, and more particularly to programmable logic array integrated circuits with improved arrangements of the programmable logic elements and improved interconnections between those elements. The invention also relates to the provision of relatively large blocks of random access memory ("RAM") on programmable logic array integrated circuit devices. This invention still further relates to logic devices employing look up tables, and more particularly to improved ways of providing fast carry functions in such devices when the devices are to be used for such purposes as performing addition, subtraction, and counting.

Programmable logic arrays are known in which substantial numbers of relatively elementary individual programmable logic elements are provided in a two-dimensional array. The array also includes a grid of intersecting signal conductors for conducting logic signals to, from, and between the programmable logic elements. Such programmable logic arrays are shown, for example, in Carter U.S. Pat. Nos. 4,642,487, 4,706,216, and 4,758,985, and in Freeman U.S. Pat. No. 4,870,302.

As integrated circuit fabrication techniques progress, it becomes possible to put more and more programmable logic elements on a chip. As the number of elements increases, it becomes important to improve the techniques used to interconnect them. For example, it is important to provide enough interconnection pathways between the programmable logic elements so that the capabilities of those elements can be fully utilized and so that complex logic functions (requiring concatenation of programmable logic elements) can be performed, without providing so many such pathways that there is a wasteful excess of this type of resource. Similarly, as the number of programmable elements increases, the complexity of the logic which can be performed also increases. But this in turn tends to increase the complexity of the task of programming the circuit unless additional logical structure is included in the circuit to help correspondingly structure the programming task.

There is always room for further improvement, however, and there are some situations in which the provision of additional or alternative types of interconnections between the logic modules would have benefits sufficient to justify the additional circuit and programming complexity. Such additional interconnection paths may be desirable for making frequently needed kinds of interconnections, for speeding certain kinds of interconnections, for allowing short distance connections to be made without tying up more general purpose and therefore long distance interconnection resources, etc. There is also a continuing demand for logic devices with larger capacity. This produces a need to implement logic functions more efficiently and to make better use of the portion of the device which is devoted to interconnecting individual logic modules.

It is therefore an object of this invention to provide improved programmable logic array integrated circuits.

It is a more particular object of this invention to provide programmable logic array integrated circuits with additional possibilities for interconnections between the logic modules.

It is a further object of this invention to provide improved techniques for organizing and interconnecting the programmable logic elements in programmable logic array integrated circuits.

Cliff et al. U.S. Pat. Nos. 5,550,782 and 5,689,195 show programmable logic array integrated circuit devices with relatively large blocks of random access memory ("RAM") in addition to the usual large number of programmable logic modules and the usual programmable network of interconnection conductors. (These two references are hereby incorporated by reference herein.) These RAM blocks can be programmed at the same time that the rest of the device is programmed and thereafter used as read-only memory ("ROM") to perform logic, arithmetic functions, state machine operations, etc., that may be more efficiently performed in one large memory block (or a small number of such blocks) rather than in several of the individually relatively small logic modules. Alternatively, the RAM blocks may be used as random access memory during use of the device to perform logic.

From the foregoing it will be seen that the above-mentioned RAM blocks have several possible uses and require several different modes of operation. They should be programmable like other memory cells on the device (i.e., the other memory cells that control the functioning of the logic modules and the interconnection conductor network). This is necessary when the RAM blocks are to be used as ROM. Their programming in this way should be capable of verification like other memory cells on the device (i.e., reading out of the programmed data to ensure that the memory cells are programming properly). The RAM blocks should also be programmable as random access memory during use of the device to perform logic. And the RAM blocks should be readable as random access memory or read-only memory, also during use of the device to perform logic. All of these possible uses and modes of operation of these RAM blocks tend to significantly complicate the circuitry required to provide such blocks.

In view of the foregoing, it is still another object of this invention to improve and simplify the provision of blocks of RAM on programmable logic array integrated circuit devices.

It is a more particular object of this invention to provide RAM block circuitry for use on programmable logic array integrated circuit devices that facilitates programming and verification of the RAM block for use as ROM, and that also facilitates programming and reading the block as RAM during use of the device to perform logic.

Programmable logic devices are also known in which programmable look up tables are used to perform relatively elementary logic functions (see, for example, Wahlstrom U.S. Pat. No. 3,473,160 (FIG. 8) and Pedersen et al. U.S. Pat. No. 5,260,610). A look up table may provide as an output any desired logical function of several inputs. The outputs of several such look up tables may be combined (e.g., by other similar look up tables) in any desired way to perform much more complex logic functions.

Look up tables which are a good size for performing many elementary logic functions in programmable logic devices tend to be too large for performing the extremely simple functions required to provide two-input adders (including subtracters) and various kinds of counters. For example, four-input look up tables are a very good size for general use, but are larger than necessary for use in the individual binary places of adders and counters. Nevertheless, adders and counters are very often required in digital logic. It is therefore wasteful to use four-input look up tables for adders and counters. This is especially so when fast carry logic is used because for each binary place one four-input look up table is required to provide the sum out bit, and another four-input look table is required to provide the carry out bit. Neither of these look up tables is being fully utilized. Moreover, if large numbers of bit positions or places are required, the need to use two look up tables per bit position may exact a significant speed penalty because of the extensive use which must be made of the interconnect circuitry to interconnect the large number of look up tables involved.

In view of the foregoing, it is an object of this invention to provide improved ways of implementing adders (including subtracters) and counters in programmable logic devices made up of programmable look up tables.

It is a more particular object of this invention to provide programmable logic devices made up of look up tables in which adders and counters can be implemented more efficiently and with less waste of look up table resources.

It is still another more particular object of this invention to provide ways of achieving faster adders and counters in programmable logic devices made up of look up tables.

SUMMARY OF THE INVENTION

These and other objects of the invention are accomplished in accordance with the principles of the invention by providing programmable logic array integrated circuits in which signal conductors are interconnected not by relatively large and complex programmable interconnections, but by relatively small and simple fixed interconnections to multiplexers which can then be programmed to effect the desired interconnections. Instead of having a signal conductor which crosses several other signal conductors programmably connectable to each of those other conductors by programmable elements at or near the intersection, a simple non-programmable transverse connection is made to each of those other conductors, and the transverse connections are applied in parallel to a multiplexer. The multiplexer can then be programmed to select one of its inputs as its output. The output of the multiplexer can be an input to a programmable logic element, an output from the integrated circuit, or a lead which is programmably connectable to one or more of several other conductors in the device.

Another interconnection technique which can be advantageously employed in accordance with the principles of this invention is to group the programmable logic elements into a plurality of mutually exclusive groups, each group having associated with it one or more conductors which can only be used to interconnect the elements in that group. In addition, there are other conductors which can be used to convey signals between the groups. Grouping the programmable logic elements in mutually exclusive (i.e., non-overlapping) groups helps to simplify the task of programming the device by breaking the device down into several discrete parts, each of which is smaller and more easily managed than the whole device. Providing signal conductors which serve only to interconnect the programmable logic elements in each group avoids tying up much longer conductors just to make short interconnections between adjacent programmable logic elements. This helps to reduce the required number of long conductors.

In the above-described arrangement in which the programmable logic elements are grouped and each group is uniquely associated with certain interconnection signal conductors, each programmable logic element may be augmented with a programmable output stage which can be used either to feed the output of that programmable logic element to conductors which go beyond the associated group or to the interconnect conductors of the associated group.

Multiplexers can also be used in combination with programmable signal conductor interconnections to allow certain of the conductors to be laid down more densely, to reduce the size of the interconnection array, and to reduce the capacitive loading on each output conductor of the array. Instead of one output conductor crossing a large number of parallel input conductors with a programmable interconnection at each intersection of the output conductor with the input conductors (which tends to force relatively wide spacing of the input conductors because of the relatively large size of the programmable interconnections), two substantially parallel output conductors feeding a programmably controlled output multiplexer are used. Each of these output conductors has a programmable interconnection only with every other one of the input conductors, and the input conductors which are thus connectable to one of the output conductors are interdigitated with the input conductors which are connectable to the other one of the output conductors. By thus spreading the programmable interconnections somewhat parallel to the longitudinal axes of the input conductors, the input conductors can be placed more closely together, which may save valuable space on the integrated circuit. This technique can also be used and further enhanced to reduce the number of programmable elements required to control the programmable interconnections between the input and output conductors if desired. In particular, a single programmable element can be used to control two interconnections, one of which is on one output conductor, and the other of which is on the other output conductor. The output multiplexer then makes the final selection of the desired output signal. Reducing the number of programmable elements in this way may be especially beneficial when the programmable elements are relatively large (e.g., as compared to the signal conductor interconnection elements they control). Indeed, it may be desirable to use more than two output signal conductors feeding the programmably controlled output multiplexer and to have each programmable element control one interconnection element on each of the more than two output conductors to still further reduce the required number of programmable elements.

Furthermore, other objects of the invention are accomplished in accordance with the principles of this invention by providing programmable logic array integrated circuits which basically employ a highly modular structure of logic elements and logic element interconnection pathways, but which also have one or more of several types of additional interconnection pathways for such purposes as making interconnections locally without tying up resources in the general interconnection structure. For example, such local interconnections may include carry chain interconnections between adjacent or nearby logic modules, or cascade logic connections between such modules in order to allow concatenation of the logic in those modules without recourse to the general interconnection structure. Where, as is preferred, the logic modules are grouped in logic array blocks ("LABS") which are in turn arranged on the integrated circuit in rows and columns, these additional local interconnections may not only be provided between logic modules within a LAB, but also to logic modules in the LABs in another (typically adjacent) row and/or column.

Alternative embodiments of LABs are disclosed. In one embodiment, a RAM-LAB which includes a memory block and control circuitry is disclosed. The memory block includes four columns of memory, each of which are divided into upper and lower portions. The control circuitry generates the necessary control signals to route the data and address information to the proper memory column in the memory block. The present invention provides for accessing the RAM-LAB directly by the user or via programming software during the initialization process. In the present invention, a RAM-LAB can be accessed using the network of so-called global horizontal and vertical conductors in addition to conductors associated with each RAM-LAB.

In embodiments employing a network of so-called global horizontal and vertical conductors, interconnections between those conductors are preferably made through tri-state drivers rather than mere passive connections in order to boost signals which may be required to travel relatively long distances through the circuit. Such drivers may alternatively or in addition be used on all logic module output signals which drive relatively long conductors on the circuit.

In addition to the network of global horizontal and vertical conductors typically used for making interconnections between all but relatively closely adjacent logic modules and connections to most of the input and output terminals of the circuit, another auxiliary network of horizontal and vertical conductors (so-called universal fast conductors) may be provided for distributing certain widely used logic signals such as clock and clear signals throughout the circuit. For example, conductors in this universal fast conductor network may be connectable to every logic module in the circuit.

Still other objects of the invention are accomplished in accordance with the principles of the invention by providing programmable logic array integrated circuit devices with RAM blocks, the columns of which can be connected in the usual first-in-first-out ("FIFO") chains of other memory cells on the device for programming and verification with the other memory cells. Such programming and verification of the RAM block is row by row, similar to the programming and verification of the other memory cells. During use of the device to perform logic, the RAM block is disconnected from the FIFO chains, and the RAM becomes instead addressable by the other logic on the device for reading and writing. This addressing is preferably based on both row and column selection, and is therefore different from the row-by-row addressing which takes place during programming and verification. For example, this addressing may be based on selection of one row and one column of the RAM block for completely serial operation of the RAM block. Or this addressing may be based on one row and several columns, so that operation of the RAM is partly parallel.

Still further objects of the invention are accomplished in accordance with the principles of the invention by adding to a look up table circuitry for allowing the look up table to be effectively partitioned into smaller look up tables, one of which performs sum out logic required for one bit position of addition, and the other of which performs carry out logic required for that same bit position. Additionally, logic may be added to selectively feed back the output of a flip-flop associated with each look up table to an input of that look up table to facilitate the use of the look up table as a counter stage. Still further logic may be added to facilitate loading and/or clearing of the flip-flop associated with each look up table to simplify the provision of loadable and/or clearable counters.

Further features of the invention, its nature and various advantages will be more apparent from the accompanying drawings and the following detailed description of the preferred embodiments.

DETAILED DESCRIPTION OF THE PREFERRED EMBODIMENTS

I. First Embodiment

Figure 2:
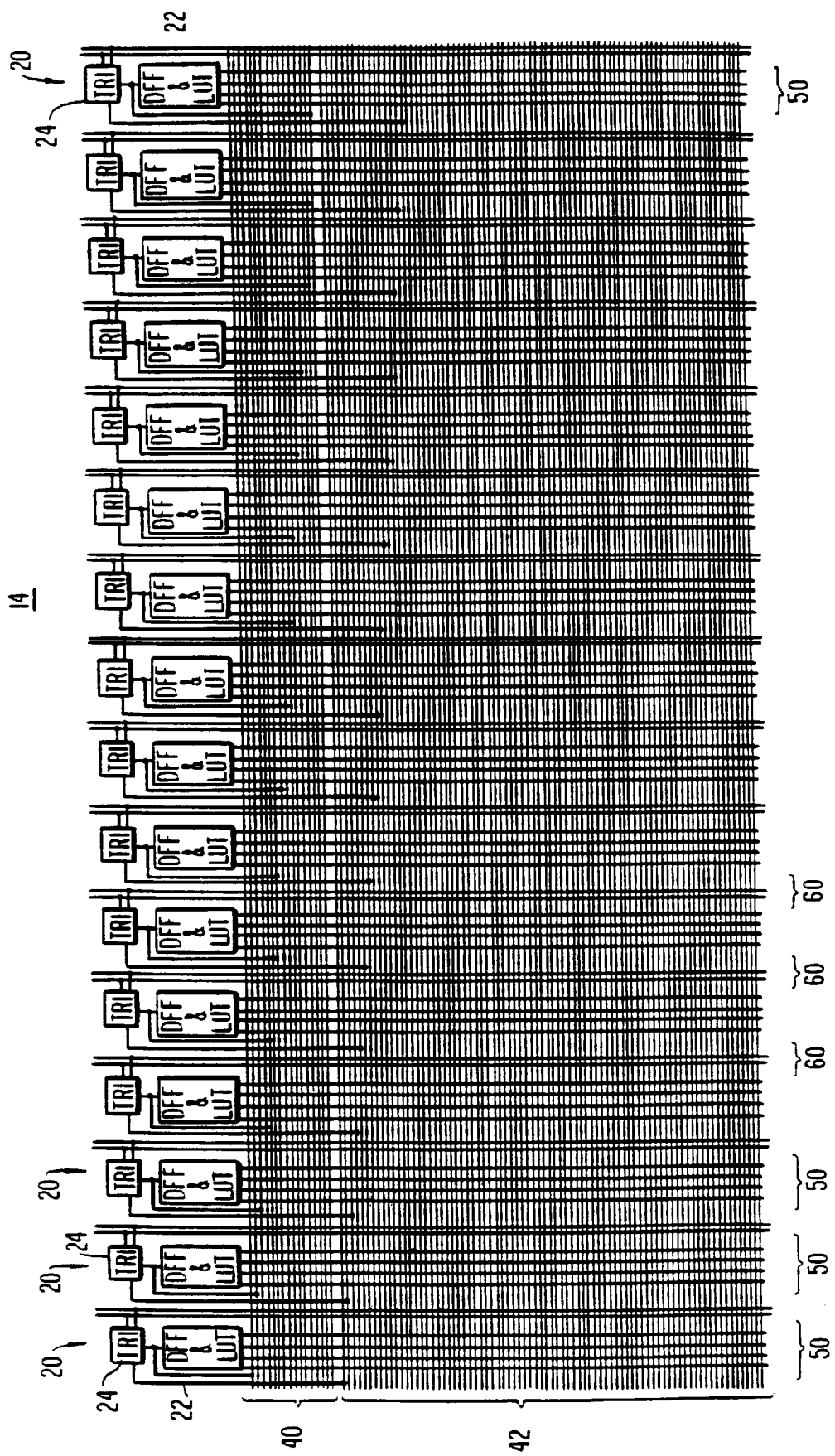
FIG. 2 is a more detailed block diagram of a representative portion of the circuit of FIG. 1.
Figures 1, 21:
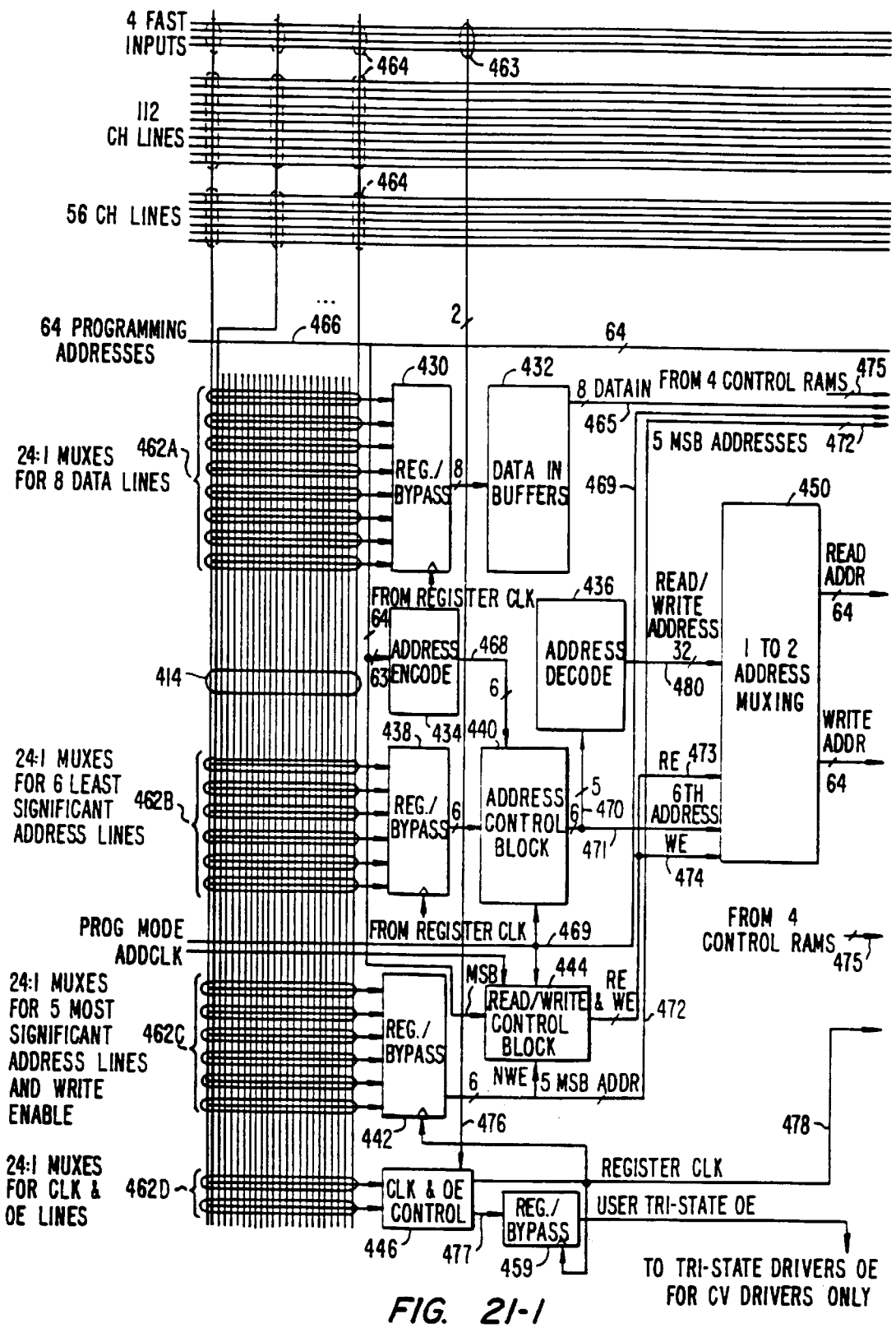
FIG. 1 is a simplified block diagram of a programmable logic array integrated circuit constructed in accordance with the principles of this invention.
FIG. 21 illustrates a preferred embodiment of the RAM-LAB in FIG. 20.
Figures 2, 21:
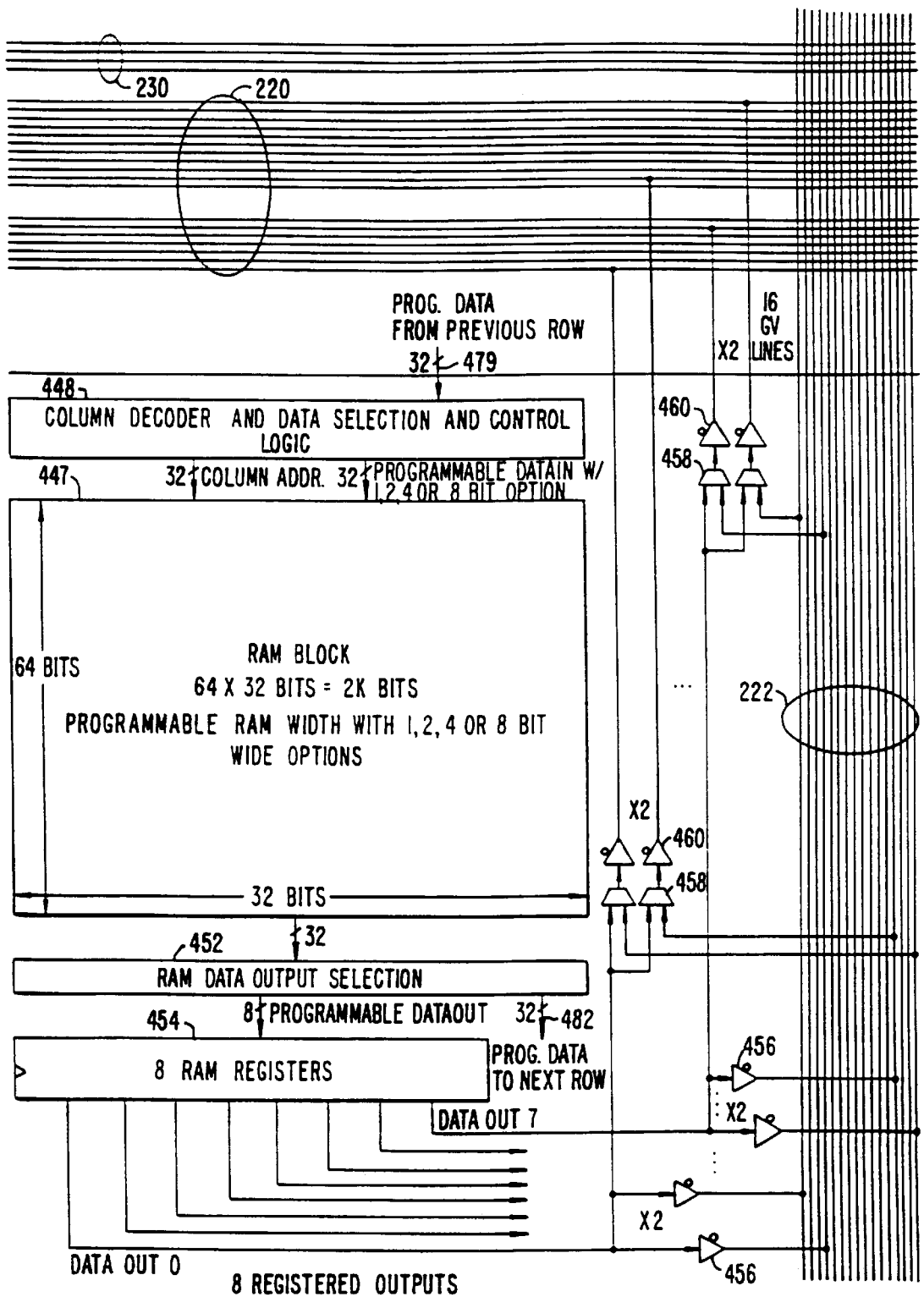

As shown in FIG. 1, an illustrative programmable logic array integrated circuit 10 constructed in accordance with the first embodiment of the present invention includes a two-dimensional array of groups 12 of programmable logic elements. The representative portion of FIG. 1 which is surrounded by broken line 14 and which includes a typical group 12 is shown in more detail in FIG. 2. The structure shown in FIG. 2 is sometimes referred to herein as a logic array block or LAB. Accordingly, integrated circuit 10 (FIG. 1) is an eight by eight two-dimensional array of sixty-four LABs 14.

Figure 3:
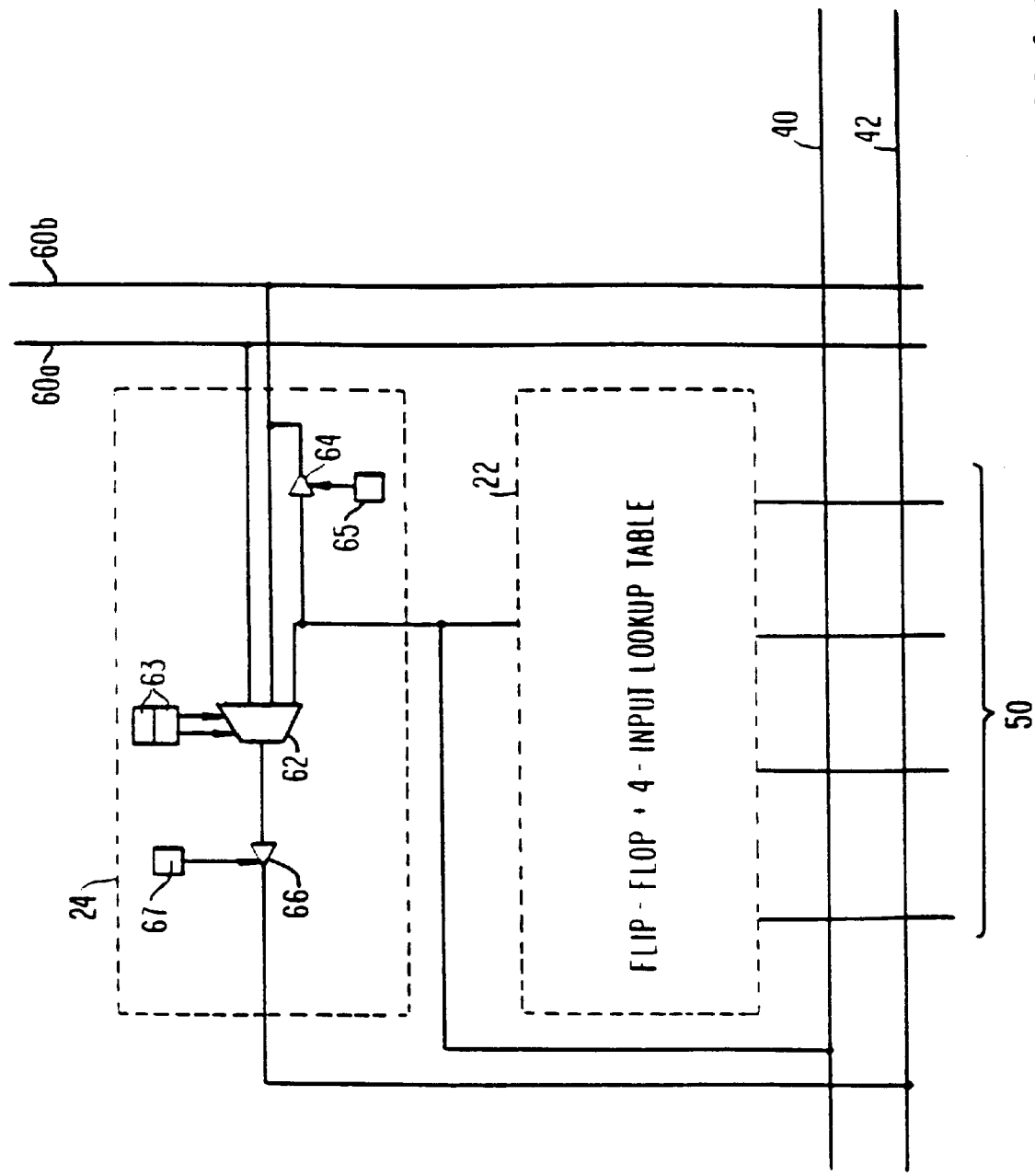
FIG. 3 is a still more detailed schematic block diagram of a representative portion of FIG. 2.
Figure 4:
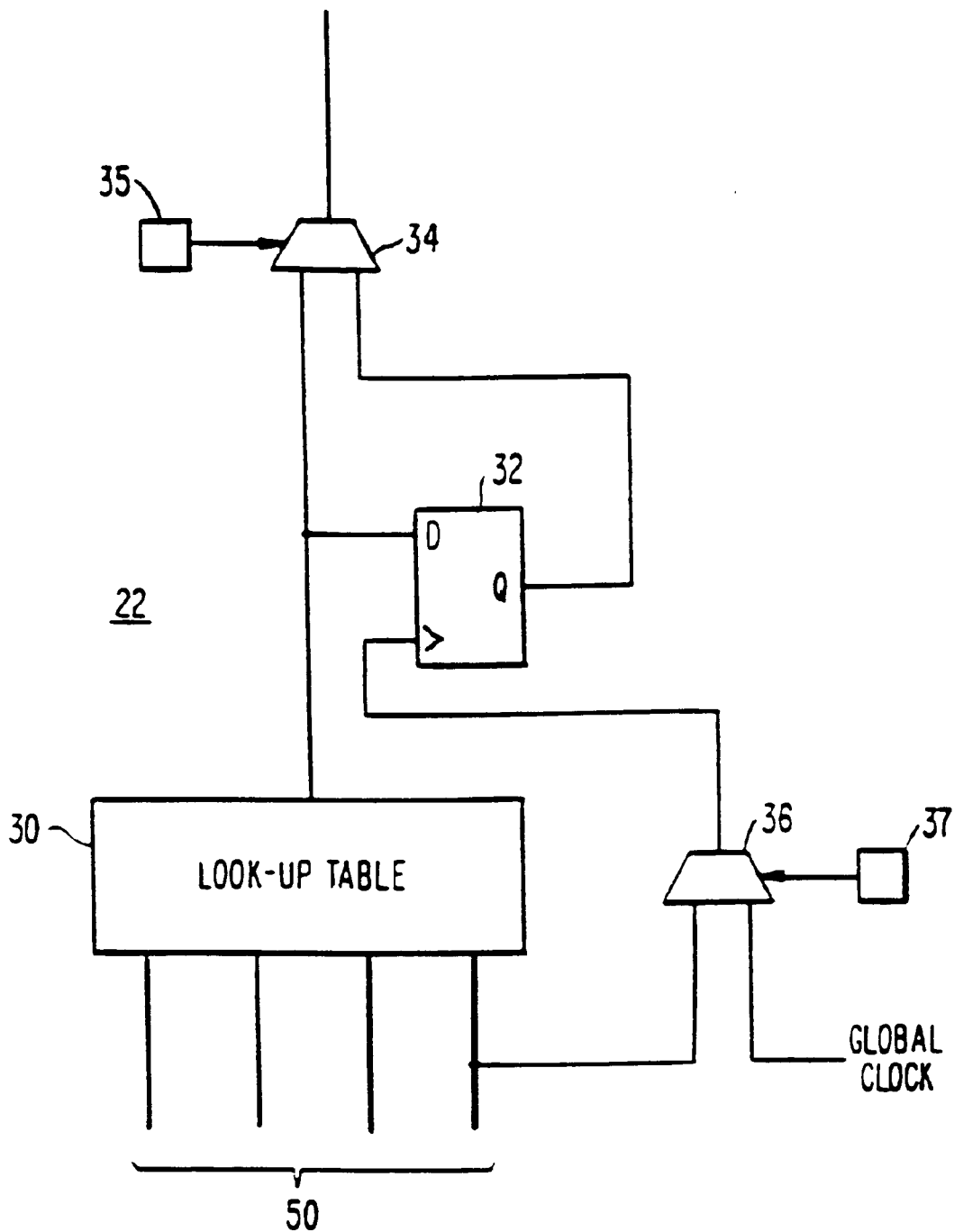
FIG. 4 is a schematic block diagram showing a portion of FIG. 3 in still more detail.

As can be seen in FIG. 2, each LAB 14 includes sixteen programmable logic elements or macrocells 20, a representative one of which is shown in more detail in FIG. 3. In particular, although other types of logic elements could be used instead, in the illustrative embodiment shown in FIG. 3 each programmable logic element 20 includes a D-type flip-flop and four-input look-up table element 22 (shown in more detail in FIG. 4) and tri-state driver logic 24. As shown in FIG. 4, each element 22 includes a four-input look-up table 30 which is programmable to produce a desired binary output signal value for each of the sixteen possible combinations of its four binary input signals. The output signal of look-up table 30 is applied to multiplexer 34 both directly and via D-type flip-flop 32. Flip-flop 32 can be clocked by either of the signals applied to multiplexer 36, i.e., by either a global clock signal or by one of the inputs to look-up table 30. Multiplexers 34 and 36 are controlled by conventional programmable elements 35 and 37 (e.g., RAM, EPROM, EEPROM, fuse, or antifuse elements).

Returning to FIG. 1, each LAB 14 has a plurality of signal conductors 40 (e.g., one for each of the programmable logic elements 20 in that LAB) which can be used to convey signals only between the programmable logic elements in that LAB (see also FIG. 2). Accordingly, the conductors 40 associated with each LAB are uniquely associated with that LAB and do not extend beyond that LAB. In addition, a plurality of signal conductors 42 is associated with each horizontal row of LABs 14. These signal conductors can be used to convey signals between LABs in the associated horizontal row of LABS. For example, eight such conductors 42 may be provided for each horizontal row of LABS. This is less than the number of programmable logic elements in each horizontal row, so some of conductors 42 are connected to the outputs of two programmable logic elements.

In addition to the above-described horizontal signal conductors, there are two types of vertical signal conductors other than those which have already been discussed. The first of these provide the four inputs to the look-up table 30 in each programmable logic element 20. These conductors are not shown in FIG. 1, but are identified by the reference number 50 in the other FIGS. These conductors do not go outside the LAB of the associated programmable logic element. They allow the associated programmable logic element to receive input signals from the conductors 40 in the associated LAB and/or from the conductors 42 which pass through the associated LAB. Each conductor 50 may be programmably interconnectable to some or all of the horizontal conductors 40 and 42 that it crosses. Only one of the possible interconnections will generally be made at any one time.

Figure 6:
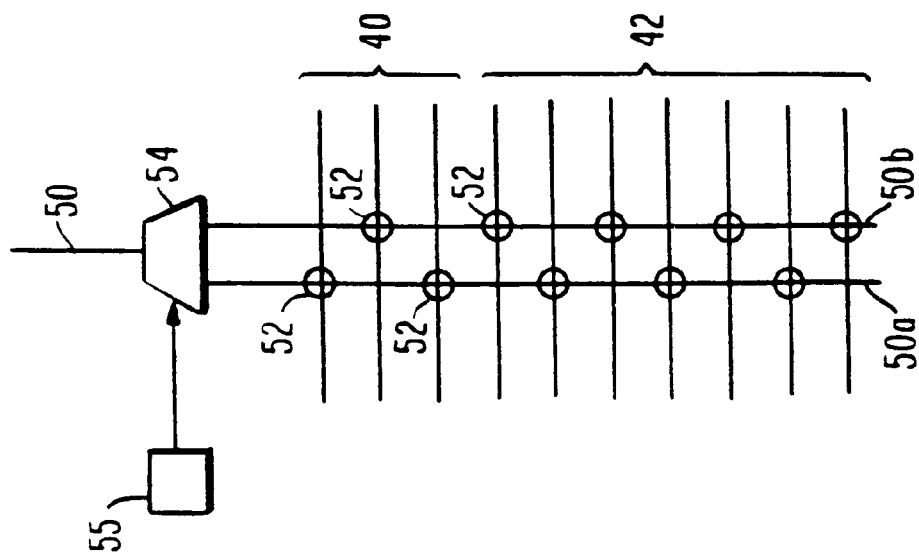
FIGS. 5–9 are schematic diagrams showing alternative ways of making certain interconnections in circuits of the type shown in other drawings.
Figure 5:
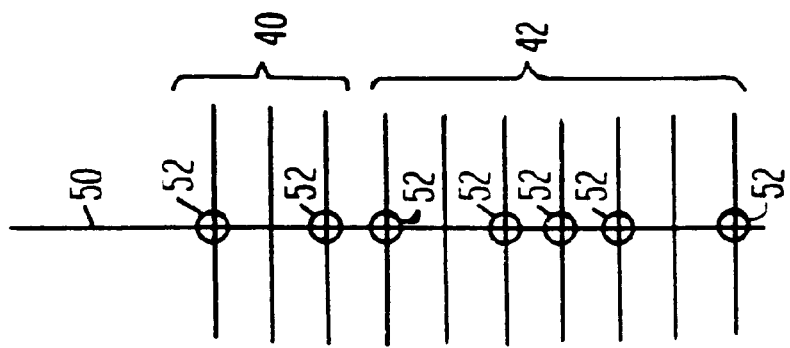
Figure 7:
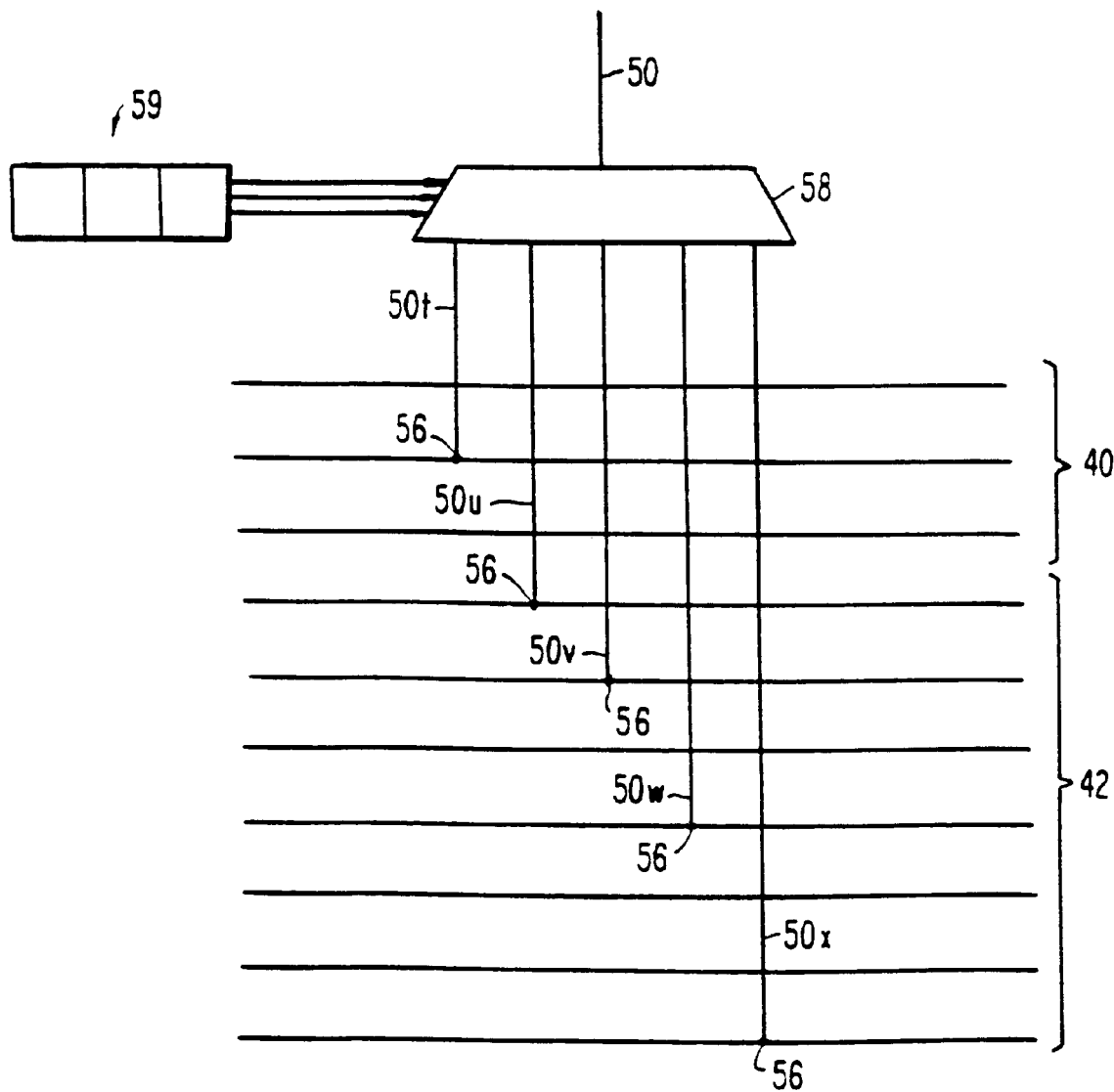

Conductors 50 can be configured in any of several ways. As shown in FIG. 5, for example, each conductor 50 can be a single line with programmable interconnections 52 to some or all of the horizontal conductors that it crosses. Alternatively as shown in FIG. 6, each conductor 50 can be the output signal of a multiplexer 54 which is fed by two (or more) conductors 50a and 50b. Each of conductors 50a and 50b has programmable interconnections 52 to a mutually exclusive subset of the input conductors crossed by 50a and 50b. These subsets are chosen so that no two adjacent input conductors 40 and 42 have programmable interconnections 52 to the same output conductors 50a and 50b. By thus spacing adjacent programmable interconnections parallel to the longitudinal axes of input conductors 40 and 42, it may be possible to place the input conductors closer together. This can be an important consideration given the large number of conductors on circuit 10. The capacitive loading on each of conductors 50a and 50b is less than it would be on a single conductor with the same total number of possible interconnections, thereby allowing faster operation of the device. Multiplexer 54 is controlled to connect one of its inputs 50a or 50b to its output 50 by programmable device 55. As another possible alternative shown in FIG. 7, each input conductor 40 and 42 which can be connected to output conductor 50 has a transverse branch conductor 50t through 50x connected to it by a fixed connection 56. These branch conductors are the inputs to a multiplexer 58 which can connect any one of its inputs to its output. Multiplexer 58 is controlled to make this connection by programmable elements 59. Fixed connections 56 can be made smaller than programmable interconnections, and they also reduce the load on input conductors 40 and 42 as compared to programmable interconnections such as 52 in FIGS. 5 and 6.

Figure 8:
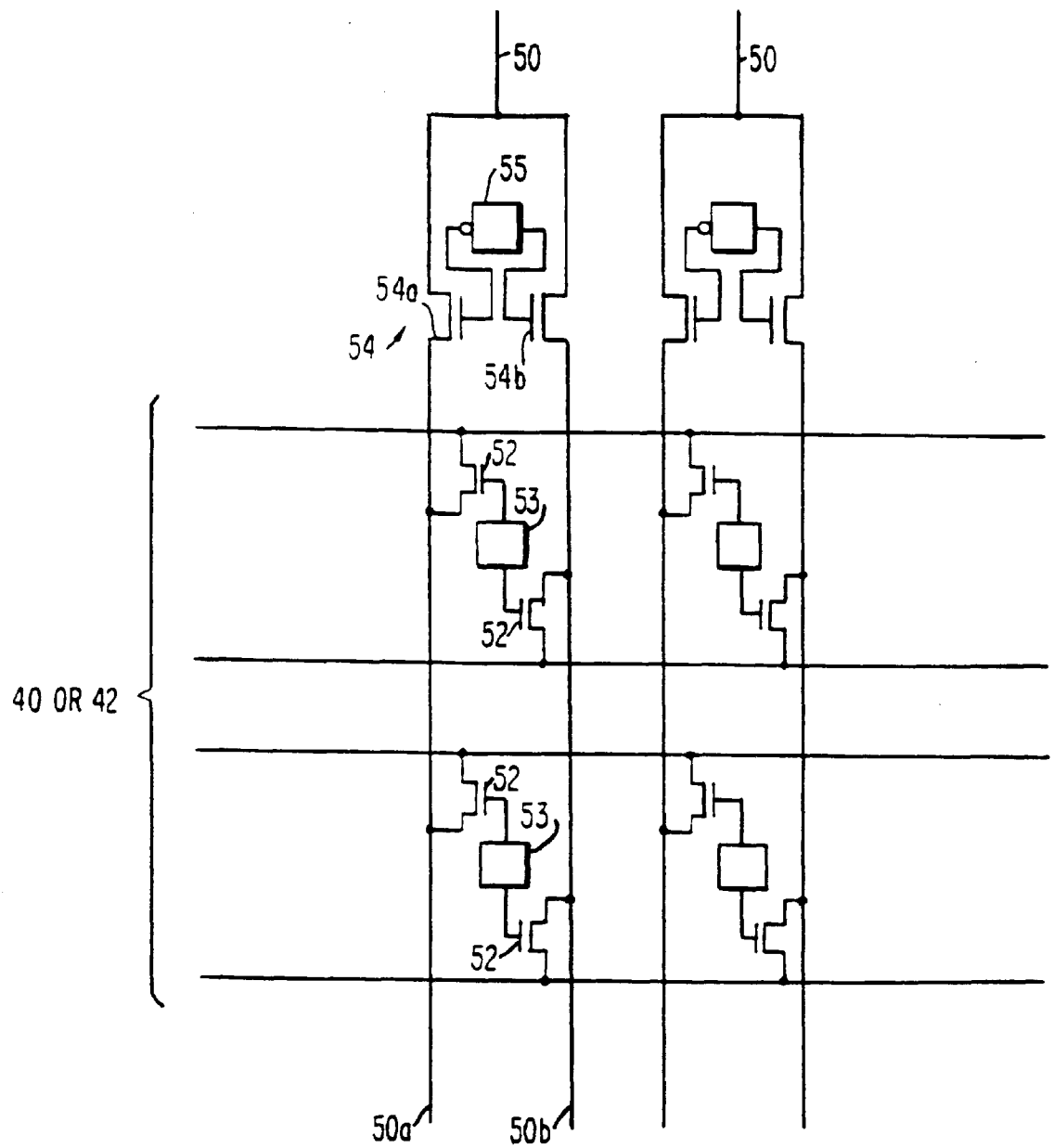

When the technique shown in FIG. 6 is used, the number of programmable elements required to control the interconnection elements can be dramatically reduced if desired by employing the enhancement shown in FIG. 8. In particular, one programmable element 53 (e.g., a conventional RAM cell) is used to control one interconnection element 52 associated with each of the two or more output conductors 50a and 50b feeding multiplexer 54. (In FIG. 8 multiplexer 54 is shown in more detail as including pass transistors 54a and 54b respectively controlled by the "true" and "complement" output signals of programmable element 55.) Thus when any programmable element 53 is programmed to make an input conductor to output conductor connection, two such connections are made. The final selection of the desired connection is made by multiplexer 54. As compared to embodiments in which each interconnection element is controlled by a separate programmable element, the required number of programmable elements is dramatically reduced (i.e., by nearly one-half) by employing the technique shown in FIG. 8. This can be especially important in the event that the programmable elements are relatively large (e.g., as compared to the interconnection elements) because significantly smaller interconnection arrays can be produced by reducing the number of programmable elements required in the array.

Although only two conductors 50a and 50b are shown feeding each multiplexer 54 in FIGS. 6 and 8, it will be understood that larger multiplexers fed by more than two conductors (e.g., four or eight conductors) can be used if desired in embodiments of the type shown in either of these FIGS. In the case of FIG. 8 type embodiments with more than two conductors feeding each multiplexer, each programmable element 53 can control one interconnection element 52 associated with each conductor feeding a multiplexer. This allows an even greater reduction in the required number of programmable elements.

Figure 9:
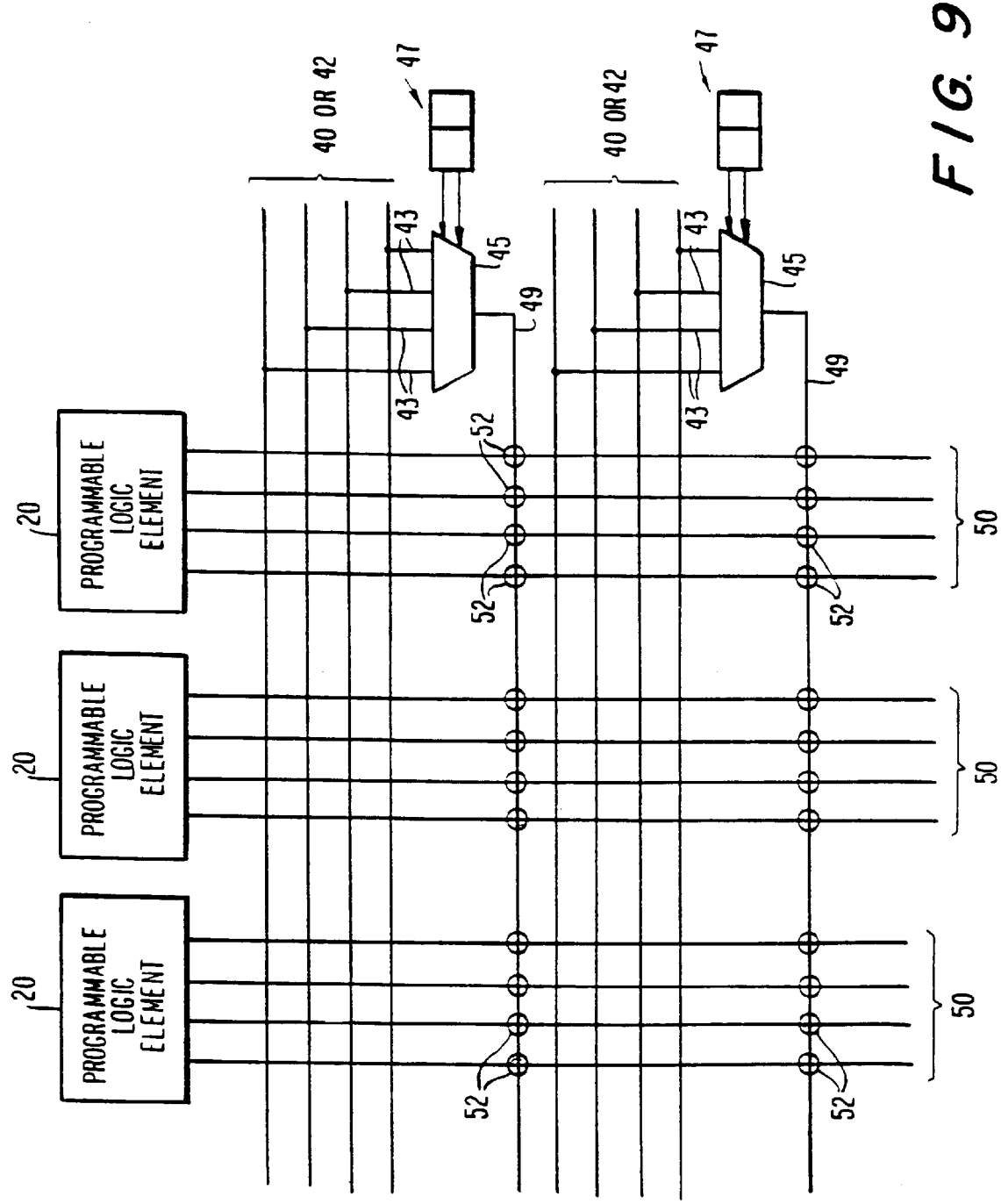

Another technique which can be used in accordance with this invention to provide interconnections between input conductors such as 40 and 42 and output conductors such as 50 is shown in FIG. 9. Instead of providing large numbers of programmable interconnections where input conductors 40 and 42 intersect output conductors 50, each input conductor has a transverse branch 43 fixedly connected to it. Several of these transverse branches are grouped as inputs to multiplexers 45. Each of multiplexers 45 is controlled by associated programmable elements 47 to select one of its inputs as its output 49. Each multiplexer output conductor 49 is extended (as an additional input conductor) across output conductors 50 and has programmable interconnections 52 to some or all of those output conductors. The technique shown in FIG. 9 reduces the size of the grid of intersecting conductors 40, 42, and 50 by reducing the number of programmable interconnections 52 that are employed. It also reduces the loading on input conductors 40 and 42.

Although the techniques described above in connection with FIGS. 6–9 are illustrated in the context of the signal conductors connected to logic elements 20, it will be understood that these techniques are equally applicable anywhere a cross point switch type interconnection is required between first and second groups of conductors on an integrated circuit.

Returning to the description of the vertical conductors in FIGS. 1–3, the other type of vertical conductors are identified by the reference number 60 in the FIGS. These are the only vertical conductors that extend between the horizontal rows of LABs 14. As can be seen in FIG. 2 there are two conductors 60 associated with each programmable logic element position across the circuit. In other words, the left-most pair of conductors shown in FIG. 2 extend along the entire vertical dimension of circuit 10 and have the same relationship to the left-most programmable logic element in each horizontal row that they are shown to have in the representative LAB shown in FIG. 2.

The manner in which the two conductors 60 associated with each vertical column of programmable logic elements 20 are utilized is more apparent in FIG. 3. Conductor 60a is connected only to one input of multiplexer 62 in the tri-state driver 24 of representative programmable logic element 20. (In at least some other elements 20 in this vertical column, conductor 60a is instead connected in the manner shown for conductor 60b in FIG. 3.) Conductor 60b is connected both to an input of multiplexer 62 and the output of tri-state driver element 64. (In at least some other elements 20 in this vertical column, conductor 60b is instead connected in the manner shown for conductor 60a in FIG. 3.) Note that the remaining input to multiplexer 62 and the input to element 64 is the output of logic module 22. The output of multiplexer 62 is applied to tri-state driver element 66. The output of tri-state driver element 66 is connected to one of long horizontal conductors 42. The connection made by multiplexer 62 and whether each of elements 64 and 66 is on or off are controlled by programmable elements 63, 65, and 67.

From the foregoing it will be apparent that conductors 60 can be used to convey signals from one horizontal row of LABs 14 to another horizontal row. For example, a programmable logic element output signal applied to conductor 60b via element 64 in FIG. 3 can be output from the multiplexer 62 in any other vertically aligned programmable logic element (or elements) and thereby put on the horizontal conductor 42 to which that multiplexer output is connected. From that horizontal conductor 42 the signal can be picked up by any conductor 50 to which that horizontal conductor is connectable. Note that elements 62 and 66 can alternatively be used to apply the output signal of the associated logic module 22 to the associated long horizontal conductor 42 so that in addition to being available as an input to other programmable logic elements in the associated LAB (via the associated short horizontal line 40), that logic module output can also be made available for input to programmable logic elements in other LABs in the associated horizontal row. Tri-state driver module 24 allows the logic module output signal which is being used in this way to be simultaneously applied to one of conductors 60 via element 64. On the other hand, any tri-state driver module 24 which is not being used to apply the output signal of the associated logic module 22 to a long horizontal conductor 42 is free for use in connecting a vertical conductor 60a or 60b to that long horizontal conductor.

Inputs and outputs (not shown) to integrated circuit 10 can be connected in any desired manner (e.g., by connecting selected conductors 42 or 60 to input and/or output pads via suitable input and/or output drivers).

Grouping programmable logic elements 20 into mutually exclusive LAB groups, each with associated short horizontal conductors 40 for transferring data among the programmable logic elements in that group, not only helps to improve the organization of the circuit (thereby simplifying programming), but also greatly reduces the number of long conductors (e.g., 42) that are needed. This in turn saves valuable space on the circuit chip.

II. Second Embodiment

Figure 10:
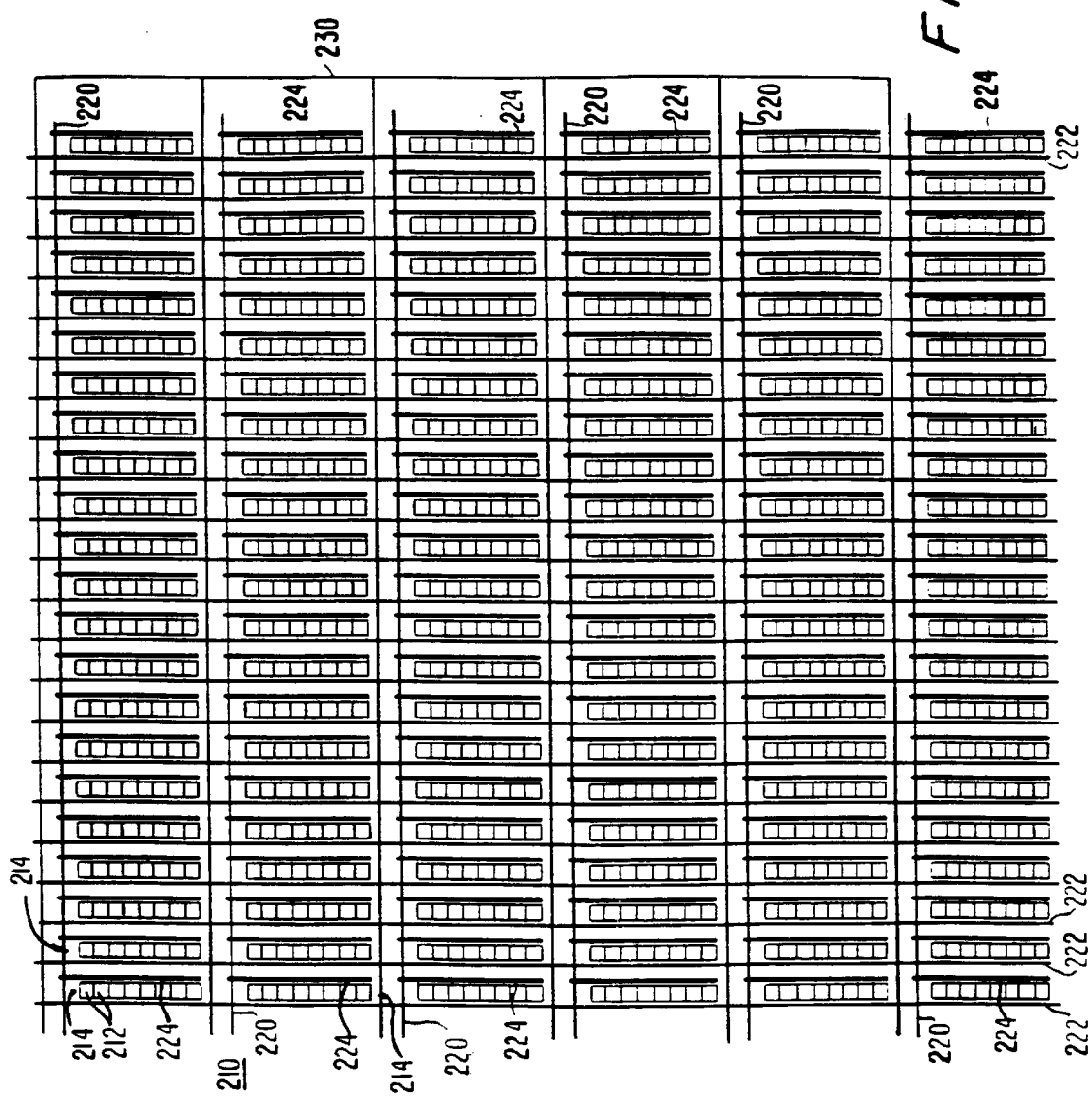
FIG. 10 is a simplified schematic block diagram of an illustrative programmable logic array integrated circuit constructed in accordance with the principles of the invention.

FIG. 10 shows the overall organization of an illustrative programmable logic array integrated circuit 210 constructed in accordance with the second embodiment of the present invention. Not all of the conductors employed in circuit 210 are shown in FIG. 10, but enough is shown in this FIG. to begin the discussion. Each logic module 212 is represented by a small square in FIG. 10. Logic modules 212 are grouped together in groups of eight. Each of these groups is referred to as a logic array block or LAB 214. LABs 214 are arranged in six horizontal rows and twenty two vertical columns on circuit 210. Accordingly, there are a total of one hundred thirty-two LABs 214 and one thousand fifty six logic modules 212 on circuit 210. Each logic module 212 is capable of performing a relatively elementary logic function (discussed in more detail below), but extremely complex logic can be performed by variously interconnecting the logic modules as will now be discussed.

The interconnection circuitry shown in FIG. 10 includes (1) groups of so-called global horizontal conductors 220 interspersed between the horizontal rows of LABS, and (2) groups of global vertical conductors 222 interspersed between the vertical columns of LABS. These conductors are global in the sense that they extend along an entire row or column. Programmable interconnections can be made between intersecting horizontal and vertical conductors in order to apply signals on the vertical conductors to the horizontal conductors. Each LAB 214 has a group of vertical LAB input conductors 224 for conveying signals from the global horizontal conductors 220 intersected by conductors 224 to the logic modules 212 in that LAB.

In addition to the above-described conductors, FIG. 10 shows part of a network of so-called universal fast conductors. The conductors 230 of this network shown in FIG. 10 extend throughout the entire circuit and can be used as will be described in more detail below to convey widely used logic signals such as clock and/or clear signals to any logic modules 212 on the circuit.

Although other numbers of conductors can be used if desired, in the depicted preferred embodiment, there are one hundred seventy six conductors in each group of global horizontal conductors 220, there are sixteen conductors in each group of global vertical conductors 222, there are twenty four conductors in each group of LAB input conductors 224, and there are four universal fast conductors 230.

Figure 11:
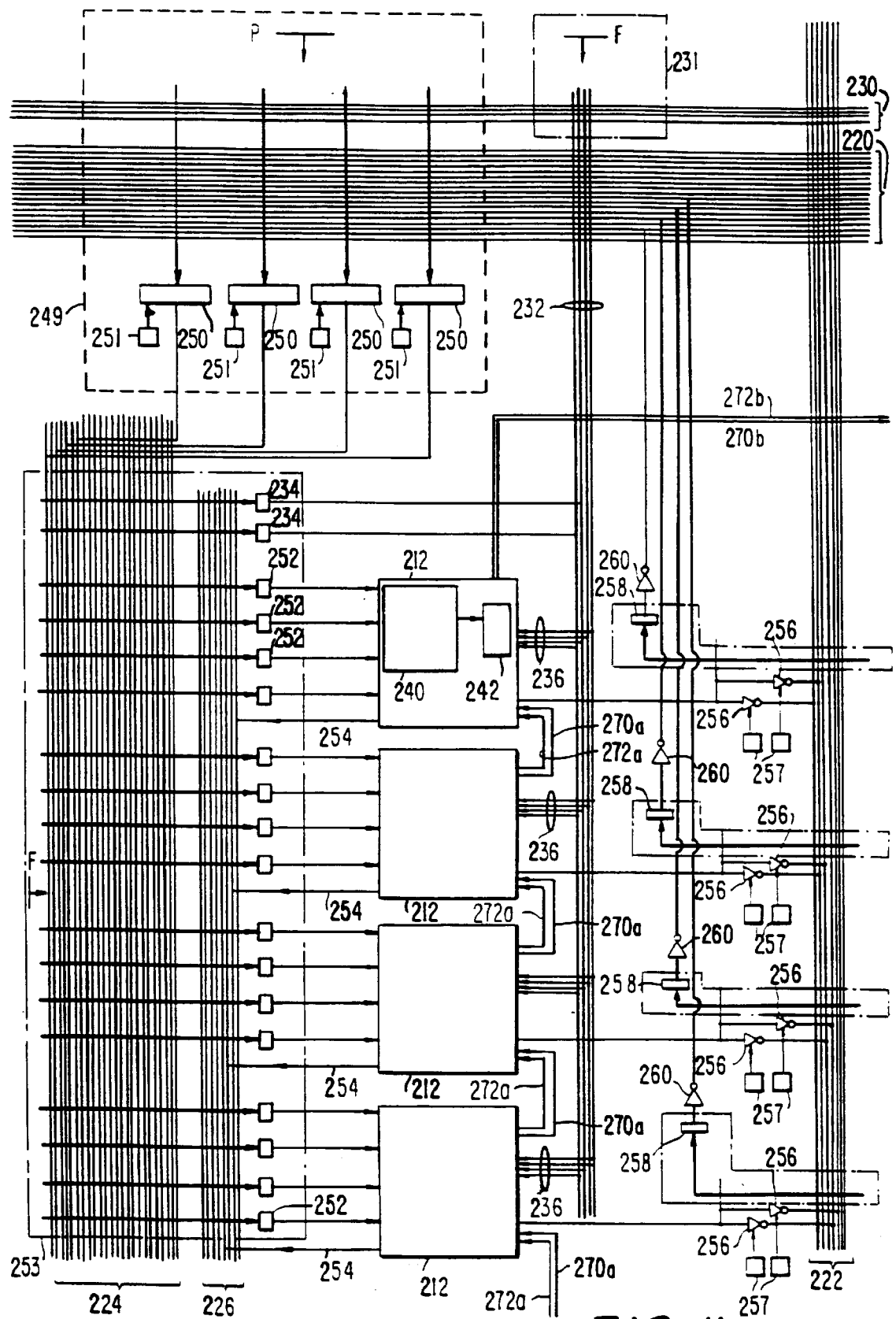
FIG. 11 is a more detailed schematic block diagram of an illustrative embodiment of a representative portion of the circuit shown in FIG. 10.

Turning now to FIG. 11 which shows one possible implementation of part of a typical LAB 214 on circuit 210, four representative logic modules 212 are shown. Although logic modules 212 can be implemented in other ways (e.g., as product-term-based macrocells (an alternative which is discussed in more detail below, for example, in connection with FIGS. 16A–C)) in the illustrative embodiment shown in FIG. 11 each logic module 212 includes a look up table or universal logic block ("ULB") 240 and a flip-flop type device 242. Each look up table 240 is basically a circuit which can be programmed to produce an output signal which is any logical function of four input signals applied to the look up table. Each flip-flop 242 is a circuit which can be programmed either to store or to simply pass through the output signal of the associated look up table (see, for example, the circuit shown in Norman et al. U.S. Pat. No. 4,864,161). Alternatively, device 242 could be a flip-flop with no pass through or bypass capability.

In addition to the above-described representative logic modules, FIG. 11 shows portions of representative global horizontal conductors 220, global vertical conductors 222, LAB input conductors 224, and universal fast conductors 230. Each of LAB input conductors 224 can be connected to a selected one (or more) of conductors 220 and 230 via a programmably controlled programmable logic connector ("PLC") 250 (only some of which are shown in FIG. 11). PLCs 250 can be implemented in any of a wide variety of ways. For example, each PLC 250 can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs 250 are EPROMs, EEPROMs, pass transistors, transmission gates, antifuses, laser fuses, metal optional links, etc. The components of PLCs 250 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable).

In the depicted, presently preferred embodiment each PLC 250 is a 15-to-1 switch which is controlled by programmable function control elements ("FCEs") 251 on circuit 210 to connect one of its fifteen inputs to its output. Each of the fifteen inputs is the signal on a predetermined respective one of conductors 220 or 230. There is one PLC 250 for each of the twenty four LAB input conductors 24. Each of conductors 220 and 230 is connected to two of PLCs 250. Accordingly, each of conductors 220 and 230 is connectable to two of conductors 224. The letter P and the associated arrow symbol inside dotted line 249 indicate that the population of connections from conductors 220 and 230 to the inputs of each of PLCs 250 is a partial population.

FCEs 251 can also be implemented in any of several different ways. For example, FCEs 251 can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like.

Each of the four data inputs to each logic module 212 can be connected to any one (or more) of LAB input conductors 224 (and/or) any one (or more) of local conductors 226) via a PLC 252. PLCs 252 (and each similar PLC 234 which are discussed below) may have any of the characteristics described above for the general case of PLCs 250. However, in the depicted, presently preferred embodiment each of PLCs 252 (and each similar PLC 234) is a 32-to-1 switch so that any one of the 24 LAB input conductors 224 or any one of the eight local conductors 226 can be connected to each LAB data input. Accordingly, the letter F and the associated arrow symbol inside chain dotted line 253 indicate that the population of connections from conductors 224 and 226 to PLCs 234 and 252 is a full population. To avoid overcrowding the drawing, the FCEs (similar to above-described FCEs 251) for programmably controlling PLCs 234 and 252 are not shown separately, but rather are assumed to be part of elements 234 and 252.

Figure 18:
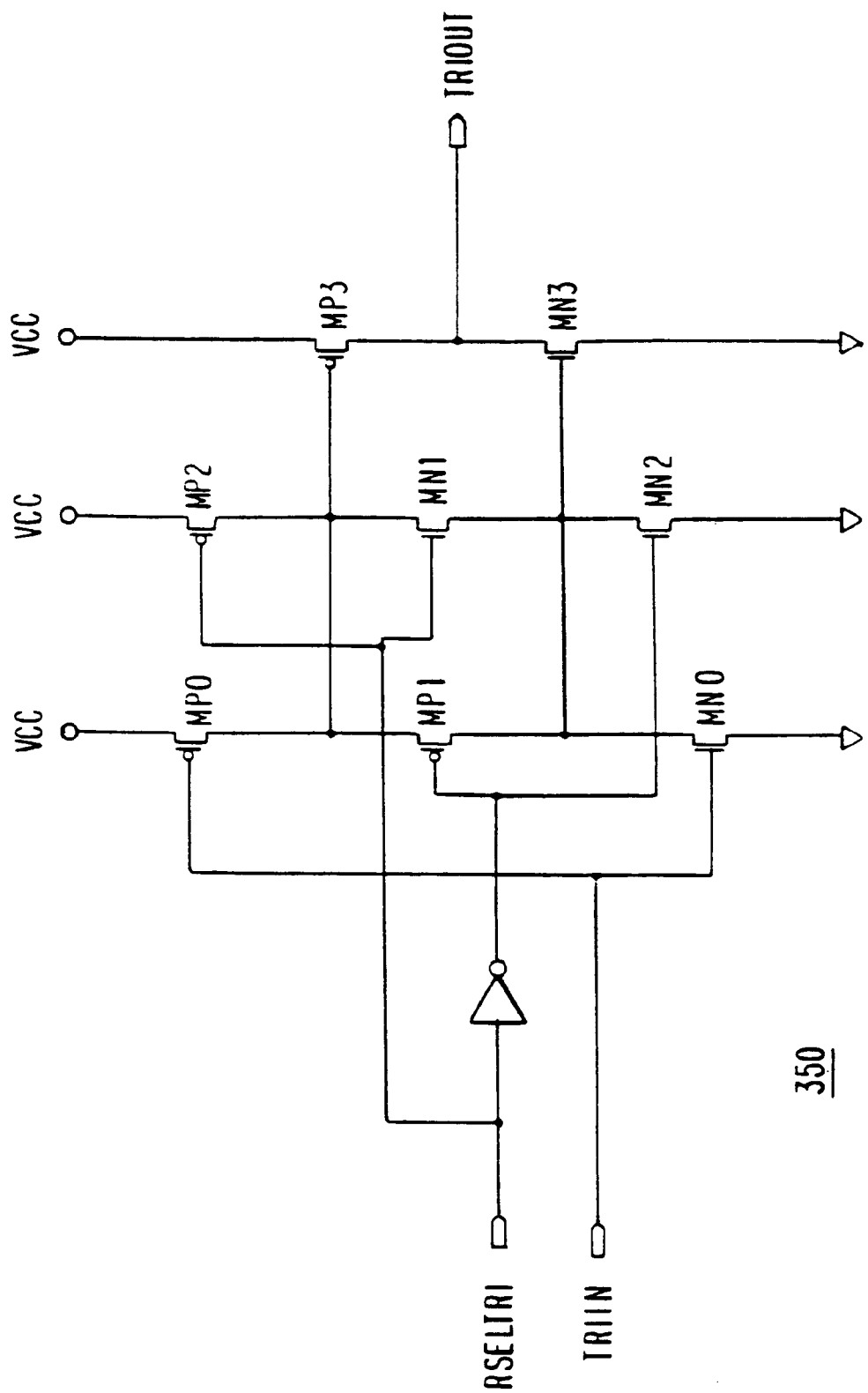
FIG. 18 is a schematic diagram of an illustrative embodiment of a representative element shown in FIG. 11.

The data output of the flip-flop 242 in each logic module 212 can be applied (via conductor 254) to a respective one of local conductors 226. These conductors serve only the logic modules in the associated LAB 214. In other words, conductors 226 do not extend beyond the associated LAB. The data output of the flip-flop 242 in each logic module 212 can also be applied to either or both of two global vertical conductors 222 (via tri-state drivers 256), and to one of global horizontal conductors 220 (via PLC 258 and tri-state driver 260). The other input or inputs to each PLC 258 are the signals from one or more of global vertical conductors 222. Accordingly, global vertical conductors 222 are selectively connectable to global horizontal conductors 220 via PLCs 258 and tri-state drivers 260. PLCs 258 may be similar to any of the above-described PLCs. The use of tri-state drivers 256 and 260 is advantageous to strengthen signals which may be required to travel relatively long distances throughout circuit 210 and/or which may be inputs to relatively large numbers of other components. A suitable tri-state driver is shown in FIG. 18 and described in detail below. Some or all of tri-state drivers 256 and 260 may be controlled (i.e., turned on or off) by FCEs (e.g., FCEs 257) on circuit 210. PLCs 258 are also typically controlled by FCEs on the circuit. All of these FCEs may be similar to above-described FCEs 251.

In addition to being available as data inputs to logic modules 212, the signals on any of conductors 224 and 226 can also or alternatively be applied to any of local vertical conductors 232 via PLCs 234. In the depicted, presently preferred embodiment, each of PLCs 234 is a 32-to-1 switch, but PLCs 234 can alternatively have any of the characteristics described above for the general case of PLCs 250. Although only two PLCs 234 are shown in FIG. 11, there is preferably one such PLC for each of the four conductors 232. Each of conductors 232 is connectable to any one of universal fast conductors 230 for receiving the signal on the fast conductor. These connections from conductors 230 to conductors 232 are preferably made in the same way that the connections from conductors 224 and 226 to conductors 232 are made, i.e., by PLCs controlled by FCEs (all represented by element 231 in FIG. 11). Again, although each of these PLCs can have any of the characteristics described above for the general case of PLCs 250, in the depicted, presently preferred embodiment each of these PLCs can connect any of conductors 230 to an associated one of conductors 232. The letter F and the arrow symbol inside chain dotted line 231 indicate that the population of possible connections from conductors 30 to each of conductors 232 is a full population. Each of conductors 232 is connectable (via conductors 236) to each of logic modules 212. FCE-controlled PLCs in each logic module allow these signals to be used for such purposes as flip-flop clock and flip-flop clear (see FIG. 17 (discussed below) which shows an illustrative logic module 12 in more detail). Thus local vertical conductors 232 are known as clock and clear lines and can be driven from fast lines 230 for synchronous clocks and clears (i.e., clocks and clears which come from outside of device 210 and are available everywhere throughout device 210), or from LAB input lines 224 or local lines 226.

There are two other types of logic module interconnections shown in FIG. 11 which require discussion. The first of these is carry chain interconnection represented in part by conductors 270a and 270b. These interconnections allow a carry out output of each logic module 212 to be used as a carry in input to an adjacent or nearby logic module as shown, for example, in Cliff et al. U.S. Pat. No. 5,274,581 (see also FIG. 17 herein). For example, carry chain conductors 270a allow the carry out output of each logic module 212 shown in FIG. 11 to be the carry in input to the next higher logic module in that FIG. Similarly, carry chain conductor 270b runs from the top-most logic module 212 in the LAB fragment shown in FIG. 11 to the bottom-most logic module in the horizontally adjacent LAB in the adjacent column of LABS. This allows the carry chain to continue from LAB to LAB if desired.

The other type of logic module interconnection remaining to be discussed is illustrated by representative conductors 272a and 272b in FIG. 11 (see also Cliff et al. U.S. Pat. No. 5,258,668). These conductors are called cascade connect conductors. They allow the data outputs of adjacent or nearby logic modules 212 to be logically combined, if desired, to perform more complex logic functions without the need to pass intermediate data through the general interconnection network. The manner in which cascade connect conductors 272 are employed in the logic modules is shown in detail in FIG. 12.

Figure 12:
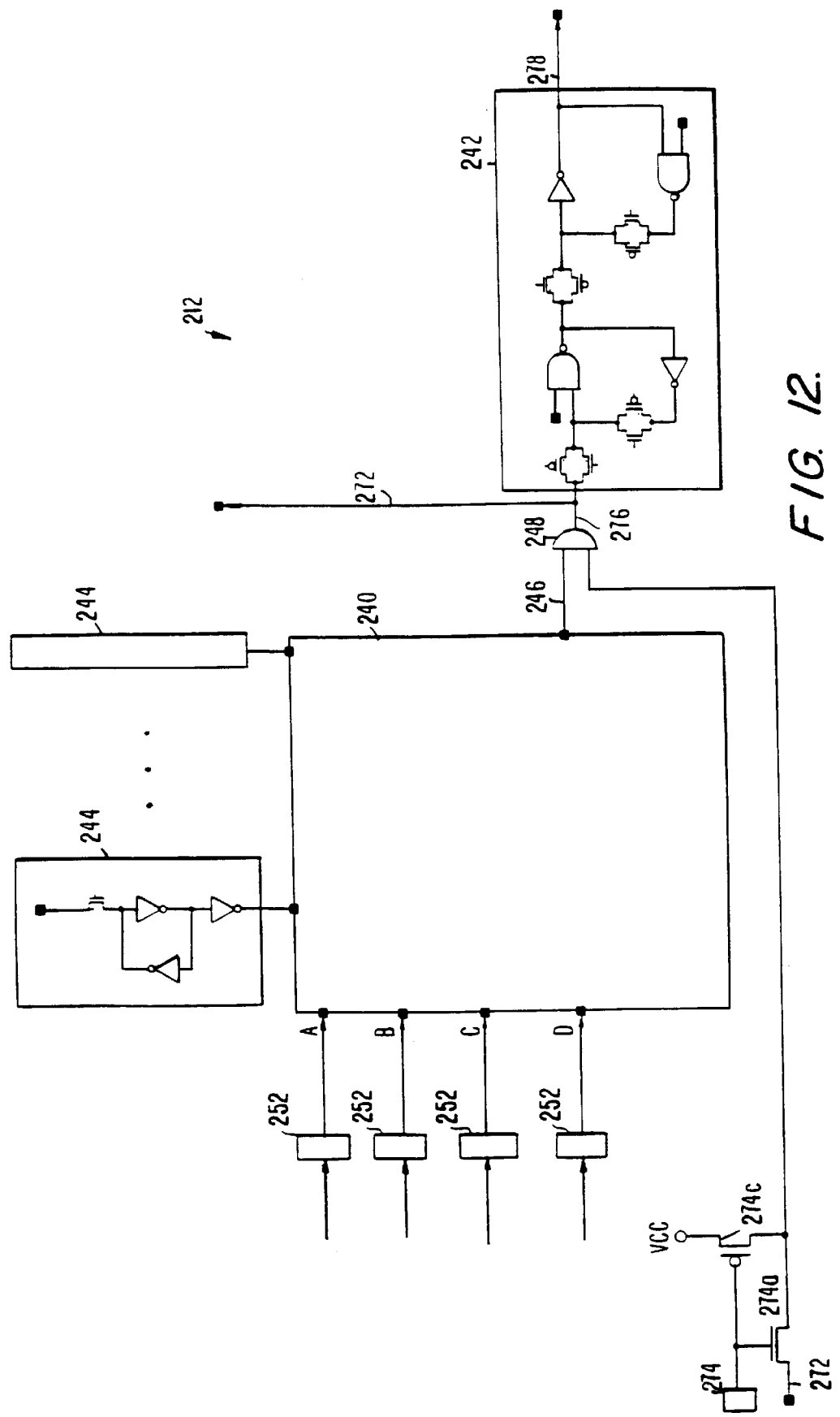
FIG. 12 is a still more detailed schematic block diagram of an illustrative embodiment of a representative portion of the circuitry shown in FIG. 11.

As shown in FIG. 12, a typical logic module 212 includes look up table or ULB 240 which is controlled by 216 FCEs 244 to produce on data output lead 246 any desired logical function of the four data input signals from PLCs 252. (Although in the particular embodiment shown in FIG. 12 a representative FCE 244 is depicted as a RAM cell, it will be understood that FCEs 244 can be implemented in any of a wide variety of ways as discussed above in connection with FCEs 251.) The signal on lead 246 is applied to one input of AND gate 248. (Although shown as an AND gate in FIG. 12, cascade connect device 248 could alternatively be any other suitable two-input logic function such as an EXCLUSIVE OR gate.) The other input to AND gate 248 is the cascade connect input from another logic module 212 gated by transistor 274a which is controlled by FCE 274b (similar to previously described FCEs). (If transistor 274a is disabled by FCE 274b, then transistor 274c is enabled to connect the second input of AND gate 248 to a source of logical 1 potential.) Accordingly, assuming that transistor 274a is enabled, AND gate 248 produces an output signal on lead 276 which is the logical AND of the signals on incoming leads 246 and 272. The signal on lead 276 can therefore be a significantly more complex logic function than could be produced by one look up table 240 by itself. In addition to being applied to flip-flop 242 and then by way of lead 278 and elements 254, 256, 258, and 260 to the more general interconnection structure, the signal on lead 276 is also applied to another cascade connect conductor 272 for cascade connection to another adjacent or nearby logic module 212 in the same way that the incoming lead 272 shown in FIG. 12 is connected to the logic module shown in that FIG.

FIG. 11 shows that each cascade connect conductor 272a from a logic module 212 is connected to the next higher logic module in that FIG. The cascade connect output from the top-most logic module 212 in FIG. 11 goes (via cascade connect conductor 272b) to logic modules in an adjacent column of LABs (e.g., to the bottom-most logic modules in the LAB immediately to the right of the LAB fragment shown in FIG. 11).

Figure 13:
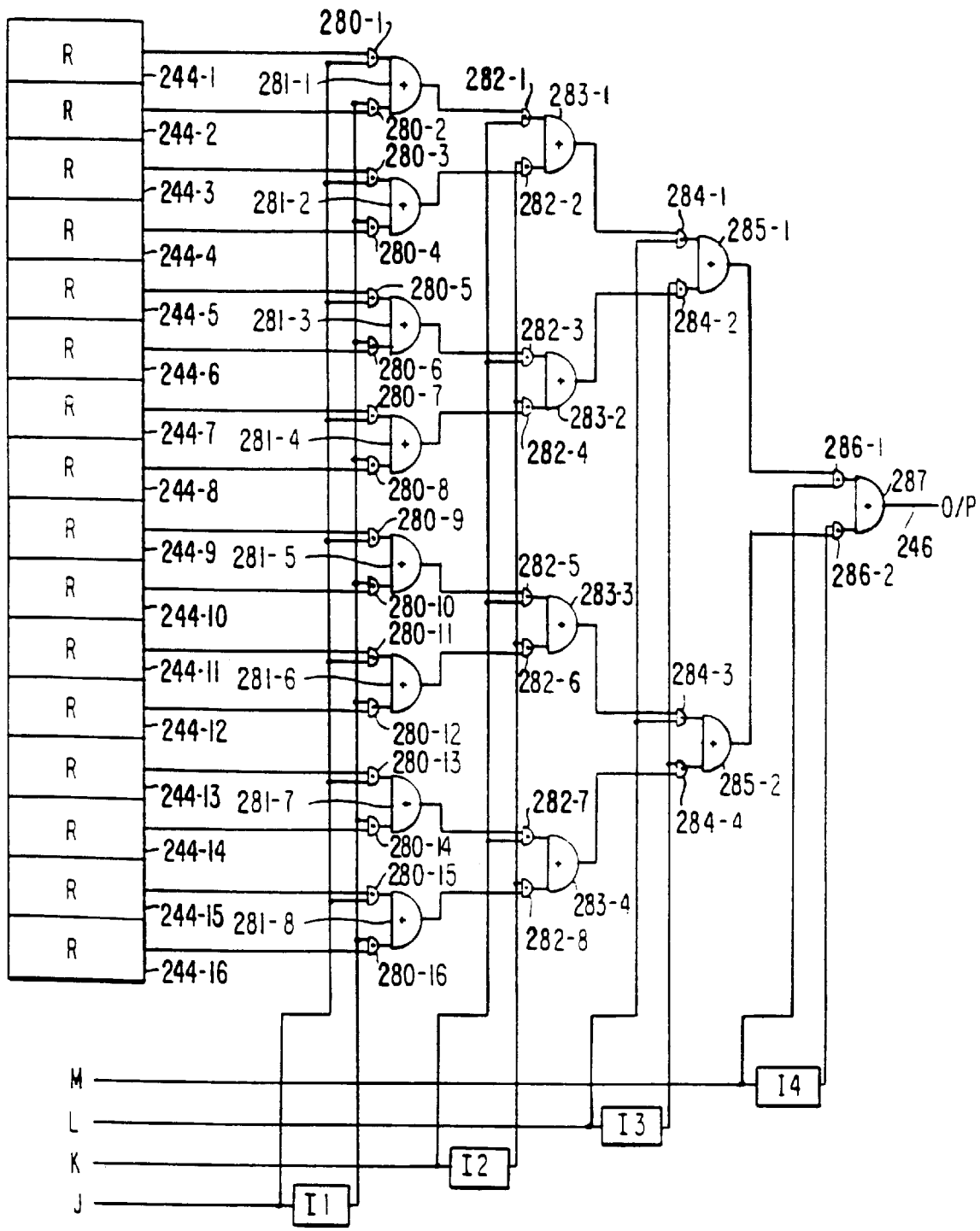
FIG. 13 is a schematic block diagram of an illustrative embodiment of a portion of the circuitry shown in FIG. 12.

FIG. 13 shows a typical basic look up table 240 in more detail. (Look up table 240 may be modified as shown in Cliff et al. U.S. Pat. No. 5,274,581 to facilitate performance of fast carry logic, but FIG. 13 shows the basic structure of a four-input look up table.) This table is controlled by sixteen FCEs 244. The output signal of each of these FCEs is applied to a respective one of sixteen AND gates 280. Alternate ones of AND gates 280 are respectively controlled by the true and complement of the first data input J, the complement of input J being produced by inverter I1. The outputs of adjacent pairs of switches 280 are then combined by OR gates 281 and applied to eight AND gates 282. Alternate ones of AND gates 282 are respectively controlled by the true and complement of the second data input K, the complement of input K being produced by inverter I2. The outputs of adjacent pairs of AND gates 282 are combined by OR gates 283 and then applied to four AND gates 284. Alternate ones of AND gates 284 are respectively controlled by the true and complement of the third data input L, the complement of input L being produced by inverter I3. The outputs of adjacent pairs of AND gates 284 are combined by OR gates 285 and applied to two AND gates 286. One of AND gates 286 is controlled by the true of the fourth data input M, while the other AND gate 286 is controlled by the complement of that input (produced by inverter I4). The outputs of AND gates 286 are combined by OR gate 287 to produce the data output on conductor 246. It will be apparent from the foregoing that any desired logical function of data inputs J–M can be produced by appropriately programming FCEs 244.

Figure 14:
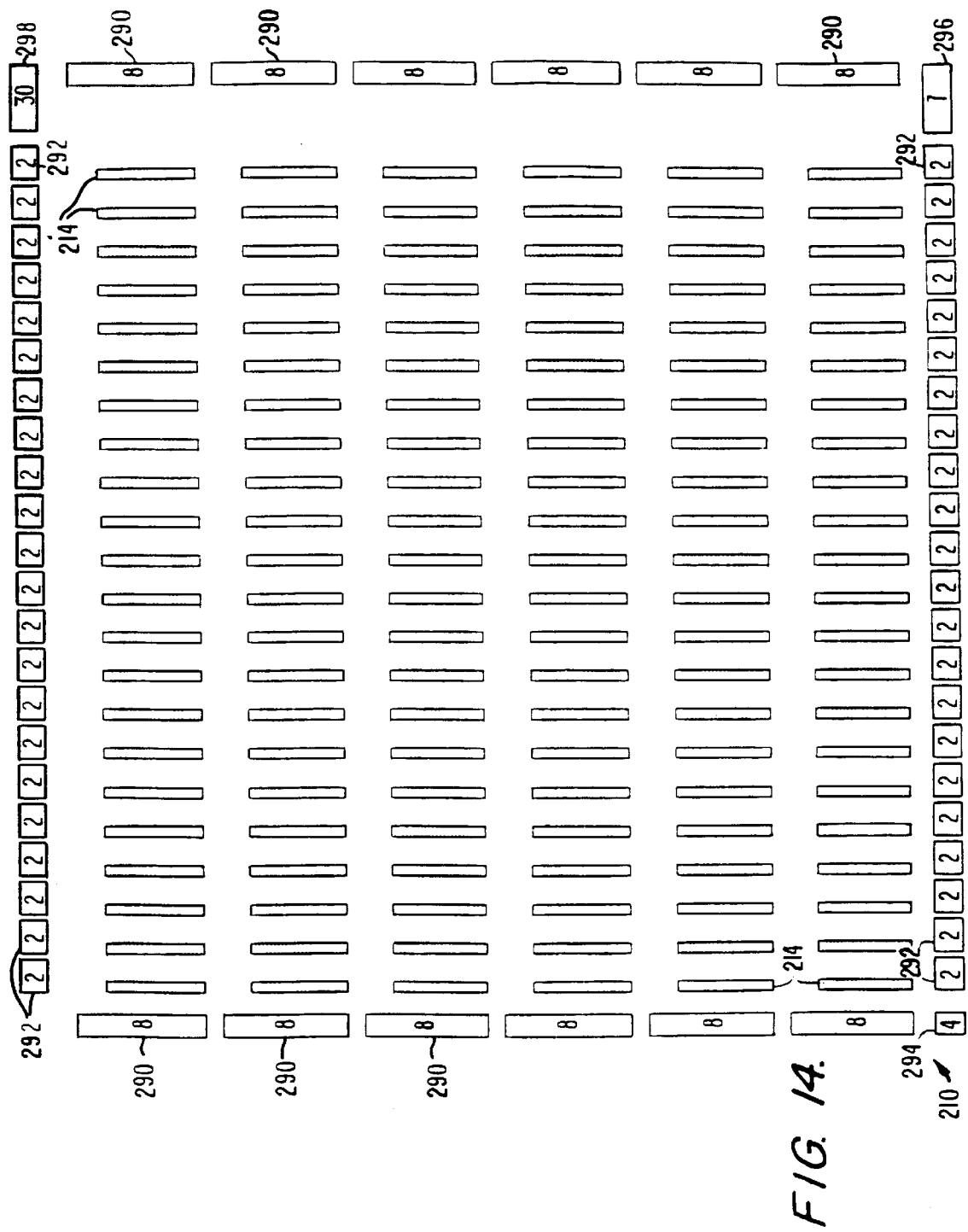
FIG. 14 is another view of the circuit of FIG. 10 showing an illustrative embodiment of additional elements of that circuit.

FIG. 14 shows how input/output pins may be provided on circuit 10. Six groups 290 of eight input/output pins are shown along each side of circuit 210. Twenty-two groups 292 of two input/output pins are shown along each of the top and bottom of the circuit. In addition, there are four fast input pins 294 respectively connected to fast conductors 230, seven control pins 296 for use during programming of device 210, and approximately thirty supply pins 298 for supplying power and ground potential to device 210.

Figure 15A:
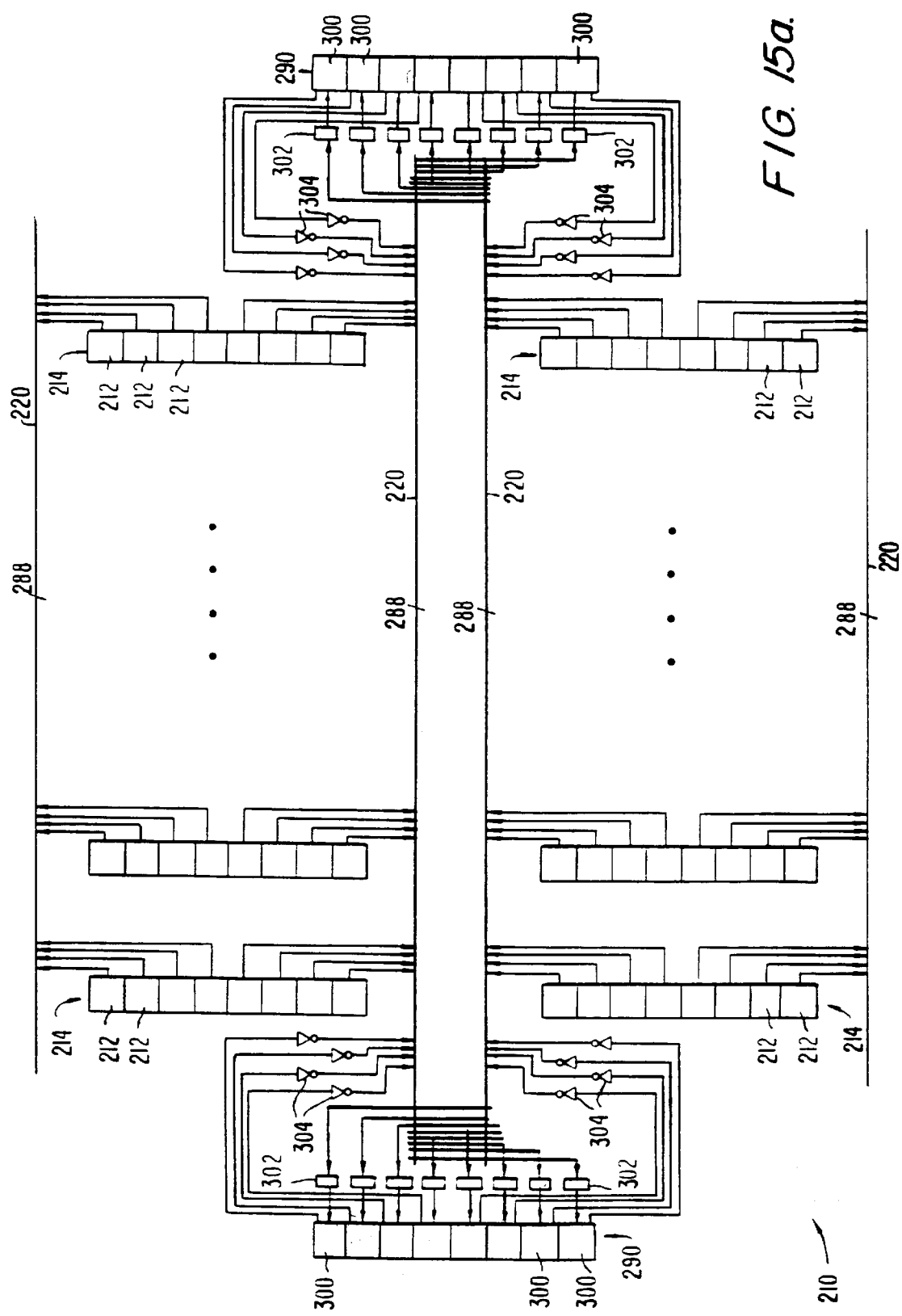
FIGS. 15A and 15B are schematic block diagrams showing an illustrative embodiment of representative portions of FIG. 14 in more detail.
Figure 15B:
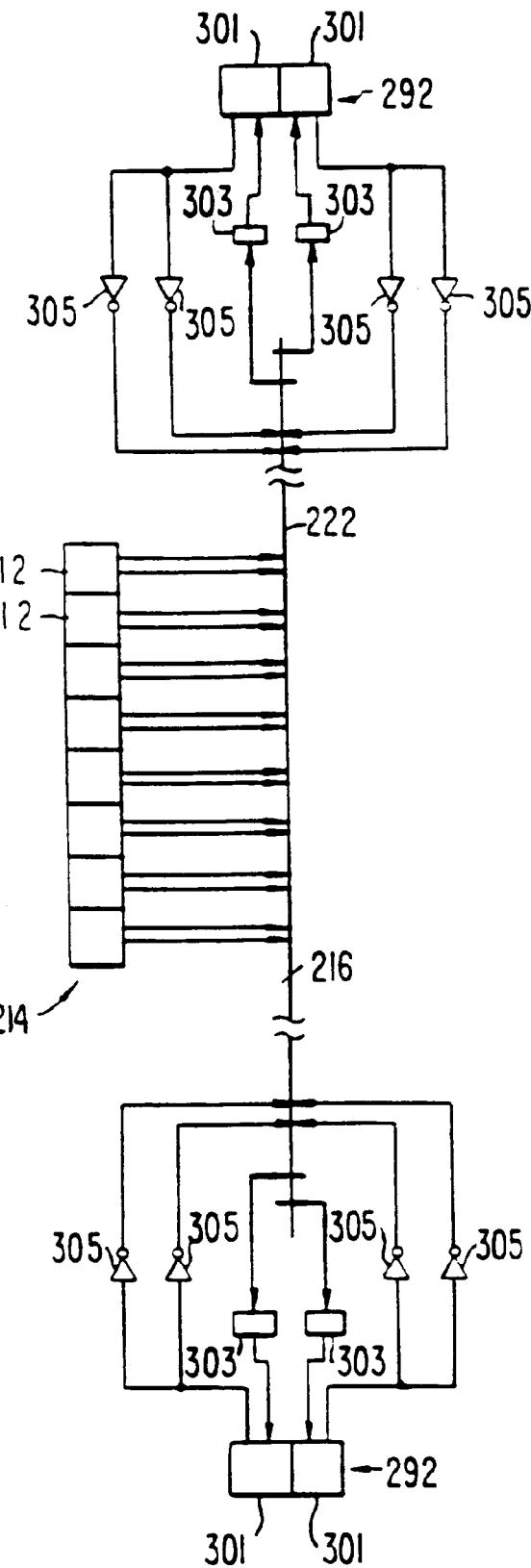

Although other arrangements for connecting the conductors on device 210 to its input/output pins are possible, FIGS. 15A and 15B show parts of an illustrative embodiment of such an arrangement. In FIG. 15A the one hundred seventy six global horizontal conductors 220 associated with each horizontal row of LABs 214 are arranged so that half can receive the outputs of the drivers 260 (FIG. 11) associated with the top four logic modules 212 in each LAB in that row, while the other half of these conductors 220 can receive the outputs of the drivers 260 associated with the lower four logic modules 212 in each LAB in that row. Accordingly, in FIG. 15A each group of one hundred seventy six global horizontal conductors 220 is shown divided into two subgroups of 288 such conductors, one subgroup being above the associated row of LABs 214, and the other subgroup being below that row of LABs. Each input/output pin 300 in each group 290 of such pins can receive an output via a PLC 302 from the conductors 220 in two subgroups of 288 such conductors. (Again, PLCs 302 can have any of the characteristics described above for the general case of PLCs 250, and PLCs 302 are controlled by programmable FCEs similar to those described above.) One of these two subgroups of conductors is associated with the lower logic modules 212 in one row of LABs 214, while the other subgroup of conductors is associated with the upper logic modules 212 in the LAB row immediately below the first row.

For use as an input pin, each pin 300 is connected through two tri-state drivers to two of conductors 220. Thus each symbol 304 in FIG. 15A represents two tri-state drivers, each of which is programmably controlled (e.g., by an FCE similar to those described above).

In FIG. 15B the sixteen global vertical conductors 222 associated with each vertical row of LABs 214 are split into two groups of eight conductors at the top and bottom of the device. Each group of eight conductors is applied to a respective one of PLCs 303 (similar to the above-described PLCS). Each PLC 303 applies one (or more) of the signals applied to it to an associated input/output pin 301. For use as an input pin, each pin 301 is connected through two programmable tri-state drivers 305 to two of conductors 222.

Figure 16A:
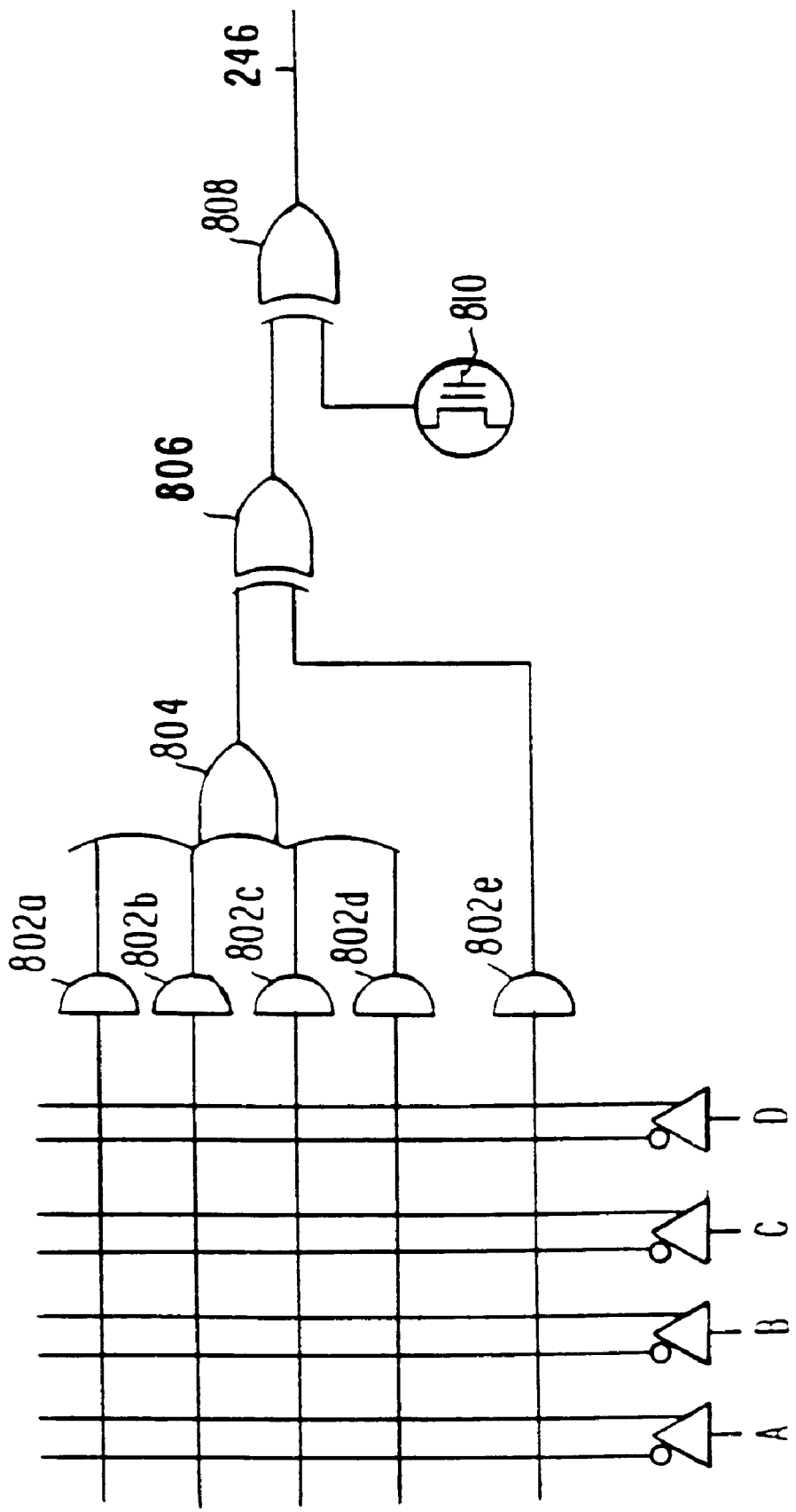
FIGS. 16A through 16C are schematic diagrams showing illustrative alternative embodiments of portions of the circuitry shown in FIG. 12.

As mentioned above, logic modules 212 can be implemented in other ways. For example, the portion of each logic module 212 which is described above as a look up table 240 can alternatively be implemented as sum-of-products logic of the type shown in FIG. 16A. The particular logic shown in FIG. 16A is of the well known "programmable AND, fixed OR" type. In this logic the true or complement of any of inputs A–D (which correspond to signals A–D in FIG. 12) is programmably connectable to each of AND gates 802a–e. Accordingly, each of these AND gates produces the logical "product" of the inputs connected to it. These products are sometimes referred to as "product terms" or "pterms". The outputs of AND gates 802a–d are all applied to OR gate 804. The output signal of OR gate 804 is therefore the logical "sum" of the applied pterms. The output of OR gate 804 is applied to EXCLUSIVE OR gate 806. The other input to gate 806 is pterm 802e. Accordingly, pterm 802e can be used (in conjunction with gate 806) to selectively invert or otherwise gate the sum-of-products output of OR gate 804. The output of gate 806 is applied to EXCLUSIVE OR gate 808. The other input to gate 808 is the output signal of programmable FCE 810 (similar to the other FCEs described above). Accordingly, FCE 810 can be used (in conjunction with gate 808) to selectively invert the output of gate 806.

The output of gate 808 can be applied, inter alia, to the data input of the register 242 of the logic module.

Another example of a possible alternative construction of logic modules 212 is shown in Pedersen U.S. Pat. No. 5,121,006, which is hereby incorporated by reference. The macrocell structure 100 shown and described in that patent can be readily employed as the logic module 212 in the programmable logic array structures of this invention.

Figure 16C:
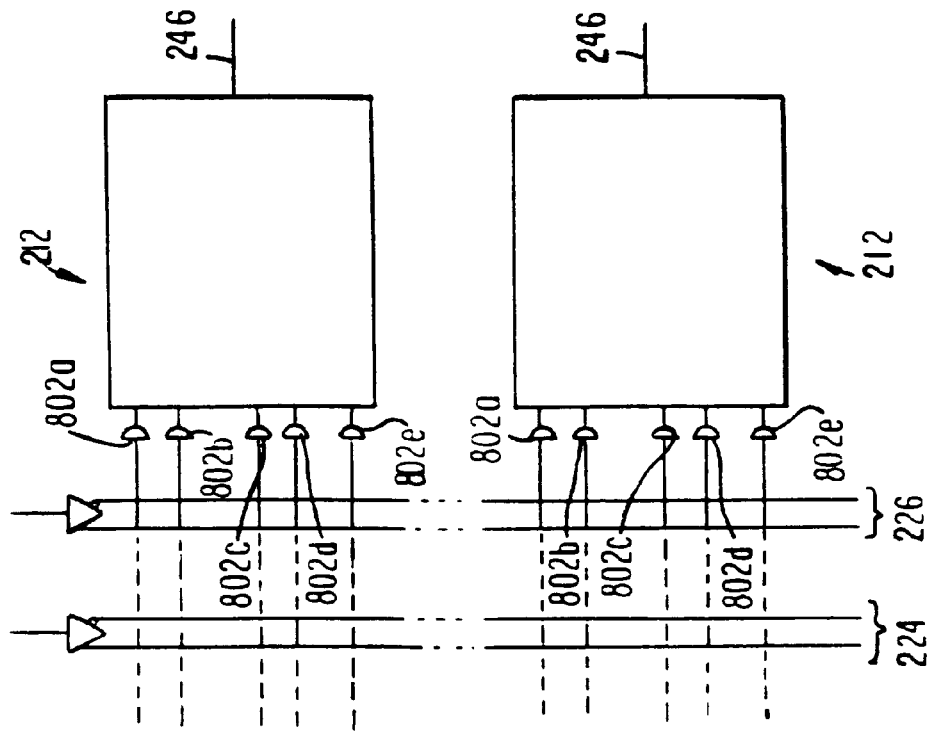
Figure 16B:
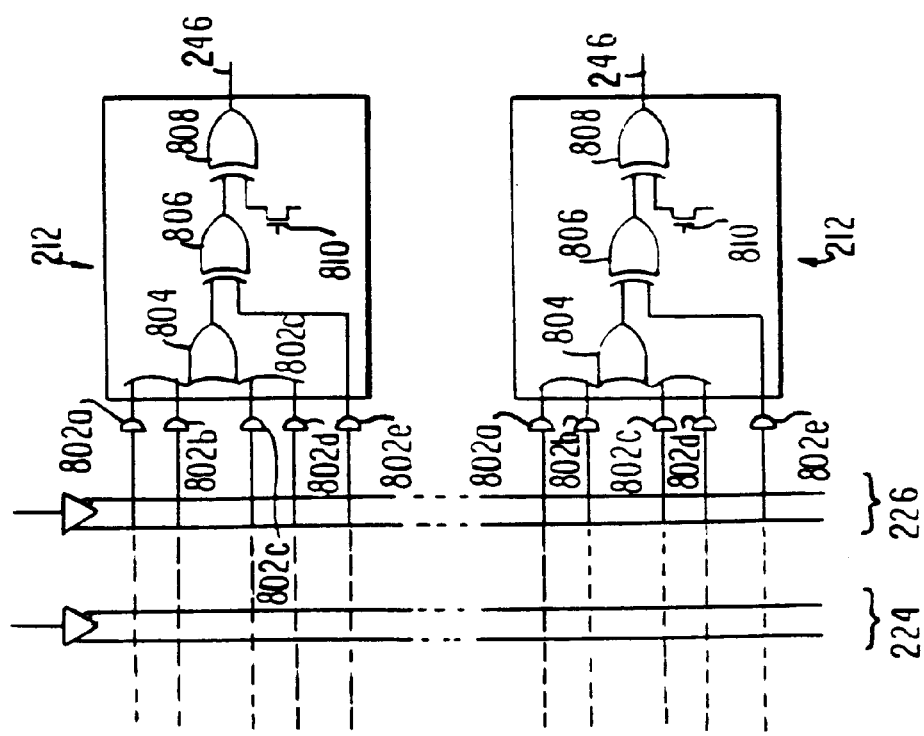

Still other examples of possible logic module construction are shown in FIGS. 16B and 16C. In FIG. 16B each conductor 224 and 226 (corresponding to conductors 224 and 226 in FIG. 11) is present in both the true and complement form. Pterms are formed in programmable connections between these conductors and the inputs to AND gates 802a–e. The remainder of each FIG. 16B logic module may then be similar to the corresponding portion of the circuitry shown in FIG. 16A.

In the further alternative shown in FIG. 16C, the circuitry outside the rectangular boxes may be identical to the corresponding portion of FIG. 16B. The circuitry represented by each rectangular box in FIG. 16C may be the macrocell structure 100 shown in above-mentioned Pedersen U.S. Pat. No. 5,121,006.

Figure 17:
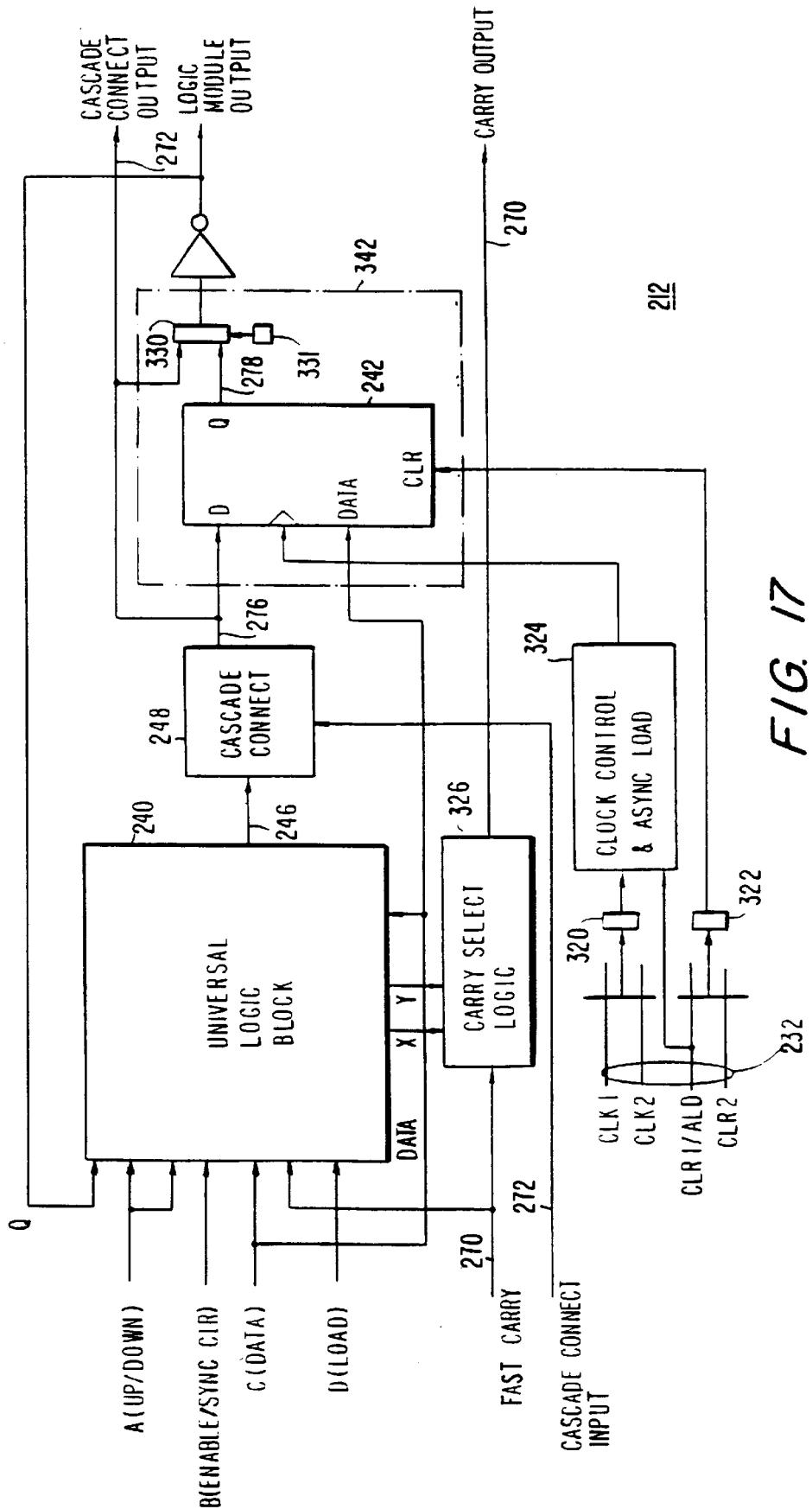
FIG. 17 is another more detailed schematic block diagram of an illustrative embodiment of a representative portion of FIG. 11.

FIG. 17 is another depiction of an illustrative logic module 212 in accordance with this invention. Certain features shown in FIG. 17—especially those related to the implementation of fast carry logic and the use of logic modules of this type in adders and counters—are shown in even more detail in above-mentioned Cliff et al. U.S. Pat. No. 5,274,581. For example, that Cliff et al. patent explains that input C is applied to flip-flop 242 as data (in addition to being applied to universal logic block 240) to facilitate loading data into the flip-flop when logic module 212 is to be used as one stage of a loadable counter. Cascade connect input 272 is applied as one input to logic element 248 (typically an AND gate as described above in connection with FIG. 12). The desired signals on clock and clear lines 232 are selected by programmable (i.e., FCE-controlled) PLCs 320 and 322. The output of PLC 322 is applied to the clear input terminal of flip-flop 242. The output of PLC 320 and one of signals 232 are applied to clock control and asynchronous load control logic 324 to produce a signal applied to the clock input terminal of flip-flop 242. This signal controls the clocking of flip-flop 242, as well as the asynchronous loading of that flip-flop (e.g., when loading the starting value into a loadable counter).

The main data output 246 of universal logic block 240 is the other input to logic element 248. The output of element 248 is the D input to flip-flop 242 (for registered output from logic module 212). The output of element 248 can also bypass flip-flop 242 via programmable (i.e., FCE controlled) switch 330 (for unregistered output from the logic module). FCE 331 controls switch 330. Finally, the output of element 248 is also the cascade connect output 272 from this logic module to the next logic module 212 in the cascade connect chain.

Universal logic block 240 in FIG. 17 is equipped as shown in above-mentioned Cliff et al. U.S. Pat. No. 5,274,581 to provide as outputs X and Y the logical NOR and logical NAND of two inputs to block 240. As is also shown in the last-mentioned Cliff et al. patent, carry select logic 326 inverts X and Y, and then uses fast carry input 270 to select the appropriate one of the inverted signals as the fast carry output 270 to be applied to the next logic module 212 in the fast carry chain.

As mentioned above, FIG. 18 shows a typical tri-state driver 350 such as can be used for drivers 256 and 260 in FIG. 11. (Of course, any other suitable tri-state driver can be used instead if desired.) Data is applied to input terminal TRIIN, and a driver-enabling signal is applied to terminal RSELTRI (e.g., from a programmable RAM cell). If driver 350 is enabled by the latter signal, the input data is passed to output terminal TRIOUT. Driver 350 has three stages. The first stage includes P-channel transistors MP0 and MP1 and N-channel transistor MN0 connected in series between VCC (logical 1) and ground (logical 0). The TRIIN terminal is connected to the gates of MP0 and MN0. The inverted RSELTRI signal is applied to the gate of MP1. The second stage includes P-channel transistor MP2 and N-channel transistors MN1 and MN2 connected in series between VCC and ground. The RSELTRI signal is applied to the gates of MP2 and MN1. The signal between MP0 and MP1 is applied between MP2 and MN1, as well as to the gate of third stage P-channel transistor MP3. The signal between MP1 and MN0 is applied between MN1 and MN2, as well as to the gate of third stage N-channel transistor MN3. MP3 and MN3 are connected in series between VCC and ground. The node between MP3 and MN3 is TRIOUT.

Although the use of tri-state drivers is preferred for elements such as 256 and 260 in FIG. 11, in some embodiments of the invention it may be possible to employ simple buffers instead.

Figure 19:
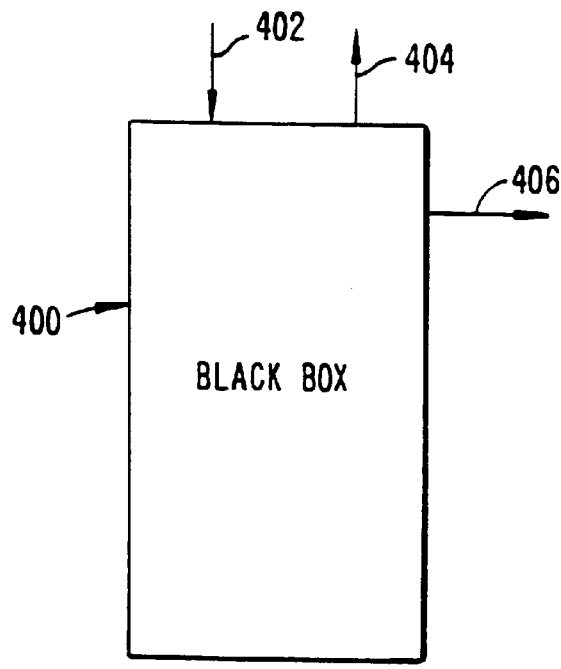
FIG. 19 illustrates a block diagram of typical logic array blocks used in the programmable logic device of the present invention.

Implementation of typical LABs used in the programmable logic device of the present invention is not limited to what has been discussed above with respect to LABs 14 and 214 of FIGS. 1 and 10, respectively. A typical LAB can be represented by a box 400 having inputs 402 and outputs 404 and 406, as shown in FIG. 19. Box 400 represents a logic circuit, such as those discussed above with respect to LABs 14 and 214, capable of performing one or more functions. Furthermore, the typical LAB is capable of being programmably connected to the global interconnect network of any programmable logic device, such as those described in the present invention. The global interconnect structure of the present invention has been described above with reference to FIGS. 2 and 11.

Figure 20:
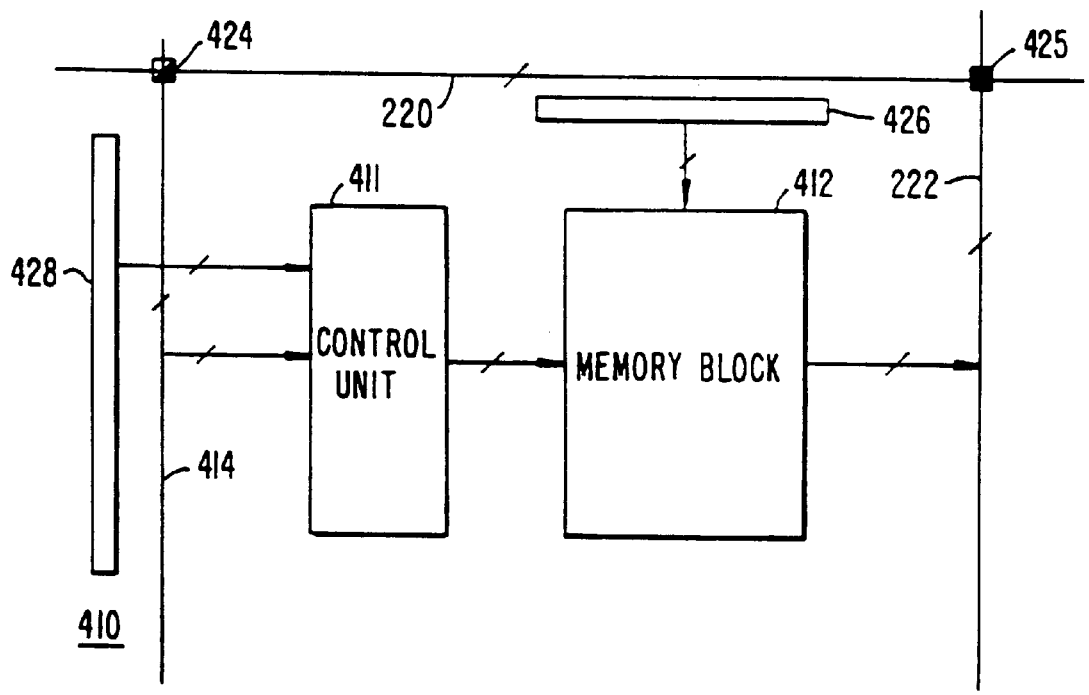
FIG. 20 illustrates a block diagram of a RAM-LAB according to the present invention.

FIG. 20 illustrates a block diagram of another implementation of a typical LAB depicted by box 400. FIG. 20 shows a RAM-LAB 410 which provides a user with a block of memory that can be utilized as Random Access Memory ("RAM") or Read Only Memory ("ROM"). RAM-LAB 410 includes a control unit 411 and a memory unit 412. Control unit 411 receives data and address information from the user and passes them to memory unit 412. Control unit 411 also generates the necessary control signals to control the transfer of data to and from memory unit 412. RAM-LAB 410 can be directly accessed by the user during user controlled operations, or it can be accessed by the programming software. The programming software, such as the ALTERA MAX™ programming software, is used to initialize and program a programmable logic device. The programming software is provided by the manufacturer of the programming logic device.

FIG. 20 also shows intra-LAB conductors 414, Global Horizontal ("GH") conductors 220, and Global Vertical ("GV") conductors 222, which are used by the designer to access RAM-LAB 410. Intra-LAB conductors 414 are programmably connected to control unit 411 and provide a path for inputting the user data, address, and control information to RAM-LAB 410. Intra-Lab conductors 414 are also programmably connected to GH conductors 220. This connection is shown by partially solid box 424, which indicates that only a selected number of GH conductors 220 can be connected to each intra-LAB conductor 414. The output of RAM-LAB 410 is programmably connected to GV conductors 222. GV conductors 222 are the same vertical global conductors as shown in FIG. 11, and are programmably connected to GH conductors 220 to provide for inter-LAB communications. The connection between GH conductors 220 and GV conductors 222 is shown by a solid box 425, which indicates that each GV conductor 222 is connected to at least one GH conductor 220.

Finally, FIG. 20 shows data programming register 426 and address programming register 428. These registers are used by the programming software during the FIFO programming of RAM-LAB 410. Data register 426 is used to send data to RAM-LAB 410 and address programming register 428 is used to send address information to RAM-LAB 410. Data and address programming registers 426 and 428 are shared by all RAM-LABs 410 in a typical row of RAM-LABs.

FIG. 21 illustrates a preferred embodiment of RAM-LAB 410 in FIG. 20. In this embodiment, registers 430, 438, and 442, data-in buffer 432, address encode 434, address decode 436, address control 440, read/write control 444, CLK/OE control 446, and register 459 form control unit 411 of FIG. 20. RAM block 447, interface blocks 448, 450 and 452, and RAM register 454 form memory unit 412 of FIG. 20. The RAM-LAB 410 of FIG. 21 can be accessed by the user or the programming software. The prog.mode control signal carried by signal line 469 (hereinafter prog.mode 469) determines whether RAM-LAB 410 is being accessed by the user or the programming software. Prog.mode 469 can be set by the user or by the programming software.

Each register 430, 438 and 442 includes latches (not shown), one 2 to 1 multiplexer corresponding to each latch (not shown), and a clock input which is connected to CLK signal 478. The clock input to each register is used to clock the data at the input of the latches. The input of the latches in registers 430, 438, and 442 are connected to intra-LAB conductors 414 via PLCs 462(a)–462(c), respectively. The output of each latch in a particular register is connected to one of the two inputs of the corresponding 2 to 1 multiplexer. The other input of the above multiplexer is connected to the input of the respective corresponding latch. Therefore, if it is desired to operate registers 430, 438, and 442 as clock registers, the first input of each multiplexer is selected to be connected to its output. On the other hand, if it is desired to operate registers 430, 438, and 442 as bypass registers, the second input of each multiplexer is selected to be connected to its output. The output of the 2 to 1 multiplexers are the outputs of the registers. In the embodiment of FIG. 21, register 430 includes eight latches and eight 2 to 1 multiplexers, register 438 includes six latches and six 2 to 1 multiplexers, and register 438 includes six latches and six 2 to 1 multiplexers.

The user data is inputted in RAM-LAB 410 via register 430. Register 430 receives the eight-bit user data and provides them to the inputs of data-in buffer 432. Data-in buffer 432 includes electronic buffers (not shown) which allow it to receive and transfer the data information to top interface 448. The user address information is inputted in RAM-LAB 410 via register 438. Register 438 receives six bits of user address information and transfers them to address control 440. Address control 440 also receives another six bits of address information from address encode 434. Address encode 434 includes encoders (not shown) which encode the sixty four bits of FIFO addressing information it receives from address programming register 428 (in FIG. 20) via address lines 466 and generate six outputs. The encoded FIFO address information is passed to address control 440 via signal lines 468. Address control 440 includes multiplexers (not shown) which are controlled by prog.mode 469. Depending on the status of prog.mode 469, these multiplexers connect the user address information or the FIFO address information to the outputs of address control 440. Address control 440 generates six outputs, five of which are received by address decode 436. Address decode 436 includes decoders (not shown) which convert five bits of address information into thirty-two bits of address information. The generated address bits are sent to side interface 450 via signal lines 480. The sixth output of address control 440 is used as a control signal, the function of which will be described later.

The control information supplied by the user are inputted in RAM-LAB 410 via register 442. Register 442 receives six bits of information, which are denoted as the five most significant address bits and write enable in FIG. 21. The five most significant address bits are passed to top interface 448. Top interface 448 decodes these five bits and generates thirty-two address bits, the function of which will be described below. The sixth output of register 442 is connected to read/write control 444. Read/write control 444 also receives, as its input, the most significant address bits generated by the programming software during FIFO programming. Read/write control includes decoding logic circuits which are controlled by prog.mode 469, and a configuration bit (not shown). Depending on the status of prog.mode 469, the decoding logic circuits generate the read enable ("RE") 473 and write enable ("WE") 474 signals. After configuration, the default states for RE 473 and WE 474 are active and inactive, respectively. Depending on the status of RE 473 and WE 474, the address information at the inputs of side interface 450 is used to read from or write into RAM block 447.

As mentioned above, the clock inputs of registers 430, 438, and 442 are triggered by CLK signal 478. This signal is generated by CLK/OE control 446. CLK/OE control 446 includes multiplexers (not shown) and further generates an output enable ("OE") 477. OE 477 is latched in register 459 and is used to enable tri-state buffers 456. CLK/OE control 446 receives four inputs; two are received via PLCs 462(*d*) and the other two are received via PLC 463. PLC 463 programmably connects any two of universal fast conductors 230 to CLK/OE control 446. Inputs from universal fast conductors 230 enable the user to directly control the outputs of tri-state buffers 456. This is achieved by commanding CLK/OE control 446 to use the inputs received via PLC 463 to generate OE 477.

In the embodiment of FIG. 21, RAM block 447 is partitioned into thirty-two columns of memory, each of which provides 64×1 bits of memory (not shown). Each memory column can be independently addressed and used to form groups of one, two, four, and eight memory columns. The data to be written into RAM block 447 is presented to its data inputs by top interface 448. The address of each memory column is generated by top interface 448, whereas the address of each memory bit in a memory column is provided by side interface 450. The output of RAM block 447 is connected to GH conductors 220 and GV conductors 222 via bottom interface 452, RAM register 454, PLCs 458, and buffers 456 and 460.

Top, side, and bottom interfaces 448, 450, and 452, respectively, include multiplexers and decoders (not shown). As mentioned above, user data received by data-in buffer 432 is transferred to top interface 448. Top interface 448 also receives the FIFO data from data programming register 426 (FIG. 20) via data lines 479. Depending on the status of prog.mode 469, top interface 448 connects either of the two sets of data to its data outputs. Top interface 448 further includes nine control inputs, the first four of which are connected to control signals 475. The next control input is connected to prog.mode 469. The last five control inputs are connected to the five most significant address bits out of register 442, via signal lines 472. Top interface 448 also includes thirty-two column address outputs and thirty-two data outputs. The column address outputs are used to independently address each of the above-mentioned thirty-two columns of memory.

The above nine control bits control the operation of top interface 448. The five most significant address bits are decoded by top interface 448 to generate thirty-two column addresses, each of which addresses one memory column (not shown). The four control signals 475 are used to determine whether the memory columns in RAM block 447 are being grouped in groups of one, two, four or eight memory columns. For example, the information on these four lines can determine that RAM block 447 is being utilized as thirty-two separate columns of 64×1 memory. The last control inputs, i.e. prog.mode 469, determines whether the user generated data or the FIFO data is to be passed to the data outputs of top interface 448. During user operation, the eight-bit user data appears on eight of the thirty-two data outputs of top interface 448. The control RAMs in bottom interface 452 are used to determine which eight output terminals are connected to the user data.

As mentioned above, side interface 450 receives the thirty-two address bits generated by address decode 436. Side interface 450 includes de-multiplexers (not shown) which generate sixty-four address bits out of the received thirty-two address bits. These sixty-four address bits are shared by all thirty-two memory columns. Side interface register 450 also receives RE 473 and WE 474. These two signals are complementary and determine whether the address information at the output of side interface 450 is to be used to read from or write into RAM block 447.

During a read cycle, the output of each memory column is available at a respective input of bottom interface 452. For example, the output of the first memory column is connected to the first input of bottom interface 452, the output of the second memory column is connected to the second input of bottom interface 452, and etc. As mentioned above, the information on control signal lines 475 determines the mode in which the RAM block is being utilized. Thus, depending on the control information on lines 475, groups of one, two, four, or eight-bit information is provided at the data outputs of bottom interface 452. Bottom interface 452 also includes thirty-two FIFO outputs 482 which are used during the FIFO programming of RAM block 447. During the FIFO programming, the data received from data programming register 426 (FIG. 20) is passed to the next RAM-LAB 410 via FIFO outputs 482.

The information at the output of bottom interface 452 is provided to the inputs of RAM register 454. This information is latched in RAM register 454 using the register CLK signal 478. Once the information is latched in, it appears at the output of RAM register 454. This information can now be passed to other RAM-LABs 410 or the output terminals via GH and GV conductors 220 and 222. Each output of RAM register 454 is connected to two GV conductors 222 via two tri-state buffers 456. As mentioned above, the output of each tri-state buffer is controlled by the output of register 459.

The outputs of RAM register 454 are also programmably connected to GH conductor 220 via PLC 458 and tri-state buffer 460. In the embodiment of FIG. 21, each output of RAM register 454 is connected to two GH conductors 220. Each PLC 458 has two inputs, one of which is connected to one output of RAM register 454 and the second one is connected to GV conductor 222. In the embodiment of FIG. 21, there are sixteen PLCs 458 and sixteen tri-state buffers 460.

In addition, FIG. 21 shows portions of representative GH conductors 220, GV conductors 222, intra-LAB conductors 414, and universal fast conductors 230. Each of intra-LAB conductors 414 can be connected to a selected one (or more) of conductors 220 and 230 via a PLC 464 (only some of which are shown in FIG. 21). As explained above with respect to PLCs 250, PLCs 464 can be implemented in any of a wide variety of ways. For example, each can be a relatively simple programmable connector such as a plurality of switches for connecting any one of several inputs to an output. Alternatively, each can be a somewhat more complex element which is capable of performing logic (e.g., by logically combining several of its inputs) as well as making a connection. In the latter case, for example, each PLC 464 can be a product term logic implementing function such as AND, NAND, OR, or NOR. PLCs 458, 462, and 463 can be implemented similar to PLCs 464. As described above, with reference to FIGS. 14–15B, global conductors 220 are connected to the input/output pads 290–298 (FIG. 14). Accordingly, the output of each RAM-LAB 410 can be provided to outside via input/output pads 290–298 as shown in FIGS. 15A and 15B.

Examples of components suitable for implementing PLCs 458 and 462–464 are EPROMs, EEPROMs, pass transistors, transmission gates, antifuses, laser fuses, metal optional links, etc. The components of PLCs 458 and 462–464 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable). In the embodiment of FIG. 21, each PLC 458, 462–464 is controlled by an FCE, not shown in FIG. 21, to connect one of its inputs to its output.

As explained before with respect to FCEs 251, FCEs controlling PLCs 458 and 462–464 (not shown) can also be implemented in any of several different ways. For example, they can be SRAMs, DRAMs, first-in first-out ("FIFO") memories, EPROMs, EEPROMS, function control registers (e.g., as in Wahlstrom U.S. Pat. No. 3,473,160), ferroelectric memories, fuses, antifuses, or the like.

Figures 22A, 22B:
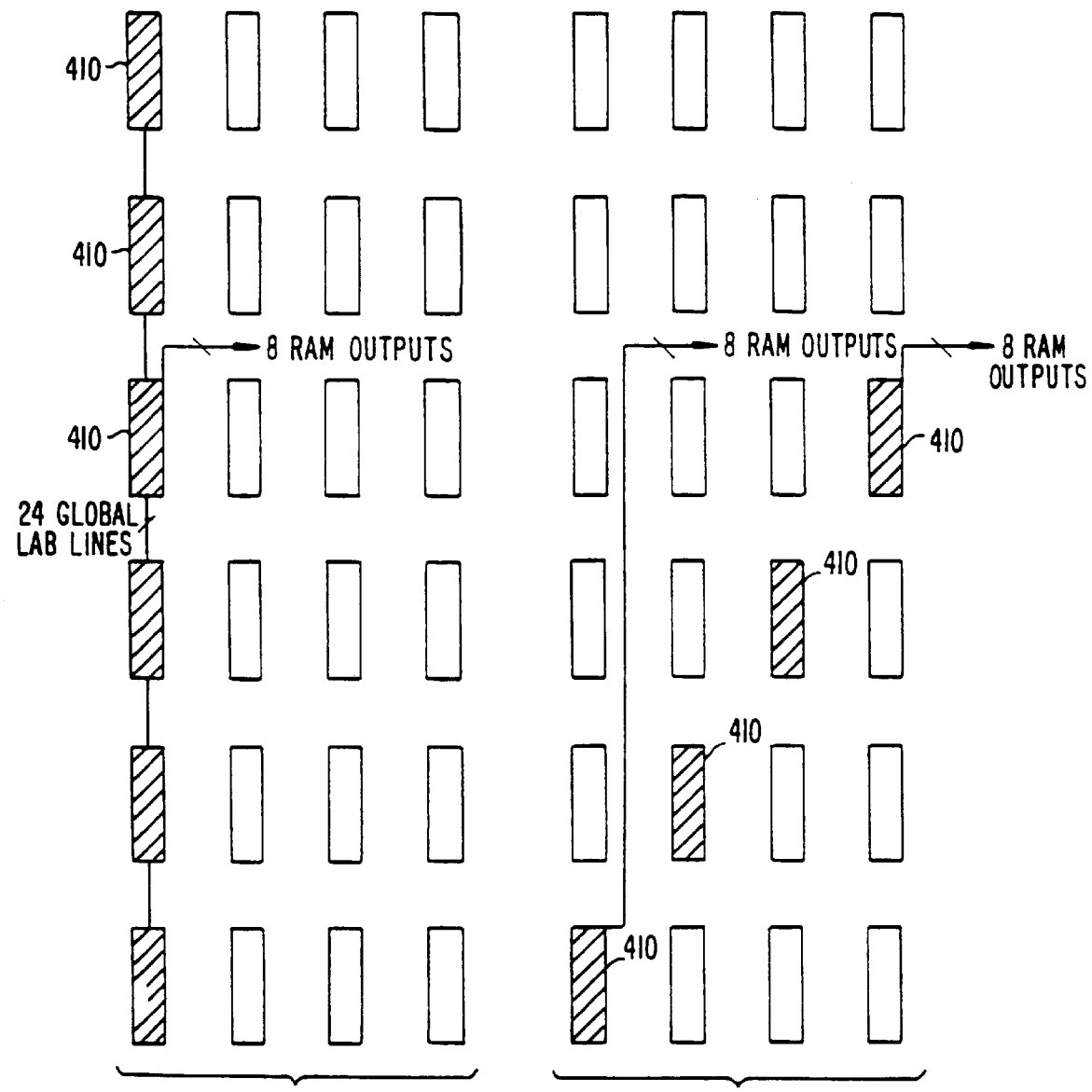
FIGS. 22A and 22B illustrate two alternatives of stacking the RAM-LABs of FIG. 21 to build memory blocks.

The memory capacity of RAM-LABs 410 of FIG. 20 can be utilized to create larger memory blocks by grouping more than one RAM-LAB as shown in FIGS. 22A and 22B. FIGS. 22A and 22B illustrate alternative methods of creating larger memory blocks. FIG. 22A illustrates the preferred method of creating a large memory block, in which RAM-LABs 410 are stacked in a column. This method allows for cascading RAM-LABs to generate deep and wide memory blocks, such as those shown in FIGS. 23A and 23B. FIG. 22B illustrates another method of constructing a block of memory, in which RAM-LABs 410 are staggered in different columns. The memory block of FIG. 22A is easier to access since all RAM-LABs are stacked in one column. Having all RAM-LABs in one column allows for accessing RAM-LAB 410 using the GV conductors parallel to the column; whereas, in the memory of FIG. 22B, a combination of GV and GH conductors parallel to different columns and rows must be utilized to access the individual RAM-LABs 410.

Figure 23A:
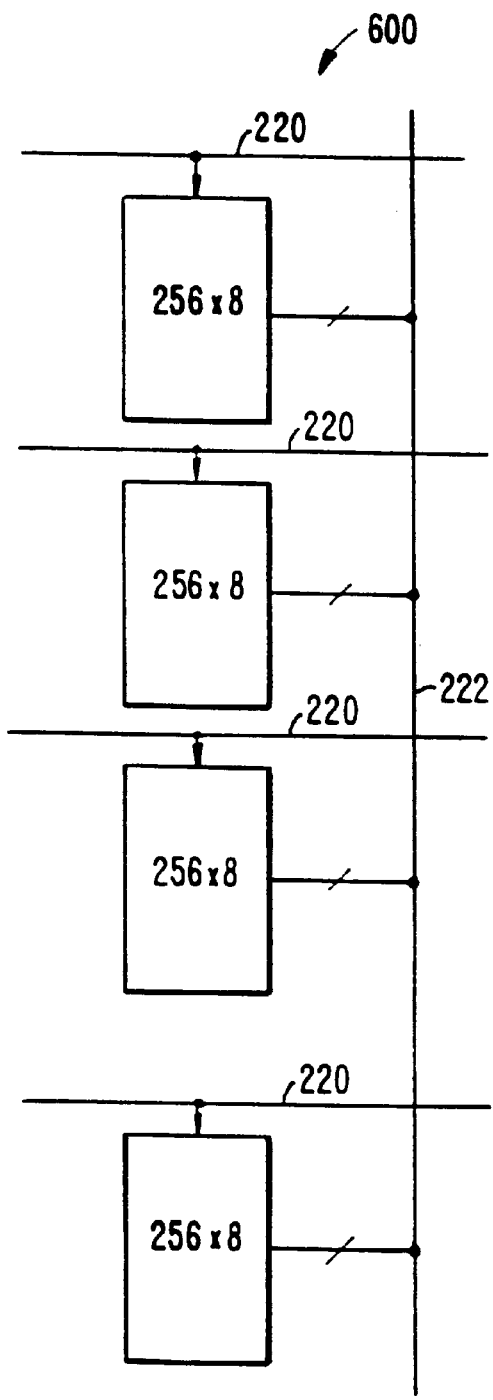
FIGS. 23A and 23B illustrate examples of constructing a deep memory block and a wide memory block, respectively, using the RAM-LABs of FIG. 21.

FIG. 23A shows a typical example of a wide memory block 600 using RAM-LABs 410 of FIG. 21 which are stacked as shown in FIG. 22A. The output of wide memory block 600 includes the outputs of each RAM-LAB 410. For example, if each RAM-LAB 410 generates eight output bits and four RAM-LABs 410 are used to build memory 600, memory 600 has thirty-two output bits. In the example of FIG. 23A, each RAM-LAB 410 provides 256×8 bits of memory, resulting in a total of 256×32 bits of memory in memory 600. To access a location in memory block 600, the address of that location is placed on GH conductors 220. This address information is provided to all RAM-LABs 410. Each RAM-LAB 410 places eight bits of data which represents the data stored in the addressed location of that particular RAM-LAB 410. Depending on the configuration of the memory block, the output of the first RAM-LAB 410 can be the eight least or most significant bits of the output of memory 600. Similarly, the output of the next RAM-LAB 410 can be the next eight least or most significate bits of the output of memory 600.

Figure 23B:
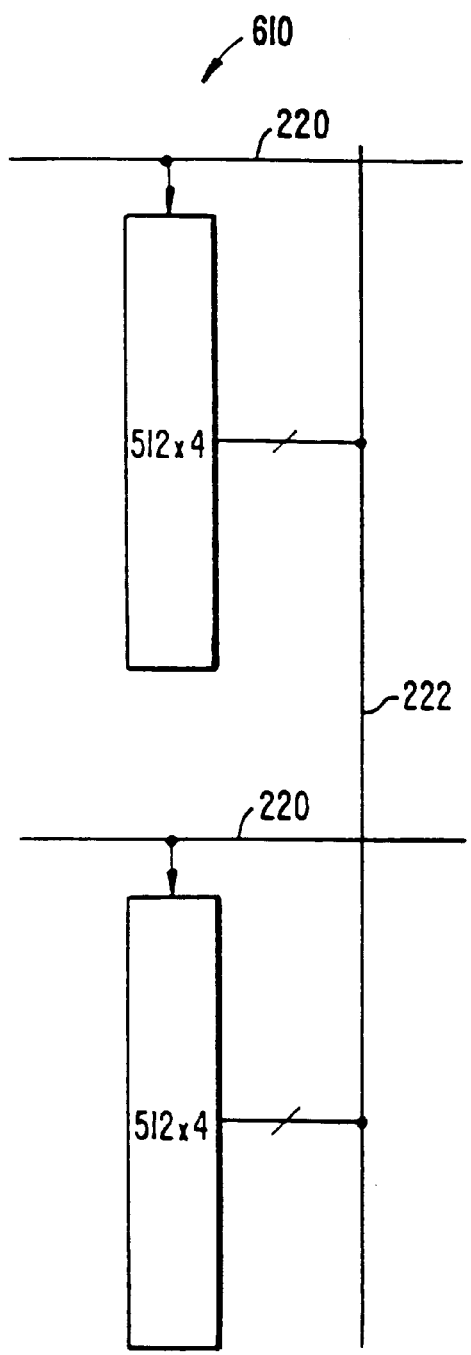

FIG. 23B illustrates an example of a typical deep memory block 610 using RAM-LAB 410 of FIG. 21. As mentioned before, RAM block 447 of each RAM-LAB 410 is partitioned into thirty-two columns of 64×1 memory. These columns of memory can be grouped together to construct a 256×8, 512×4, 1024×2, and 2048×1 memory. For example, to construct a 512×4 memory, the user sets control lines 475 to indicate a mode of operation in which RAM block 447 is partitioned into eight groups of memory, with each group having a distinct address. Each group has four columns of 64×1 memory and provides a total of 64×4 bits of memory. This scheme effectively creates a 512×4 memory block which includes eight smaller blocks of 64×4 memory bits. To address each smaller block, the information on signal lines 472 are set such that when decoded, they address one block at a time. For example, if the user wants to access a memory location in the third group, the address information on lines 472 must be set to select the third group. Once the third group is selected, the sixty-four address bits generated by side interface 450 can be used to access the memory location addressed by the address bits in the memory group.

Once the user configures RAM block 447 to achieve a memory block with a desired depth, RAM-LABs 410 can be stacked as explained with respect to wide memory 600 of FIG. 23A to achieve the desired memory width. For example, in FIG. 23B two 512×4 bits of memory are used to construct a 512×8 bit memory.

Figures 1, 24:
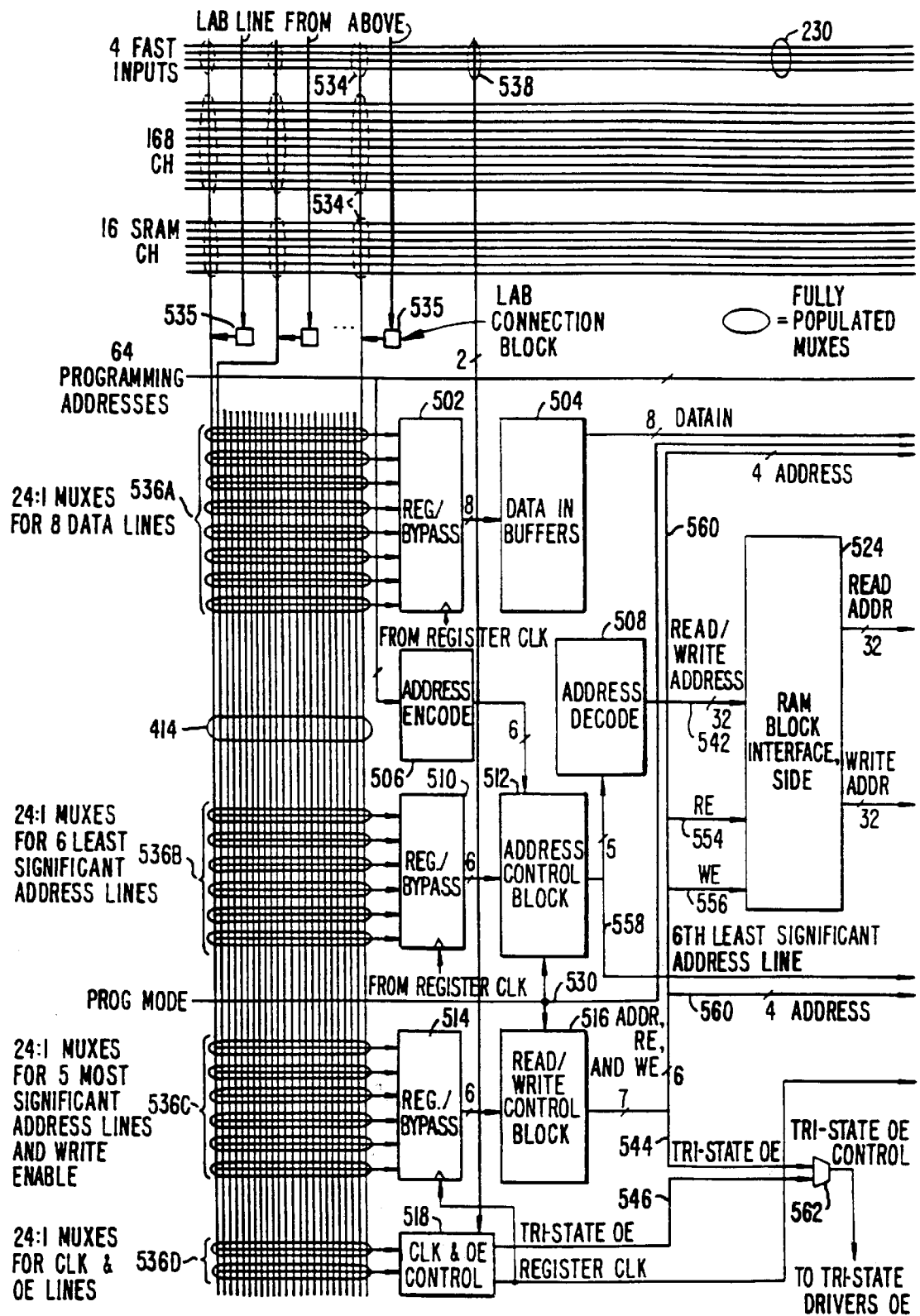
FIG. 24 is a second embodiment of the RAM-LAB in FIG. 20.
Figures 2, 24:
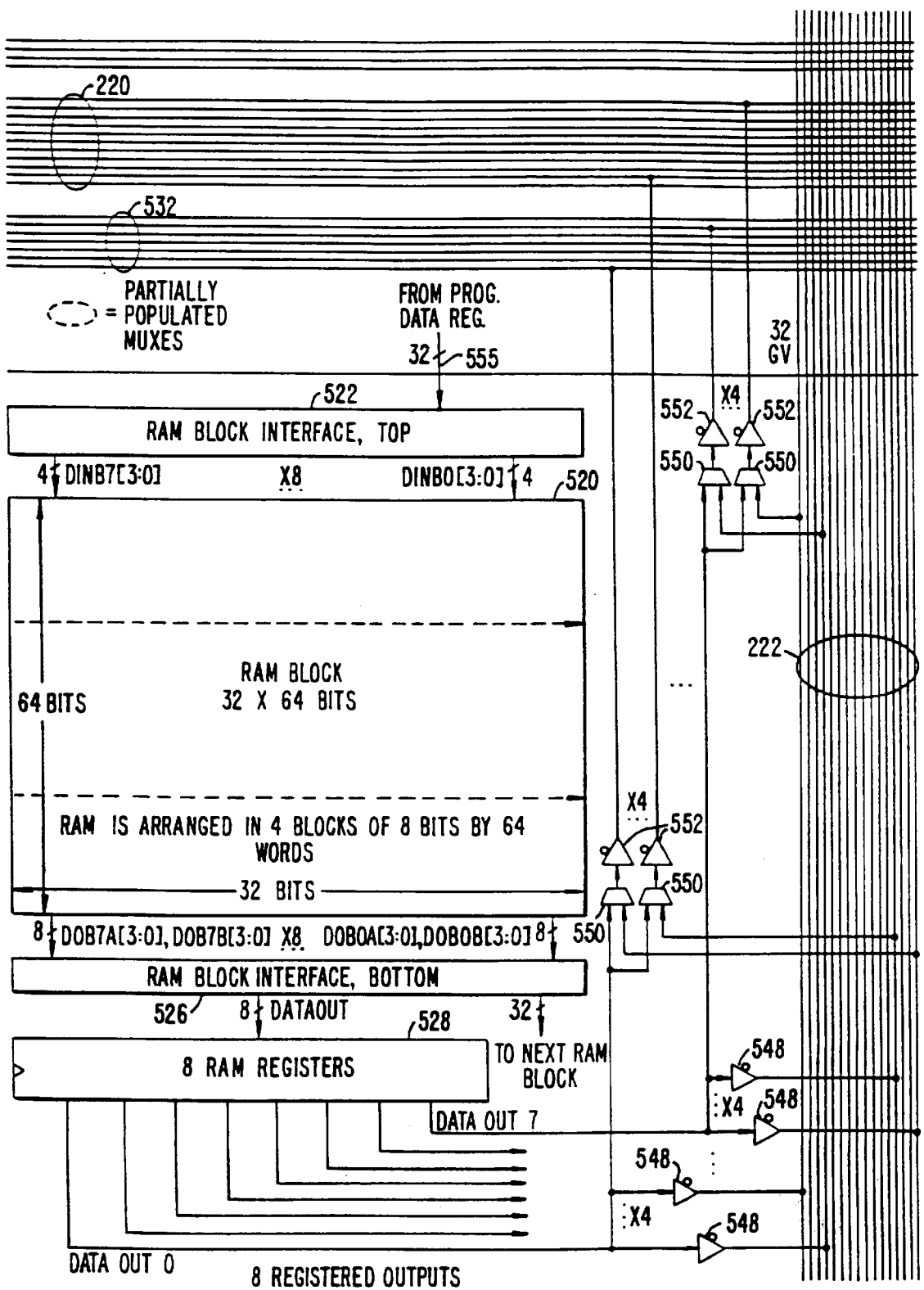

FIG. 24 illustrates a second embodiment of RAM-LAB 410 in FIG. 20. In this embodiment, registers 502, 510, 514, data-in buffer 504, address encode 506, address decode 508, address control 512, read/write control 516, and CLK/OE control 518 form control unit 411 of FIG. 20. RAM block 520, interface circuits 522–526 and RAM register 528 form memory unit 412 of FIG. 20. Similar to RAM-LAB 410 of FIG. 21, RAM-LAB 410 of FIG. 24 is also capable of being accessed by the user or the programming software. The prog.mode signal present on signal line 530 (hereinafter prog.mode 530) determines whether RAM-LAB 410 is being used by the user or the programming software. The prog.mode 530 control signal can be set by the user or the programming software.

In the embodiment of FIG. 24, the user information is provided to RAM-LAB 410 via GH conductors 220, SRAM GH conductors 532, universal fast conductors 230, intra-LAB conductors 414, and PLCs 534–538. The outputs of PLCs 536a, 536b, 536c, and 536d are connected to the inputs of registers 502, 510, 514, and CLK/OE control 518, respectively. Each register 502, 510, and 514 includes latches (not shown), one 2 to 1 multiplexer corresponding to each latch (not shown), and a clock input which is connected to CLK signal 540. The clock input to each register is used to clock the data at the input of the latches. The input of the latches in registers 502, 510 and 514 are connected to the outputs of PLCs 536(a)–536(c), respectively. The output of each latch in a particular register is connected to one of the two inputs of the corresponding 2 to 1 multiplexer. The other input of the above multiplexer is connected to the input of the respective corresponding latch. Therefore, if it is desired to operate registers 502, 510 and 514 as clock registers, the first input of each multiplexer is selected to be connected to its output. On the other hand, if it is desired to operate registers 502, 510, and 514 as bypass registers, the second input of each multiplexer is selected to be connected to its output. The output of the 2 to 1 multiplexers are the outputs of the registers. In the embodiment of FIG. 24, register 502 includes eight latches and eight 2 to 1 multiplexers, register 510 includes six latches and six 2 to 1 multiplexers, and register 514 includes six latches and six 2 to 1 multiplexers.

The user data information is transferred to the data-in-buffer 504 via register 502. Data-in buffer 504 includes electronic buffers (not shown) which allow it to receive and transfer the data information to top interface 522. The user address information is inputted in RAM-LAB 410 via register 510. Register 510 transfers the received user data information to address control 512. Address control 512 also receives six inputs from address encode 506. Address encode 506 includes encoders which encode the sixty-four bits of FIFO addressing information it receives from address programming register 428 (in FIG. 20) via address lines 566 and generate six outputs. Address control 512 includes multiplexers (not shown) which are controlled by prog.mode 469. Depending on the status of the prog.mode 530, these multiplexers connect the user address information or the FIFO address information to the outputs of address control 512. Address control 512 generates six outputs, five of which are received by address decode 508. Address decode 508 includes decoders (not shown) which connect the five bits of address information into thirty-two bits of address information. These address bits are sent to side interface 524 via address lines 542. The sixth output of address control 512 is used as a control signal, the function of which will be disclosed below.

Other control information which determines the operation of RAM-LAB 410 of FIG. 24 is generated by read/write control 516. Read/write control 516 receives the user supplied control information via register 514. Read/write control 516 includes decoding logic circuits and receives six inputs and generates seven outputs. Four of the seven outputs are used by top interface 522, the next two are used by side interface 524, and the last signal is used as an output enable signal 544. The operation of the above seven signals will be described below. Read/write control 516 also includes an identity bit (not shown) which is used to identify each RAM-LAB 410. This identity bit is utilized when RAM-LABs are grouped to construct deep memory blocks. A detailed approach to constructing deep memory blocks and the function of the identity bit will be disclosed with respect to FIG. 25A.

As mentioned above, the clock inputs of registers 502, 506 and 514 are triggered by Register CLK signal 540. This signal is generated by CLK/OE control 518. CLK/OE control 518 includes multiplexers and further generates a tri-state output enable ("OE") 546 which is used as one of the two output enable signals that control the outputs of tri-state buffers 548. CLK/OE control 518 includes four inputs. The first two inputs are connected to any two intra-LAB conductors 414 via PLCs 536D, and the next two inputs are connected to any two universal fast conductors 230 via PLC 538. Accessing CLK/OE control 518 via universal fast conductors 230 enables the user to directly control the outputs of tri-state buffers 548. This is achieved by commanding CLK/OE control 518 to use the inputs received via PLC 438 to generate OE 546.

In the embodiment of FIG. 24, RAM block 520 is divided into four memory columns (not shown). Each memory column has sixty-four address inputs, eight data inputs, and sixteen data outputs. Each memory column is divided into a top portion and a bottom portion (not shown). Each of the top and bottom portions of each memory column is assigned eight data outputs of the respective memory column. The data inputs of the memory column are shared by the top and bottom portions. Furthermore, each portion is addressed by thirty-two address bits. The data and address information are provided to the RAM block 520 through top and side interfaces 522 and 524 by the user or the programming software. The outputs of RAM block 520 are provided to GH and GV conductors 220 and 222 via bottom interface 526, RAM register 528, PLCs 550, and tri-state buffers 548 and 552.

Top, side, and bottom interfaces 522, 524, and 526, respectively, include multiplexers and decoders (not shown). As mentioned above, user data received by data-in buffer 504 is transferred to top interface 522. Top interface 522 also receives thirty-two bits of FIFO data information from data programming register 426 (FIG. 20) via data lines 555. The FIFO data information is partitioned into four bytes of data, with each byte of data to be written in one memory column. Depending on the status of prog.mode 530, top interface 522 provides either of the two sets of data to its outputs. During the FIFO all received data information are provided to the data inputs of the RAM block 520. During user programming, four control signals 560 determine which memory column is to receive the user data information. Top interface 522 further includes thirty-two outputs which are grouped in four groups of eight bits. The outputs of top interface 548 are denoted by DINB0(x)–DINB7(x). "X" ranges from 0 to 3 and denotes the corresponding group of eight-bit outputs. For example, DINB0(1) to DINB7(1) refer to the second group of eight-bit outputs.

As mentioned earlier, the thirty-two bits of address information generated by address decode 508 are sent to side interface 524. Side interface 524 provides these thirty-two address bits to the upper and lower portions of each memory column. Side interface 524 further receives two control signals from read/write control 516. These control signals are read enable ("RE") 554 and write enable ("WE") 556. These two signals hold complementary logic levels and determine whether the address information at the output of side register 450 is to be used to read from or write into RAM block 520. Another control signal received by side interface 522 is the sixth output of address control 412, i.e., control signal 558. Control signal 558 determines whether the upper or lower portion of each memory column is to be addressed by the address information.

During a read cycle, the outputs of each memory column are available to the inputs of bottom interface 526. In FIG. 24, the outputs of the memory columns are denoted by DOB0A(3:0) through DOB7A(3:0) and DOB0B(3:0) through DOB7B(3:0). "DB0–DB7" refer to the eight outputs of each memory column. The letter "A" refers to the upper portion, and the letter "B" refers to the lower portion of each memory column. The content of the parenthesis indicates which memory column has been selected. For example, DOB0A(0) is the first output of the upper portion of the first memory column and DOB5B(2) is the sixth output of the lower portion of the third memory column. Bottom interface 526 receives eight groups of eight-bit data information. Each group represents the output of one half of a memory column. Bottom interface 526 further receives control lines 558 and 560. Control signals 560 determine the output of which memory column is to be presented to the inputs of RAM register 528, and control line 558 determines whether the output of the top or bottom portion of the selected memory column is to be outputted.

The information at the output of bottom interface 526 is provided to the inputs of RAM register 528. The data at the inputs of RAM register 528 is latched using the Register CLK signal 540. RAM register includes eight outputs which are connected to GV conductors 222 via tri-state buffers 548. Each output of RAM register 528 is connected to four individual GV conductors 222. The output of each tri-state buffer is controlled by the output of PLC 562.

In the embodiment of FIG. 24, PLC 562 receives two input signals and connects one of the two signals to its output. The inputs of PLC 562 are connected to two tri-state buffer enable signals 544 and 546. As mentioned earlier, tri-state OE 544 is generated by read/write control 516 and tri-state OE 546 is generated by CLK/OE control 518. Tri-state OE 546 is selected when the user desires to directly control tri-state buffers 548; otherwise, tri-state OE 544 is always selected to control the output of each tri-state buffer 548.

Outputs of RAM register 528 can also be programmably connected to GH conductors 220 and SRAM GH conductors 532 via PLCs 550 and tri-state buffers 552. Each PLC 550 has two inputs, one of which is connected to one output of RAM register 528 and the other is connected to one GV conductor 222. Each output of RAM register 528 is connected to the input of four PLCs 550; whereas, each of the GV conductors 222 is connected to the input of one PLC 550. The output of each PLC 550 is connected to one GH or SRAM GH conductors 220 or 532, respectively, via a tri-state buffer 552. In the embodiment of FIG. 24, there are thirty-two PLCs 550 and thirty-two tri-state buffers 552.

In addition, FIG. 24 shows portions of representative GH conductors 220, GV conductors 222, intra-LAB conductors 414, universal fast conductors 230, SRAM conductors 532 and LAB connection blocks 535. Each intra-LAB conductors 414 can be connected to a selected one (or more) of conductors 220, 230 and 532 via a PLC 534 (only some of which are shown in FIG. 24). Similar to the embodiment of FIG. 21, the global conductors in the embodiment of FIG. 24 are connected to the input/output pads 290–298 as shown in FIGS. 15A and 15B.

As explained above with respect to PLCs 464, PLCs 534–536 can be implemented in any one of a wide variety of ways. In the depicted embodiment, each PLC 534–536 and 550 is controlled by an FCE (not shown in FIG. 24) to connect one of its inputs to its output. Each of the inputs is the signal on a predetermined respective one of conductors 220, 230 and 532. Furthermore, FCEs 251 can also be implemented in any of several different ways, as explained above. For example, they can be SRAMs, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like.

Figure 25A:
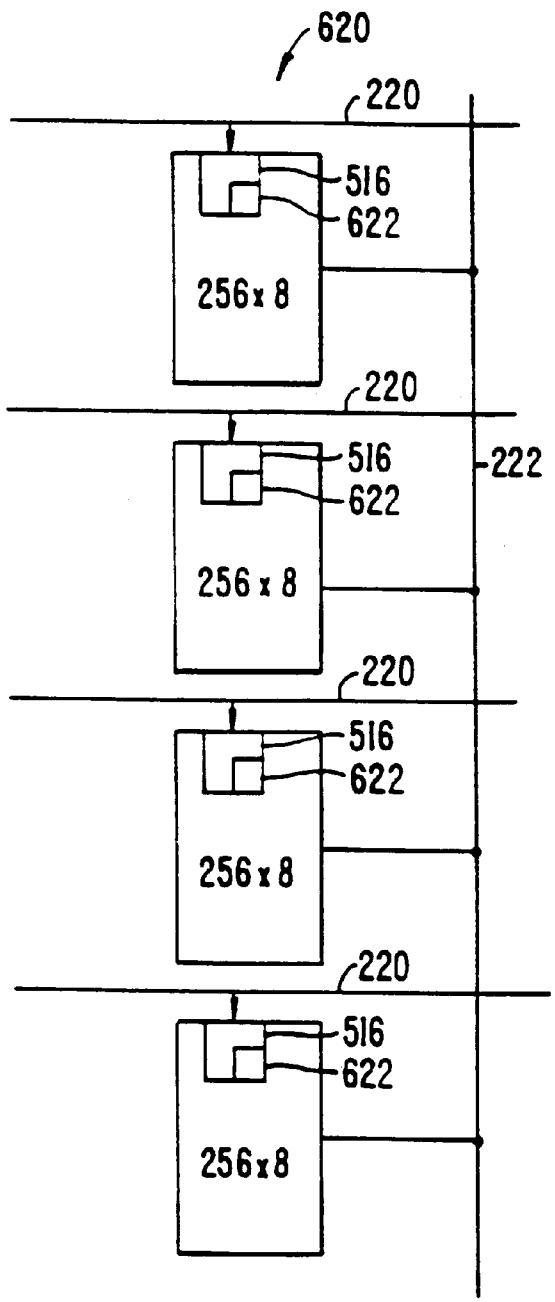
FIGS. 25A and 25B illustrate examples of constructing a deep memory block and a wide memory block, respectively, using the RAM-LABs of FIG. 24.

Similar to RAM-LAB 410 of FIG. 21, RAM-LAB 410 of FIG. 24 can also be utilized to build larger memories. FIG. 25A shows an example of a deep memory 620 using RAM-LABs 410 of FIG. 24. Each RAM-LAB 410 provides 256×8 bits of memory. To address a memory location in memory 620, the address is placed on GH conductors 220. This address information is presented to all RAM-LABs 410 in memory 620; however, only one RAM-LAB must respond to this address information. Previously, we briefly mentioned that read/write control 516 of each RAM-LAB 410 includes an identity bit. Identity bits 622 are used to determine which RAM-LAB 410 is to respond to the addressing information. In memory 620 each identity bit 622 is programmed with different information. Therefore, to select a particular RAM-LAB 410, the control information provided by the user or the programming software must include a control bit which matches the information in identity bit 622 of one RAM-LAB 410. Read/write control 516 of each RAM-LAB 410 compares this control bit with the information stored in its identity bit 622. If there is a match, read/write control 516 of the selected RAM-LAB 410 generates OE 544 to control the output of tri-state buffers 548. This effectively results in control of GV conductors 222 by the selected RAM-LAB 410. Furthermore, read/write control 516 generates the necessary control signals to facilitate accessing RAM block 520. The example of FIG. 25A shows memory 620 with a capacity of (M)(256)×8 bits, where M represents the number of RAM-LABs 410 in the column.

Figure 25B:
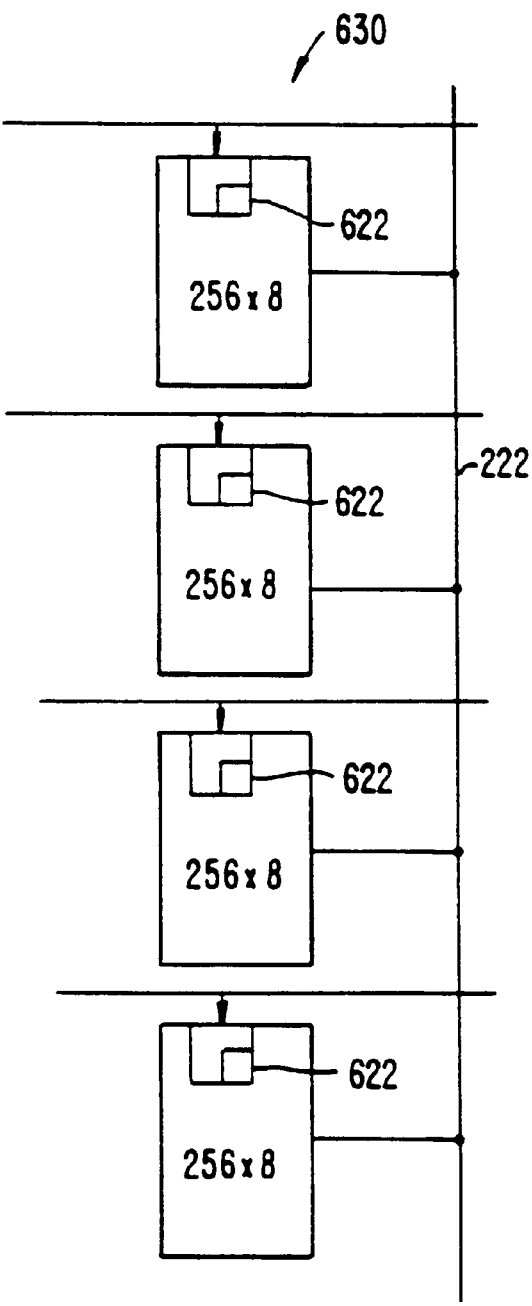

FIG. 25B illustrates an example of a wide memory block 630 using RAM-LAB 410 of FIG. 24. In memory 630, the information stored in each identity bit 622 is identical. Therefore, when addressed, all RAM-LAB 410 respond simultaneously by placing their outputs on GV conductors 222. Accordingly, with each RAM-LAB 410 having eight outputs and with global conductors 222 having thirty two lines, there is a possibility of building a wide memory block with the capacity of 256×32 bits of memory.

It will be understood that the foregoing is merely illustrative of the principles of this invention, and that various modifications can be made by those skilled in the art without departing from the scope and spirit of the invention. For example, the number of logic elements in each LAB can be altered if desired. Similarly, the number of LABs can be altered if desired. Similarly, the number of LABs can be varied, as can the numbers of the various types of conductors and inter-conductor connections. Also, the number of look-up table inputs is arbitrary and can be made more or less than four if desired. As another example of modifications within the scope of this invention, any of the techniques shown in FIGS. 5–9 can be used to facilitate providing conductor interconnections of the type indicated, for example, at 231, 249, and 253 in FIG. 11 herein. As still another example of modifications within the scope of this invention, RAM blocks 447 and 520, in FIGS. 21 and 24, respectively, can be replaced by function blocks, such as Arithmetic Logic Units ("ALUs"), multipliers, register files, high speed adders, etc., to provide function specific LAB units.

III. Third Embodiment

Figure 26:
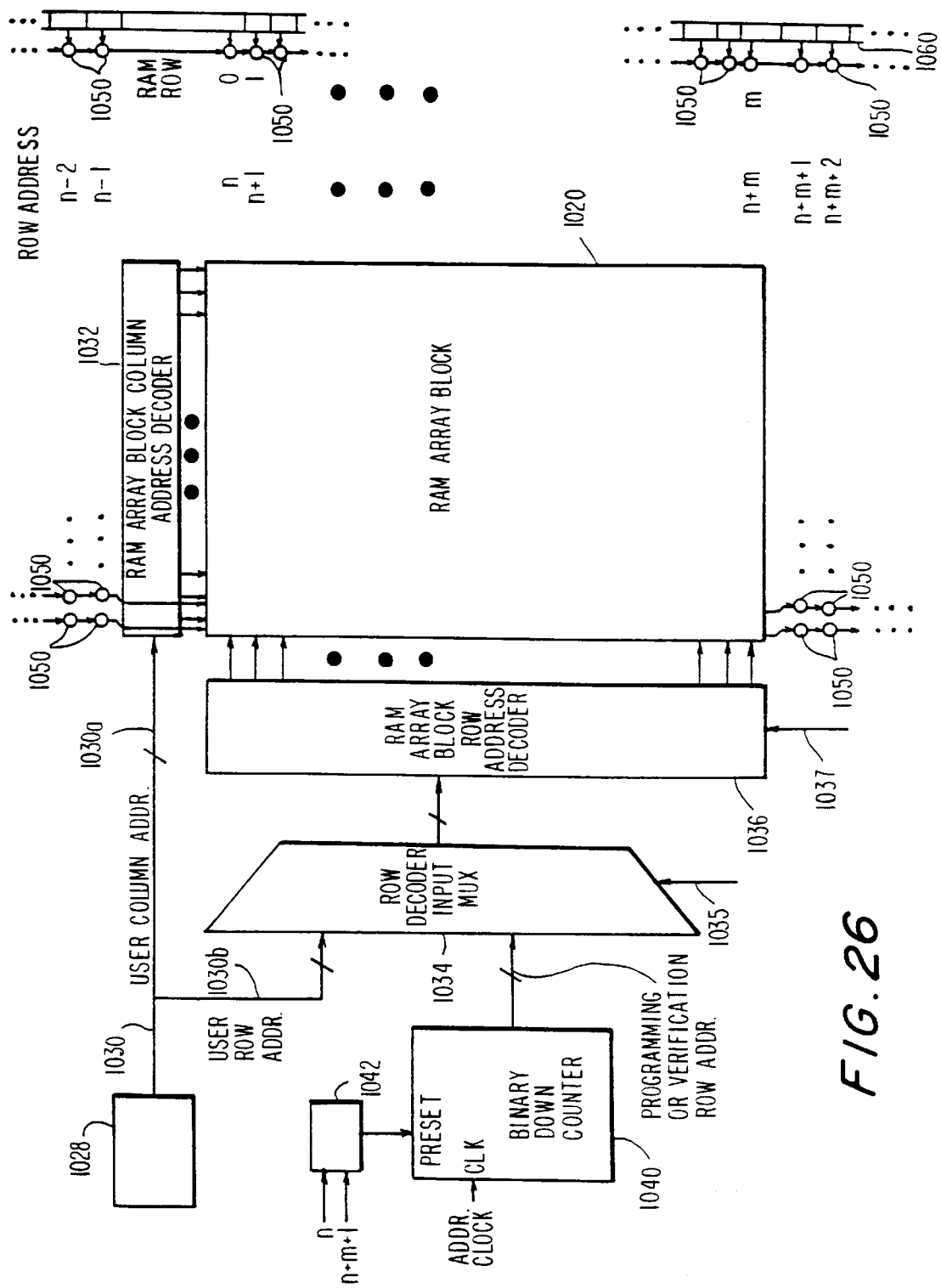
FIG. 26 is a simplified block diagram of a representative portion of illustrative programmable logic array integrated circuit device circuitry that can be implemented using this invention.

A representative portion of a programmable logic array integrated circuit device, which includes a relatively large RAM block 1020 and which can be constructed in accordance with the principles of this invention, is shown in FIG. 26. Except for changes in reference numbers, this FIG. is the same as FIG. 1 in commonly assigned U.S. patent application Ser. No. 08/555,283, filed Nov. 8, 1995, which is hereby incorporated by reference herein. Because FIG. 26 is fully described in that other application, the description of it here will be somewhat abbreviated.

RAM block 1020 has several rows and several columns of programmable memory cells. Typical ones of these memory cells are shown in more detail at 1110 in FIG. 27 (which depicts a portion of one representative column in RAM block 1020). Illustratively, RAM block 1020 may have 64 rows (numbered 0 through m=63) and 32 columns of memory cells 1110.

During use of the device to perform logic, coded information for addressing RAM block 1020 may be supplied from other programmable logic 1028 on the device via bus 1030. For example, 11 bits of binary coded address information are required to select any one of 32×64=2048 memory cells 1110 in RAM block 1020. A portion of the address information on bus 1030 is split off via sub-bus 1030*a* and applied to column address decoder 1032. Decoder 1032 selects the column in RAM block 1020 that is identified by the address information applied to it. (As described in above-mentioned Cliff et al. U.S. Pat. No. 5,689,195, decoder 1032 may alternatively select more than one column in RAM block 1020 in order to provide partly parallel operation of that block. This possible feature will be discussed in more detail below, but initially it will be assumed that decoder 1032 selects only one column in RAM block 1020.) Selection of a column in RAM block 1020 raises the potential on the column selection conductor 1120 (FIG. 27) in that column sufficiently to turn on the transistors 1122 and 1124 connected to that conductor. In all columns that are not thus selected, the potential on the column selection conductors 1120 is below that required to turn on the associated transistors 1122 and 1124.

The portion of the address information on bus 1030 that is not applied to column decoder 1032 is applied to row address decoder 1036 via sub-bus 1030*b* and switching circuits or multiplexers 1034. During use of the device to perform logic, multiplexers 1034 are controlled by the mode control signal applied to them via lead 1035 to connect sub-bus 1030*b* rather than counter 1040 to decoder 1036. Row address decoder 1036 responds to the address information applied to it by selecting the row in RAM block 1020 that is identified by the applied address information. Selection of a row in RAM block 1020 causes decoder 1036 to raise the potential on either the read word conductor 1190*r* (FIG. 27) or the write word conductor 1190*w* (FIG. 27) of the selected row, depending on whether the read/write control signal on lead 1037 indicates that data is to be read out of RAM block 1020 or written into the RAM block.

For purposes of programming and verification (which take place prior to use of the device to perform logic), each column of RAM block 1020 is connected in a respective one of a plurality columns of other programmable memory cells 1050 on the device. Fragments of two such columns are shown in FIG. 26 above and below the RAM block circuitry. Cells 1050 are the cells that control the functions performed by the device's logic modules, the connections made by the device's network of interconnection conductors, etc. As shown by the representative column toward the right in FIG. 26, many columns of memory cells 1050 do not pass through RAM block 1020. Those columns have as many rows of cells 1050 where the RAM block would otherwise occur as the RAM block itself has rows.

Figure 27:
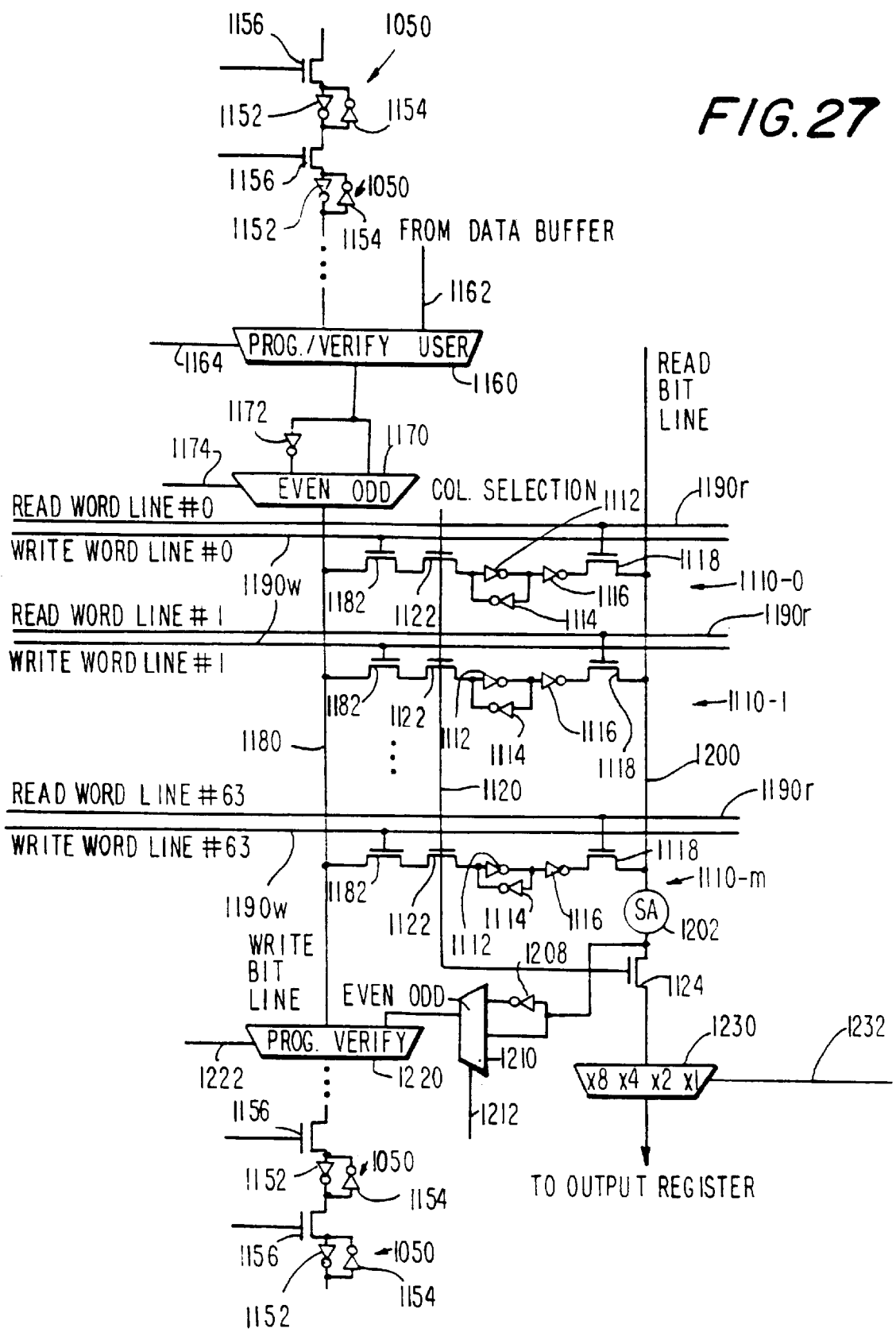
FIG. 27 is a simplified schematic block diagram of an illustrative embodiment of a representative portion of the circuitry of FIG. 26 in accordance with this invention.

The memory cells 1050 in each column are connected in a FIFO chain (see FIG. 27, where fragments of one FIFO chain are shown above and below the RAM block circuitry). As shown in FIG. 27 each cell 1050 includes a relatively strong inverter 1152 directed downwardly, and relatively weak inverter 1154 directed upwardly and connected across the associated strong inverter 1152. Each weak inverter 1154 is strong enough to maintain the logic condition of the associated strong inverter 1152 (i.e., logic 0 output or logic 1 output) in the absence of an external input to the strong inverter from above. However, the weak inverter 1154 is not strong enough to prevent switching of the strong inverter 1152 by an external signal from above. Each cell 1050 is selectively connected to the cell (generally 1050) above by a transistor 1156 between the cells.

A register 1060 (FIG. 26) is used during programming and verification to control transistors 1156 on a row-by-row basis. Register 1060 has one stage (with an output) for each row of memory cells 1050. When programming begins, the output signals of register 1060 turn on the transistors 1156 in all rows. This allows programming data applied in parallel to the tops of all columns of memory cells 1050 to flow down through all the cells in each column. (It should be noted that programming data flowing down through the depicted FIFO chains is inverted each time it passes from one row to the next.) If desired, data which thus passes all the way through the FIFO chains can be read out to verify that all chains are properly passing data. Thereafter, during each successive pulse of an address clock signal (applied to counter 1040, and also to register 1060 or the controls for register 1060) one output signal of register 1060 changes to the level that turns off the transistors 1156 in the associated row. The output signals of register 1060 change in this way one after another, working from the bottom of the register to the top. This cuts off the rows of memory cells 1050 one after another, working from the bottom of the device to the top. Different programming data is typically applied to the tops of the FIFO chains during each successive address clock interval. Thus each row of memory cells 1050 that is cut off stores the data (or the inverse of the data) that was applied to the tops of the FIFO chains during the address clock interval just prior to that row being cut off. All of the rows of the device are programmed when all of the outputs of register 1060 have changed to the level that turns off the associated transistors 1156.

Verification of the data in memory cells 1050 is conceptually somewhat similar to programming, except that in the case of verification the initial outputs of register 1060 are those corresponding to the conclusion of programming (i.e., all transistors 1156 off). These outputs change one at a time during successive address clock pulses to progressively turn on the associated rows of transistors 1156, again working from the bottom of the device to the top. The data in each row of memory cells 1050 that is thus re-connected to the rows below it flows down to the bottoms of the columns, where it can be read out for verification. The rows are therefore read out for verification one after another, working from the bottom of the device to the top. When all rows have been verified, register 1060 will be turning on all of transistors 1156 (as it does at the beginning of programming).

It will be appreciated from the foregoing that verification erases memory cells 1050, so that after verification it will be necessary to re-program the device. It should also be understood that verification is entirely optional, and that if it is not desired, the portions of this discussion that relate to verification can be omitted.

FIG. 27 shows in more detail how a representative column of RAM block 1020 is connected in a representative column of other memory cells 1050 in accordance with this invention. Multiplexer 1160 passes either (1) the programming or verifying data signal from the portion of the FIFO chain of memory cells 1050 which is above the RAM block column, or (2) a user logic data signal on lead 1162. The data on lead 1162 typically comes from the other logic 1028 (FIG. 26) on the device (although this data should not be confused with the signals on address bus 1030 in FIG. 26). Multiplexer 1160 is controlled by a mode control signal on lead 1164. This mode control signal indicates whether the device is in programming/verification mode or user logic mode. The signal on lead 1164 may therefore be the same as the signal on above-described lead 1035 in FIG. 26.

The output signal of multiplexer 1160 is applied in both true and complement forms to the inputs of multiplexer 1170. The complement signal is produced by inverter 1172. During programming of the rows of RAM block 1020, multiplexer 1170 operates to pass either the true or complement signal, depending on whether the RAM block row currently being programmed has an odd or even row number in the "RAM Row" list shown toward the right in FIG. 26. At all other times (including during programming of rows above or below RAM block 1020, during verification, and during logic operation) multiplexer 1170 passes the applied true signal. Multiplexer 1170 is controlled in the appropriate manner by the signal on lead 1174. Multiplexer 1170 is thus used to invert the programming data intended for even-numbered rows in RAM block 1020 so that that data can have the same polarity at the top of the FIFO chains leading to RAM block 1020 as the data which is concurrently at the top of the FIFO chains that do not include RAM block 1020 columns. This is related to the fact (mentioned above) that each row of memory cells 1050 inverts the data applied to it either before passing that data on to the next row or before storing that data. The above-described operation of multiplexer 1170 makes the programming of each RAM block 1020 row look just like the concurrent programming of other memory cells 1050 that are outside RAM block 1020 but that are otherwise in the same overall row on the device.

Multiplexer 1170 is not required to invert programming data destined for rows below RAM block 1020 in this embodiment because RAM block 1020 has an even number of rows. This also explains why multiplexer 1170 is not required to invert signals from multiplexer 1160 during verification of rows above RAM block 1020. (The presence of an even number of rows in a verification chain (as in a programming chain) has no net effect on the polarity of the data flowing through for verification.) Multiplexer 1170 is also not required to invert the output of multiplexer 1160 during user logic operation of the device because then it is desired for RAM block 1020 to effectively store and subsequently output exactly the data that is applied to it.

The output signal of multiplexer 1170 is applied to write bit line 1180. The signal on line 1180 is applied in parallel to an input gating transistor 1182 in each row of RAM block 1120. The transistor 1182 in each row is enabled to pass the signal on line 1180 when the write word line 1190w for that row is selected by row address decoder 1036 (FIG. 26). If the column selection conductor 1120 for the depicted columns is also then selected, the data from line 1180 and the selected transistor 1182 passes on into the associated memory cell 1110 in RAM block 1020. During programming, all of conductors 1120 in RAM block 1020 are selected. During verification, none of conductors 1120 are selected. During use of the device to perform logic, only certain ones of conductors 1120 are selected by column address decoder 1032 as described above.

Each of memory cells 1110 is somewhat like one of memory cells 1050. Thus each of memory cells 1110 includes a relatively strong forward inverter 1112 and a relatively weak backward inverter 1114 connected across the terminals of the strong inverter. An output inverter 1116 restores data stored by inverters 1112 and 1114 to the polarity of the original input to the cell. Thus, unlike cells 1050, cells 1110 ultimately do not invert the data applied to them when they output that data.

The contents of memory cells 1110 can be read out by selecting the read word line 1190r for the row that includes that memory cell. Again, a read word line 1190r is selected by row address decoder 1036. Selection of a read word line conductor 1190r enables the output gating transistors 1118 in the associated row to pass the memory cell 1110 data of that row to the read bit line 1200 in each column. From a sense amplifier 1202 in each line 1200 the signal on that line is applied (in true and complement form) to the inputs of multiplexer 1210 and to column output gating transistor 1124.

If data is being read out of a memory cell 1110 during use of the device to perform logic, then the column selection line 1120 for the column that includes that memory cell must also be selected in order to enable the transistor 1124 in that column to pass the data on the associated read bit line 1200 out into the user logic via output mode selection circuit 1230 (described below). On the other hand, if the data is being read out of memory cell 1110 during verification, then it is not necessary to select the column selection line 1120 because the path to multiplexer 1210 is not gated by transistor 1124.

Multiplexer 1210 is controlled by the signal on lead 1212. The complement signal applied to multiplexer 1210 is produced by inverter 1208. The path through multiplexer 1210 is used during verification of programming data stored in RAM block 1020, and multiplexer 1210 is then controlled to restore the polarity of programming data read out of RAM block 1020 to the polarity that that data had when it was output by multiplexer 1160 during programming of the RAM block. Thus multiplexer 1210 passes the complement signal applied to it when the RAM block row being verified has an even numbered row address (see FIG. 26), and it passes the true signal applied to it when the RAM block row being verified has an odd numbered row address. This makes verification of programming data stored in RAM block 1020 look exactly like verification of programming data stored in other memory cells 1050, even though RAM block memory cells 1110 are not ultimately inverting (unlike memory cells 1050) and are connected in the circuit in parallel, rather than serially as is the case for memory cells 1050. The control signal applied to multiplexer 1210 indicates whether the RAM block row currently being verified has an odd or even numbered row address.

The output signal of multiplexer 1210 is the "verify" input to multiplexer 1220. The other ("program") input to multiplexer 1220 is write bit line 1180. Multiplexer 1220 is controlled by control signal 1222 to pass its verify input signal during verification of RAM block 1020 and to pass its program input signal at all other times. Thus, during verification of RAM block 1020, multiplexer 1220 switches the read bit line 1200 output of the depicted RAM block column into the associated FIFO chain of memory cells 1050. At all other times multiplexer 1220 allows the write bit line 1180 of the depicted RAM block column to be an intermediate connection in the associated FIFO chain of memory cells 1050.

A read bit line 1200 signal passed by transistor 1124 is applied to output mode selection circuit 1230. Circuit 1230 routes the read bit line signal to any of several user logic outputs of RAM block 1020, consistent with whether one, two, four, or eight bits are to be concurrently output by the RAM block. Circuit 1230 is controlled in the appropriate manner by the mode selection control signals applied to that circuit via leads 1232. Above-mentioned Cliff et al. U.S. Pat. No. 5,689,195 provides additional information regarding use of these different output modes for RAM block 1020. Sung et al. U.S. Pat. No. 5,717,901 shows an illustrative embodiment of circuitry for providing RAM block 1020 with several corresponding user logic input modes (i.e., for allowing operation of RAM block 1020 during use of the device to perform logic to receive one, two, four, or eight data bits concurrently). This last-mentioned patent is also hereby incorporated by reference herein.

A final aspect of the operation of the device should be noted. During programming or verification of RAM block 1020, counter 1040 (FIG. 26) is used to generate address information for selecting the rows of RAM block 1020 one after another. Unlike the rows of memory cells 1050, which need to be addressed sequentially but cumulatively during programming or verification, the rows of RAM block 1020 need to be selected no more than one at a time. Thus when addressing of the memory rows by register 1060 reaches the bottom of RAM block 1020, counter 1040 is enabled (by logic circuit 1042) to begin counting down (i.e., from m, to m-1, to m-2, etc.) in synchronism with continued operation of register 1060. Multiplexers 1034 are controlled to apply the output signals of counter 1040 to row address decoder 1036. Counter 1040 therefore selects the rows of RAM block 1020 one after another, working from the bottom of the RAM block to the top, for either programming or verification. This use of a counter 1040 or other similar circuitry to address the rows of RAM block 1020 during programming or verification is described in more detail in above-mentioned application Ser. No. 08/555,283.

From the foregoing it will be seen that the circuitry of this invention facilitates operation of RAM block 1020 in several different modes compatible with operation of other memory cells 1050 in corresponding or related modes. For example, RAM block 1020 columns are connected into the FIFO chains of other memory cells 1050 during programming and verification of the device, and RAM block 1020 is thus programmed or verified through those FIFO chains by the same kind of data flow that programs or verifies the other memory cells. No special modifications of the programming data destined for, or the verifying data from, RAM block 1020 is required. In addition, the circuitry of this invention allows and facilitates use of RAM block 1020 as either ROM or RAM during operation of the device to perform logic. Data can then be entered into or read out from RAM block 1020 using different paths than are used during programming and verification, and several different modes (e.g., one, two, four, or eight bits) may be used to write data to or read data from the RAM block.

It will be understood that the foregoing is only illustrative of the principles of this invention, and that various modifications can be made by those skilled in the art without departing from the scope and spirit of the invention. For example, the possible dimensions of RAM block 1020 mentioned above are only illustrative, and it will be understood that the RAM block can be of any desired size. It will also be understood that words like "row" and "column," "up" and "down," "left" and "right," etc., are used arbitrarily herein, and that they can be interchanged in relation to other embodiments of the invention. In other words, the invention is not limited in any way to any particular orientation of the circuitry on the device.

IV. Fourth Embodiment

As has been mentioned, FIG. 13 shows a conventional four-input look up table 240. Look up table 240 has 16 storage locations or function control elements ("FCEs") 244-1 through 244-16, each of which stores one binary digit of information. Each FCE 244 may be a flip-flop (as in FIG. 8 of Wahlstrom U.S. Pat. No. 3,473,160), a random access memory ("RAM") cell, or any other type of storage device such as an SRAM, a DRAM, a cell of a first-in first out ("FIFO") memory, an EPROM, an EEPROM, a ferro-electric memory cell, a fuse (e.g., a laser fuse), an anti-fuse, or the like. The contents of FCEs 244 may be fixed or programmable, and if programmable may be programmable only once or repeatedly. The logic connected to the outputs of FCEs 244 allows the four inputs J–M to select one and only one of the FCE outputs as the final output O/P of the look up table. The output of each FCE 244 is applied to one input of a respective one of AND gates 280-1 through 280-16. Input J is applied to the other input of AND gates 280-1, 280-3, 280-5, 280-7, 280-9, 280-11, 280-13, and 280-15, and, after inversion by inverter I1, to the other input of AND gates 280-2, 280-4, 280-6, 280-8, 280-10, 280-12, 280-14, and 280-16. Accordingly, half of AND gates 280 are enabled by input J, while the other half of these AND gates are not enabled. OR gates 281 pass the outputs of enabled AND gates 280 to the next level of AND gates 282.

Input K is applied to one input of AND gates 282-1, 282-3, 282-5, and 282-7, and, after inversion by inverter I2, to one input of AND gates 282-2, 282-4, 282-6, and 282-8. Accordingly, input K enables half of AND gates 282 and disables the other half of those AND gates. Input K therefore selects four of the eight FCE 244 outputs selected by input J. OR gates 283 pass the four FCE outputs selected by input K to the next level of AND gates 284.

Input L is applied to one input of AND gates 284-1 and 284-3, and, after inversion by inverter I3, to one input of AND gates 284-2 and 284-4. Input L therefore enables half of AND gates 284 and disables the other half of those AND gates. Accordingly, input L selects two of the four FCE 244 outputs selected by input K. OR gates 285 pass the two FCE outputs selected by input L to the next level of AND gates 286.

Input M is applied to one input of AND gate 286-1, and, after inversion by inverter I4, to one input of AND gate 286-2. Accordingly, input M makes a final selection of one of the two FCE 244 outputs selected by input L. OR gate 287 passes this finally selected FCE output to look up table output lead O/P.

It will be apparent from the foregoing that look up table 240 can provide any single logical function of its four inputs J–M. For example, if it is desired that the output of look up table 240 should be 1 when J and L are 0 and K and M are 1, then FCE 244-6 is programmed or otherwise set to store binary 1 so that this value will appear at output O/P when AND gates 280-6, 282-3, 284-2, and 286-1 are enabled.

Figure 28:
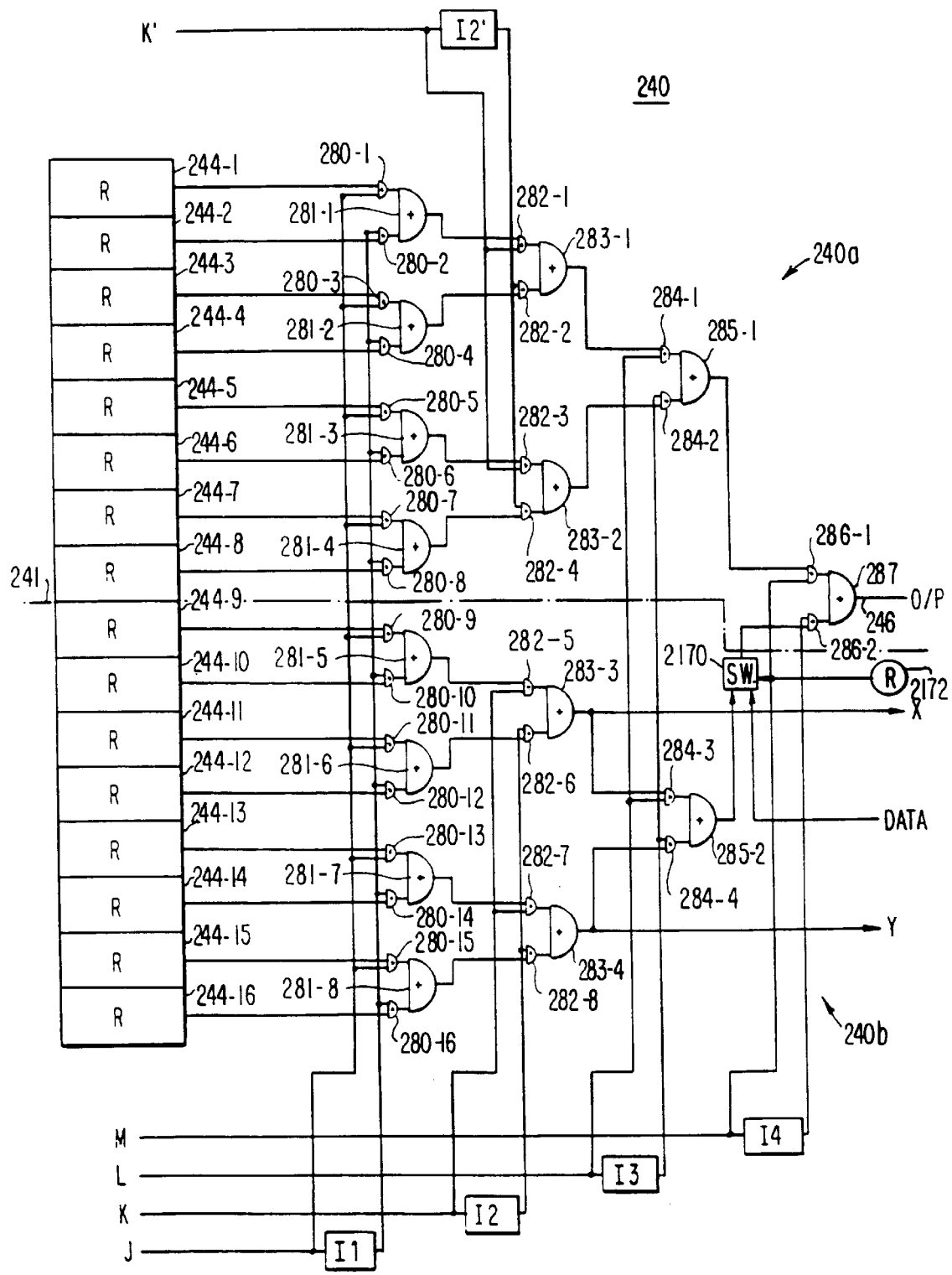
FIG. 28 is a schematic block diagram illustrating how the look up table of FIG. 13 can be modified in accordance with the principles of this invention.

If look up table 240 is to be used as one stage of a two-input adder (which term is used herein as a generic term for both adders and subtracters), it really has more capabilities than are needed to provide either the sum out or carry out value. Accordingly, look up table 240 is modified in accordance with this invention as shown in FIG. 28 so that it can provide both the sum out on normal output lead O/P and important precedents to the carry out value on leads X and Y. Prior art input K is split into two inputs K and K'. Input K continues to be applied in true or complement form to AND gates 282-5 through 282-8. Input K' is applied in true form to AND gates 282-1 and 282-3, and in complement form provided by inverter I2' to AND gates 282-2 and 282-4. An additional switch 2170 is included between the output of OR gate 285-2 and the input of AND gate 286-2. Switch 2170 is controlled by FCE 2172 (which can be similar to any of FCEs 244) to apply either the output of OR gates 285-2 or the "data" input to AND gate 286-2. When look up table 240 is used as part of a loadable counter, the "data" input to switch 2170 is used as the source of the data to be loaded into the counter.

Figure 29:
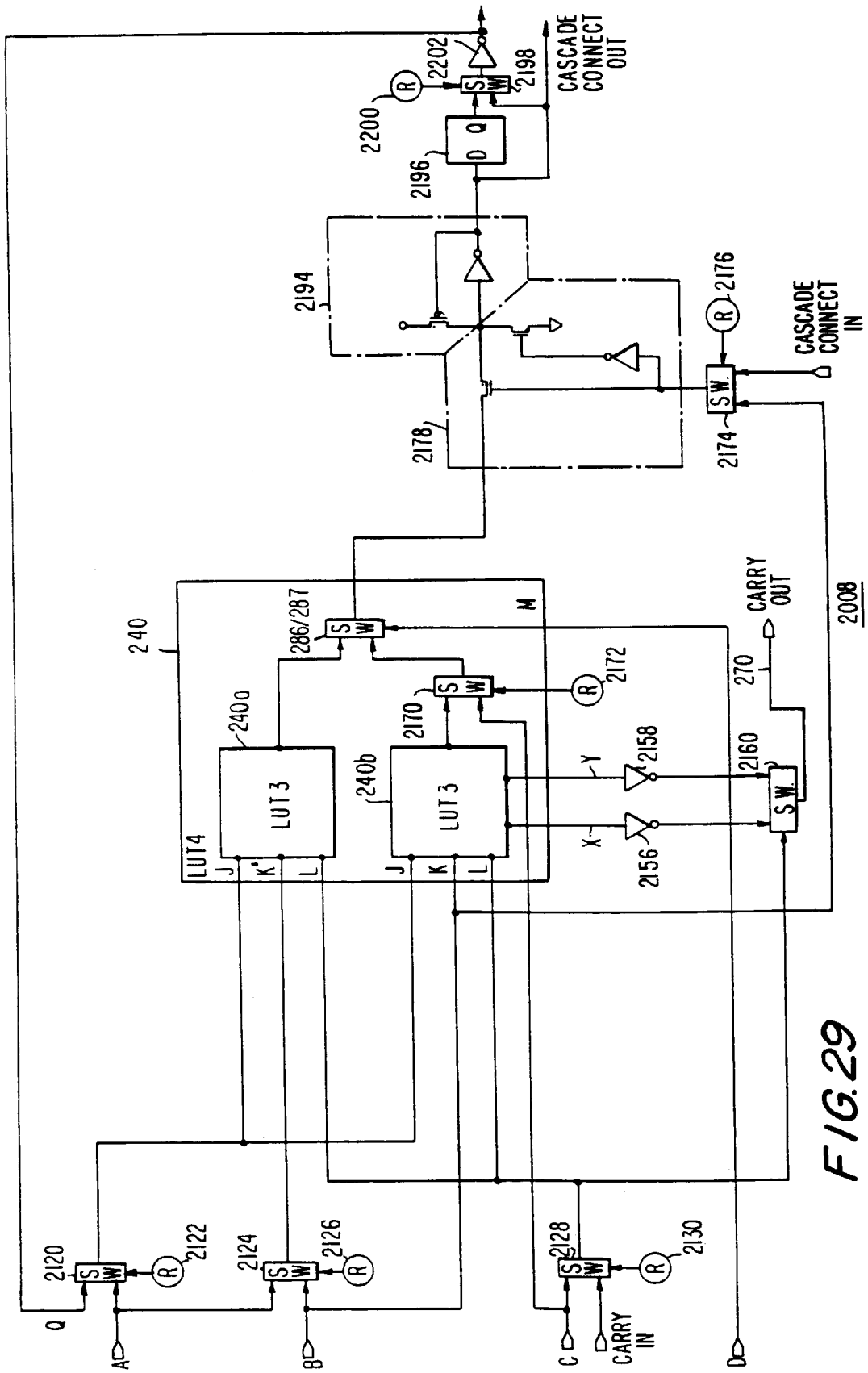
FIG. 29 is a schematic block diagram of illustrative apparatus constructed in accordance with this invention which uses the look up table apparatus of FIG. 28.

FIG. 29 shows how the modified look up table 240 of FIG. 28 can be used with other circuitry in accordance with this invention to provide an extremely flexible and powerful logic module 2008 for use in programmable logic arrays (e.g., the logic arrays shown in Cliff et al. U.S. Pat. No. 5,260,611). Logic module 2008 has four regular data inputs A–D. It also has a carry in input, typically from the carry out output of another adjacent logic module which is used for the next less significant arithmetic place when logic module 2008 is used for one place of binary addition, subtraction, or counting. The remaining input to logic module 2008 is the cascade connect input, also typically from another adjacent logic module. As described in Cliff et al. U.S. Pat. No. 5,258,668, the cascade connect input allows the cascade connect output signal of another logic module to be combined with the output of look up table 240 in logic module 2008 if that is desired.

Logic module 2008 has three outputs. These are its regular data output from output driver 2202, the cascade connect output which bypasses elements 2196 through 2202, and the carry out signal. The cascade connect output signal of logic module 2008 is applied to the cascade connect input of another, typically adjacent logic module. The carry out signal of logic module 2008 is similarly applied to the carry in input of another, typically adjacent logic module which performs the next more significant place of binary addition, subtraction, or counting when any of those operations are performed.

When logic module 2008 is used to perform normal logic rather than addition, subtraction, or counting, switch 2120 is controlled by FCE 2122 to apply the A input of the logic module to the J input of look up table 240, switch 2124 is controlled by FCE 2126 to apply the B input to the K' as well as the K inputs of look up table 240, and switch 2128 is controlled by FCE 2130 to apply the C input to the L input of table 240. (FCEs 2122, 2126, and 2130 may be similar to any of the above-described FCEs.) The D input is applied at all times to the M input of table 240. Switch 2170 is controlled by FCE 2172 to apply the output of look up table portion 240b to switch 286/287, and switch 2174 is controlled by FCE 2176 to apply the cascade connect input to AND gate 2178. (Again, FCEs 2172 and 2176 may be similar to any of the above-described FCEs.) As is discussed in above-mentioned Cliff et al. U.S. Pat. No. 5,258,668, the cascade connect input may be tied to logic 1 by other elements not shown herein if the cascade connect feature is not being used. As a result of the foregoing, look up table 240 in FIG. 29 operates just like the prior art look up table 240 in FIG. 13 and can produce any logical function of inputs A–D. The output signal of look up table 240 is applied to AND gate 2178. After inversion and level adjustment by circuit 2194, the output signal of AND gate 2178 is applied to the main data output terminal of logic module 2008 either directly or via flip-flop 2196 as determined by switch 2198 which is controlled by FCE 2200 (similar to any of the above-described FCES). The output signal of circuit 2194 is also applied to the cascade connect output terminal of the logic module.

When it is desired to use logic module 2008 to perform one place of binary addition, the two digits to be added are applied to the A and B inputs. The carry from the next less significant place of the addition operation (preferably performed by another logic module similar to logic module 2008) is applied to the carry in input. (Above-mentioned Cliff et al. U.S. Pat. No. 5,260,611, which is hereby incorporated by reference herein, shows how multiple logic modules can be connected to one another in a carry chain when operations such as addition, subtraction, and counting are to be performed.) Switches 2120, 2124, and 2174 are set as described above for normal logic, but switch 2128 is set to apply the carry in input to the L input of table 240, and also to the control input of switch 2160. The setting of switch 2170 is of no consequence. The cascade connect input is tied to logic 1. Input D is used to control switch 286/287 to apply the output of look up table portion 240a to AND gate 2178. The FCEs 244 of look up table portion 240a (generally the portion above chain dotted line 241 in FIG. 28) are programmed to apply the sum of A, B, and carry in to switch 286/287. This sum out signal passes through elements 286/287, 2178, 2194, etc., to the main output terminal of the logic module. The FCEs 244 of look up table portion 240b (generally the portion below chain dotted line 241 in FIG. 28) are programmed to provide the NOR and NAND of A and B on leads X and Y. These signals are inverted by inverters 2156 and 2158, and switch 2160 selects the appropriate one for use as the carry out signal based on the carry in signal which controls that switch. The carry out signal of this logic module is the carry in signal of another similar logic module which performs the next more significant place of the arithmetic operation. (See again above-mentioned Cliff et al. U.S. Pat. No. 5,260,611, which shows how the carry out signal of each logic module is connected as the carry in signal of the arithmetically next more significant logic module.) Accordingly, with the modifications described above, a single logic module 2008 can provide both the sum out and carry out signals for one place of binary addition.

Another capability of logic module 2008 in accordance with this invention is to provide one stage of a binary up/down counter which can also be loaded to any value. This counter stage operates by adding the Q output of flip-flop 2196 and the carry in input from the logic module providing the next less significant counting stage. Accordingly, switches 2198 and 2120 are set to apply the Q output to look up table input J, switch 2124 is set to apply the A input to look up table input K', and switch 2128 is set to apply the carry in input to look up table input L. Input B continues to be applied to look up table input K, input C continues to be applied to switch 2170, and input D continues to be applied to look up table input M to control switch 286/287. Switch 2170 is programmed to pass the applied C input to switch 286/287. Switch 2174 is set to apply the cascade connect input to one input of AND gate 2178. The cascade connect input signal is tied to logic 1 as described above. The FCEs 244 of look up table portion 240a are programmed so that the A input can selectively enable counting. The FCEs 244 of look up table portion 240b are programmed so that the B input can control whether the counter counts up or down. The up/down counter can be loaded with data from input C by using input D to momentarily cause switch 286/287 to apply the output of switch 2170 to AND gate 2178. Flip-flop 2196 stores the output of AND gate 2178 synchronously or asynchronously, depending on how the flip-flop is configured and what control signals are applied to it.

Still another capability of logic module 2008 in accordance with this invention is to provide one stage of a clearable binary counter which can also be loaded to any value. This type of counter also counts by adding its Q output to the carry in input from the counter stage of next lower numerical significance. Unlike the above-described up/down counter, however, the clearable counter can only count up. To provide the clearable counter, switches 2120, 2124, 2128, 2170, and 2198 are all set as described above for the up/down counter. Switch 2174 is set to apply the B input to AND gate 2178. The FCEs 244 of look up table portion 240a are programmed so that input A can selectively enable the counting action. Input B must also be logic 1 for the counter to count or hold its count. When it is desired to clear the counter, input B is switched to logic 0 which applies to 0 to the D input of flip-flop 2196. Again, this clears flip-flop 2196 either synchronously or asynchronously, depending on how the flip-flop is configured and what control signals are applied to it. The counter can be loaded with any desired value from the C input in the same way that the up/down counter can be loaded.

It will be understood that the foregoing is merely illustrative of the principles of this invention, and that various modifications can be made by those skilled in the art without departing from the scope and spirit of the invention. For example, there are many other ways in which the apparatus of this invention can be configured and/or programmed to perform the functions described above. As one illustration of this, X and Y could be the NOR and NAND of one of inputs A and B and the carry in input, with the other one of inputs A and B being used to control switch 2160.

The invention claimed is:

1. Look up table circuitry comprising:

a plurality of data storage cells;

first and second output signal leads; and selection circuits responsive to input signals applied to the look up table circuitry to select data stored in any of the data storage cells as a basis for an output signal on one of the output signal leads when normal operation of the look up table circuitry is selected and to select data stored in any of the data storage cells in each of first and second subpluralities of the data storage cells as respective bases for sum out and carry out signals on the first and second output signal leads when operation of the look up table circuitry to perform one place of binary arithmetic is selected.

2. The circuitry defined in claim 1 wherein each of the data storage cells comprises a function control element.

3. The circuitry defined in claim 2 wherein each function control element is programmable.

4. The circuitry defined in claim 2 wherein each function control element is reprogrammable.

5. The circuitry defined in claim 1 further comprising:

a function control element configured to produce an output signal indicative of whether normal operation or operation to perform one place of binary arithmetic is selected, the selection circuits being additionally responsive to the output signal of the function control element.

6. The circuitry defined in claim 5 wherein the function control element is programmable.

7. The circuitry defined in claim 5 wherein the function control element is reprogrammable.

8. The circuitry defined in claim 1 further comprising:

input signal circuitry configured to apply a carry out signal from other look up table circuitry as one of the input signals.

9. The circuitry defined in claim 1 further comprising:

output signal circuitry configured to apply the carry out signal as an input signal to other look up table circuitry.

10. The circuitry defined in claim 8 wherein application of the carry out signal from the other look up table circuitry as one of the input signals is selective.

11. The circuitry defined in claim 10 further comprises:

a function control element for producing an output signal indicative of whether or not the carry out signal from the other look up table circuitry is to be applied as one of the input signals.

12. The circuitry defined in claim 11 wherein the function control element is programmable.

13. The circuitry defined in claim 11 wherein the function control element is reprogrammable.

14. The circuitry defined in claim 1 wherein the first and second subpluralities are mutually exclusive of one another.

15. The circuitry defined in claim 1 wherein, when operation of the circuitry to perform one place of binary arithmetic is selected, the input signals include three signals respectively indicative of two addend bits and one carry in bit that are to be arithmetically combined by the circuitry to produce the sum out and carry out signals.

* * * * *